(12) United States Patent
Kennedy

(10) Patent No.: US 8,217,439 B2
(45) Date of Patent: *Jul. 10, 2012

(54) DRAM UNIT CELLS, CAPACITORS, METHODS OF FORMING DRAM UNIT CELLS, AND METHODS OF FORMING CAPACITORS

(75) Inventor: John Kennedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/080,489

(22) Filed: Apr. 5, 2011

(65) Prior Publication Data

US 2011/0180863 A1  Jul. 28, 2011

Related U.S. Application Data

(63) Continuation of application No. 12/409,076, filed on Mar. 23, 2009, now Pat. No. 7,939,877.

(51) Int. Cl.
*H01L 27/108* (2006.01)
*H01L 29/94* (2006.01)
*H01L 21/8242* (2006.01)

(52) U.S. Cl. ............. 257/306; 438/253; 257/E27.048; 257/E21.649

(58) Field of Classification Search .......... 257/306, 257/E27.048, E21.649; 438/253
See application file for complete search history.

(56) References Cited

U.S. PATENT DOCUMENTS

| | | | |
|---|---|---|---|
| 6,602,749 B2 | 8/2003 | Tu et al. | |
| 6,620,680 B2 | 9/2003 | Durcan et al. | |
| 6,787,836 B2 | 9/2004 | Clevenger et al. | |
| 7,125,781 B2 | 10/2006 | Manning et al. | |
| 7,160,785 B1 | 1/2007 | Durcan et al. | |
| 7,226,845 B2 | 6/2007 | Manning et al. | |
| 7,230,292 B2 | 6/2007 | Graettinger | |
| 7,387,939 B2 | 6/2008 | Manning | |
| 7,939,877 B2 * | 5/2011 | Kennedy | 257/306 |
| 2001/0026974 A1 | 10/2001 | Reinberg | |

* cited by examiner

*Primary Examiner* — William D Coleman
(74) *Attorney, Agent, or Firm* — Wells St. John P.S.

(57) ABSTRACT

Some embodiments include methods of forming capacitors. A first capacitor storage node may be formed within a first opening in a first sacrificial material. A second sacrificial material may be formed over the first capacitor storage node and over the first sacrificial material, and a retaining structure may be formed over the second sacrificial material. A second opening may be formed through the retaining structure and the second sacrificial material, and a second capacitor storage node may be formed within the second opening and against the first storage node. The first and second sacrificial materials may be removed, and then capacitor dielectric material may be formed along the first and second storage nodes. Capacitor electrode material may then be formed along the capacitor dielectric material. Some embodiments include methods of forming DRAM unit cells, and some embodiments include DRAM unit cell constructions.

15 Claims, 47 Drawing Sheets

FIG. II

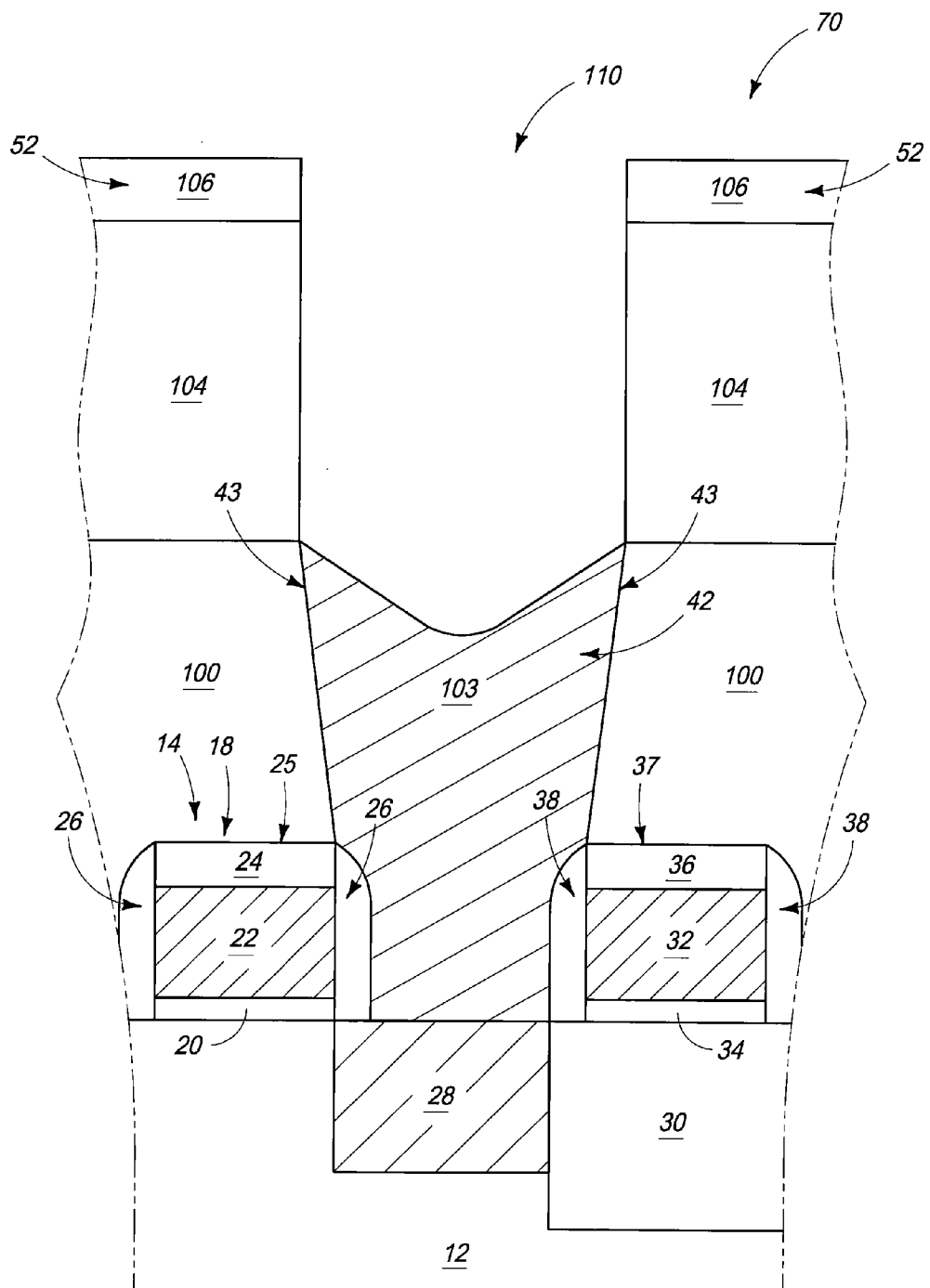
F I G 17

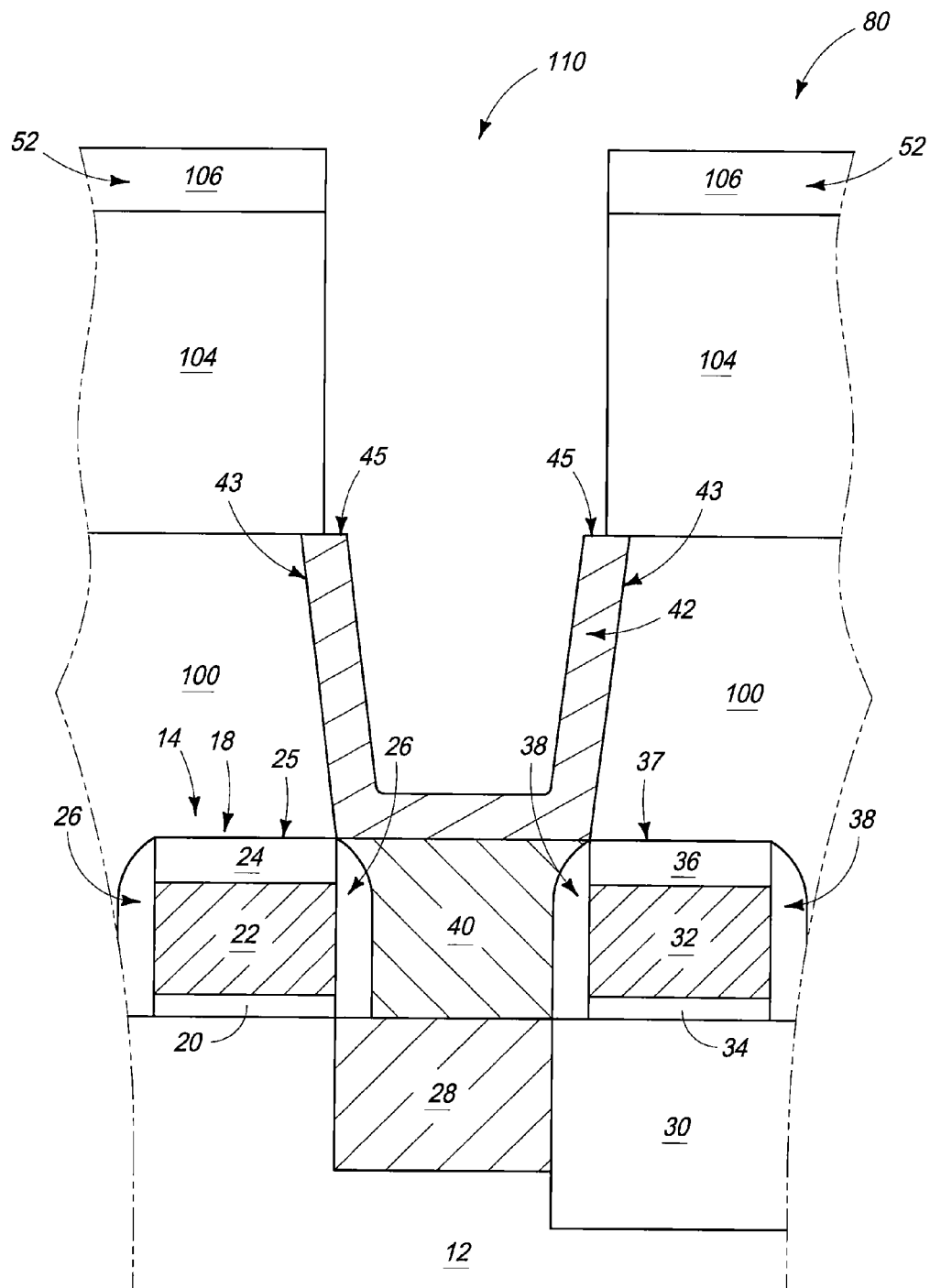
F I G 25

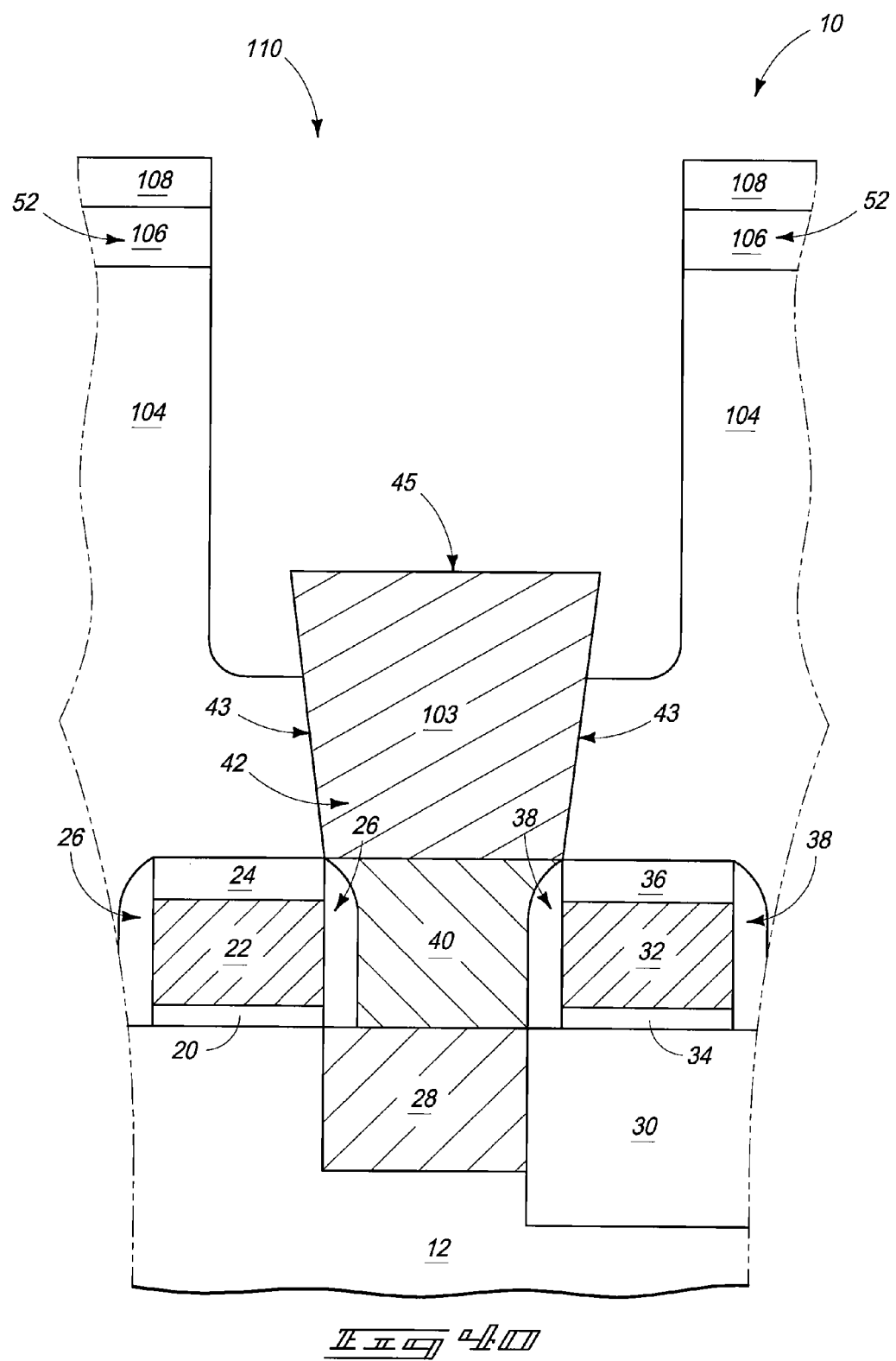
F I G 40

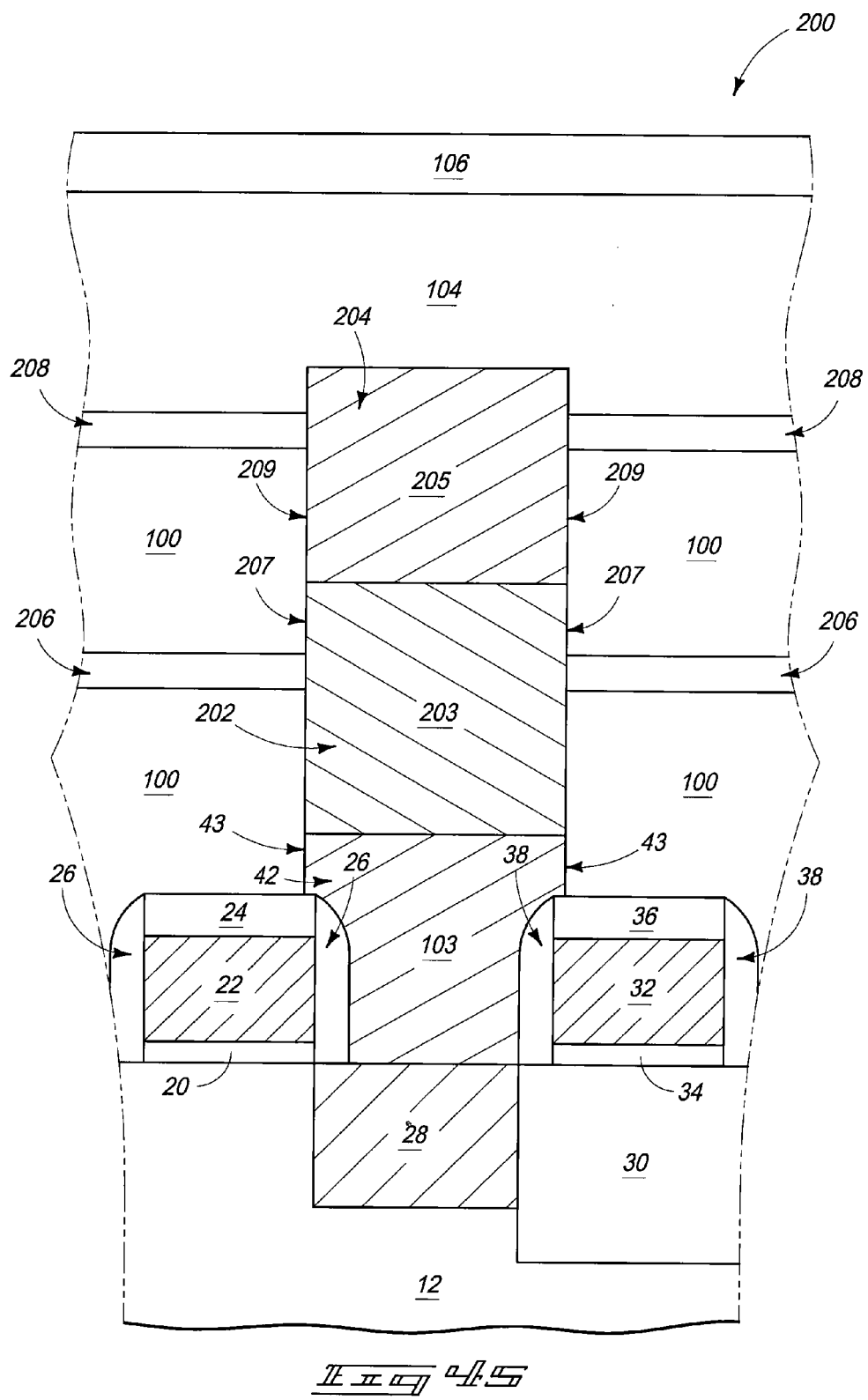
F I G 45

DRAM UNIT CELLS, CAPACITORS, METHODS OF FORMING DRAM UNIT CELLS, AND METHODS OF FORMING CAPACITORS

RELATED PATENT DATA

This patent resulted from a continuation of U.S. patent application Ser. No. 12/409,076, which was filed Mar. 23, 2009, and which is hereby incorporated herein by reference.

TECHNICAL FIELD

DRAM unit cells, capacitors, methods of forming DRAM unit cells, and methods of forming capacitors.

BACKGROUND

Capacitor constructions continue to have increasing aspect ratios in higher generation integrated circuitry fabrication. For example, dynamic random access memory (DRAM) capacitors may have elevations of from 2 to 3 microns, with widths of about 0.1 micron.

It is a continuing goal to increase the density of semiconductor devices, with a corresponding goal to reduce the footprint associated with individual devices. As the packing density of capacitor devices becomes increasingly greater, the available surface area for capacitance decreases. Accordingly, capacitors are being formed to be increasingly tall and thin.

Two types of common capacitor constructions are so-called container-type devices, and so-called stud-type devices. Container-type devices have a storage node electrode shaped as a container, and stud-type devices have a storage node electrode shaped as a solid pedestal. Container-type devices have an advantage over stud-type devices of providing more capacitive area in a given space, but may be structurally weak compared to stud-type devices.

Regardless of whether the capacitor constructions are stud-type devices or container-type devices, the capacitor constructions may become prone to toppling and/or breaking from an underlying base as the capacitor constructions become increasingly tall and thin.

A method which has been developed to provide support to tall, thin capacitors is to utilize a lattice structure to support the capacitors. U.S. Pat. Nos. 7,226,845 and 7,387,939 describe example lattice structures. Unfortunately, the ever-increasing aspect ratio requirements of capacitors are pushing the height-to-width ratios of the capacitors to levels that are difficult to achieve, even utilizing the lattice structures for support.

It would be desirable to develop new methods of forming and supporting high-aspect-ratio capacitor constructions; and to develop new capacitor constructions that can be formed to high aspect ratios.

BRIEF DESCRIPTION OF THE DRAWINGS

FIGS. 14-20 are diagrammatic, cross-sectional views of a portion of semiconductor construction shown at various process stages of an example embodiment method of forming a DRAM unit cell analogous to the type shown in FIG. 2.

FIGS. 21-28 are diagrammatic, cross-sectional views of a portion of semiconductor construction shown at various process stages of an example embodiment method of forming a DRAM unit cell analogous to the type shown in FIG. 3.

FIGS. 29-36 are diagrammatic, cross-sectional views of a portion of semiconductor construction shown at various process stages of an example embodiment method of forming a DRAM unit cell analogous to the type shown in FIG. 4.

FIGS. 40 and 41 are diagrammatic, cross-sectional views of a portion of semiconductor construction shown at various process stages of another example embodiment method of forming a DRAM unit cell. The processing stage of FIG. 40 can follow that of FIG. 7.

FIGS. 45-47 are diagrammatic, cross-sectional views of a portion of semiconductor construction shown at various process stages of another example embodiment method of forming a DRAM unit cell.

DETAILED DESCRIPTION OF THE ILLUSTRATED EMBODIMENTS

Some embodiments include new capacitors. The capacitors may be incorporated into integrated circuitry, and in some embodiments may be utilized as charge-storage devices of DRAM unit cells. FIGS. 1-4 show some example capacitors incorporated into DRAM unit cells.

Figure 1:
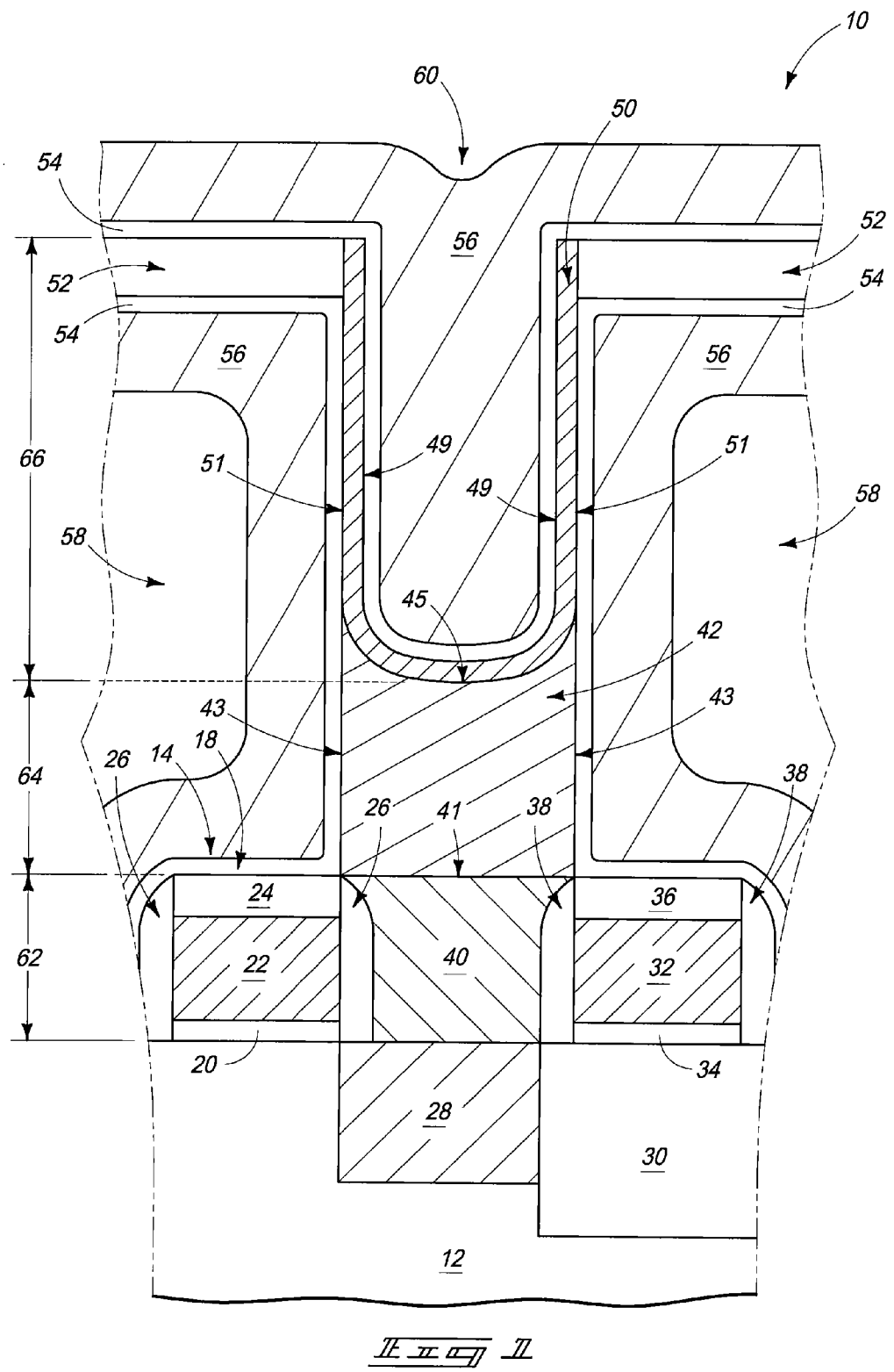
FIG. 1 is a diagrammatic, cross-sectional view of an embodiment of a DRAM unit cell.

Referring to FIG. 1, a portion of a semiconductor construction 10 is illustrated. The construction includes a base 12 supporting transistor 14.

Base 12 may comprise, consist essentially of, or consist of, for example, monocrystalline silicon lightly-doped with background p-type dopant; and may be referred to as a semiconductor substrate. The terms "semiconductive substrate", "semiconductor construction" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

The transistor 14 comprises a gate stack 18. The gate stack comprises gate dielectric material 20, electrically conductive the gateline material 22, and electrically insulative capping material 24. The gate dielectric material 20 may comprise any suitable composition or combination of compositions, and may, for example, comprise silicon dioxide. The gateline material 22 may comprise any suitable composition or combination of compositions, and may, for example, comprise one or more of various metals (for instance, tungsten, titanium, platinum, etc.), metal-containing compounds (for instance, metal nitride, metal silicide, etc.), and conductively-doped semiconductor materials (for instance, conductively-doped silicon, conductively-doped germanium, etc.). The insulative capping material 24 may comprise any suitable composition or combination of compositions, and may, for example, comprise, consist essentially of, or consist of one or more of silicon dioxide, silicon nitride and silicon oxynitride.

The gateline material 22 may be part of an access line (for instance, a wordline or digit line) extending into and out of the page relative to the cross-section of FIG. 1.

Sidewall spacers 26 are along lateral edges of the gateline stack 18, and form an electrically insulative barrier along such lateral edges. The sidewall spacers may comprise any suitable composition or combination of compositions, and may, for example, comprise one or more of silicon dioxide, silicon nitride and silicon oxynitride.

A conductive region 28 is shown extending into substrate 12 in a location adjacent the gate stack 18. The conductive region 28 corresponds to a source/drain region of the transistor 14, and may, for example, comprise a conductively-doped region formed within the semiconductor material of base 12. The transistor 14 comprises another source/drain region (not shown) in addition to the source/drain region 28, and gatedly connected to the source/drain 28 through the gate stack 18. The other source/drain region may be connected to a bitline (not shown) so that a capacitor (described below) electrically connected with source/drain region 28 may be uniquely addressed by the combination of the bitline and wordline. Such capacitor may thus be incorporated into a large array of capacitors in a memory chip, such as, for example, a DRAM chip.

An electrically insulative region 30 extends into substrate 12 adjacent source/drain region 28, and a conductive line 32 is supported over the insulative region 30. The conductive line 32 is offset from the insulative region by an insulative material 34 which may correspond to gate dielectric, and is covered by an insulative material 36 which may correspond to insulative capping material. Additionally, sidewall spacers 38 are along lateral sides of the conductive line 32 to provide an insulative barrier adjacent such lateral sides. The conductive line 32 may correspond to a wordline, or digit line, extending into and out of the page relative to the cross-section of FIG. 1.

An electrically conductive pedestal 40 is formed over source/drain region 28, and in electrical connection with such source/drain region. Pedestal 40 may comprise any suitable composition or combination of compositions, and may, for example, comprise one or more of various metals, metal-containing compounds, and conductively-doped semiconductor materials.

The pedestal has an uppermost surface 41 that is at or below an elevational level of uppermost surfaces of insulative capping materials 24 and 36.

A first capacitor storage node 42 is over, and electrically connected with, pedestal 40. The capacitor storage node 42 is shown to be a stud-type storage node, and thus is in the form of an electrically conductive pedestal. Capacitor storage node 42 may comprise any suitable composition or combination of compositions; and may, for example, comprise, consist essentially of, or consist of one or more of various metals, metal-containing compounds, and conductively-doped semiconductor materials. In some embodiments, storage node 42 may comprise, consist essentially of, or consist of one or more of titanium, titanium nitride and tungsten.

The capacitor storage node 42 has outer lateral surfaces 43, and has a top surface 45. The top surface 45 may be curved (as shown) or planar. The capacitor storage node 42 may have any suitable shape when viewed from above, and may, for example, be circular or elliptical in top-down view.

Although storage node 42 is shown to be a separate structure from pedestal 40, and thus to have a different composition from pedestal 40, in other embodiments the storage node may comprise the same composition as pedestal 40 so that the storage node and pedestal merge into a single structure.

The first capacitor storage node 42 is in electrical connection with source/drain region 28 through the electrically conductive pedestal 40.

A second capacitor storage node 50 is over and in direct physical contact with the first storage node 42. The second capacitor storage node 50 is a container-shaped storage node, and thus comprises inner lateral surfaces 49 and outer lateral surfaces 51.

The second capacitor storage node 50 may comprise any suitable composition or combination of compositions; and may, for example, comprise, consist essentially of, or consist of one or more of various metals, metal-containing compounds, and conductively-doped semiconductor materials. In some embodiments, storage node 50 may comprise, consist essentially of, or consist of one or both of titanium and titanium nitride.

The second capacitor storage node 50 is supported by at least one lattice structure 52. In the shown embodiment, there is only one lattice structure, and such structure is at an uppermost region of storage node 50. Lattice structure 52 may comprise any suitable composition or combination of compositions; and may, for example, comprise, consist essentially of, or consist of silicon nitride.

The second capacitor storage node 50 may comprise a different composition from the first capacitor storage node 42, as shown. In other embodiments, the second capacitor storage node may comprise a same composition as the first capacitor storage node so that the two storage nodes merge to form a single structure.

The second capacitor storage node 50 may have any suitable shape when viewed from above, and may, for example, be a circular or elliptical annular ring in top-down view.

Capacitor dielectric material 54 is provided along the inner lateral surfaces 49 of the second capacitor storage node 50, along the outer lateral surfaces 51 of the second capacitor storage node, and along the outer lateral surfaces 43 of the first capacitor storage node 42. The capacitor dielectric material may comprise any suitable composition or combination of compositions, and in some embodiments may comprise, consist essentially of, or consist of one or both of silicon nitride and silicon dioxide.

Capacitor electrode material 56 is provided along the capacitor dielectric material 54, and is isolated from the first and second capacitor storage nodes 42 and 50 by the capacitor dielectric material. The capacitor electrode material 56 may comprise any suitable composition or combination of compositions; and may, for example, comprise, consist essentially of, or consist of one or more of various metals, metal-containing compounds, and conductively-doped semiconductor materials.

In the shown embodiment, the capacitor electrode material 56 extends conformally along the dielectric material 54, to leave void regions 58 which have not been filled by the capacitor electrode material. In some embodiments, the void regions may be left empty (or in other words, may have nothing but gas therein), and in other embodiments the void regions may be filled with one or more suitable materials.

Such materials may be electrically insulative or electrically conductive. If the void regions are filled with electrically conductive materials, such materials may, for example, comprise conductively-doped polysilicon.

The storage nodes 42 and 50, together with capacitor dielectric material 54 and capacitor electrode material 56 form a capacitor 60.

The construction of FIG. 1 is not to scale to enable the various materials and structures of FIG. 1 to be illustrated. In some embodiments, the construction of FIG. 1 may be considered to comprise three sections that contribute to the overall height of the capacitor 60. Such sections include a height 62 of the pedestal 40, a height 64 of the first capacitor storage node 42 over the pedestal, and a height 66 of the second capacitor storage node 50 over the first capacitor storage node. In some embodiments, height 62 may be less than four microns, less than one micron, or less than one-half of a micron, and may be, for example, a few hundred nanometers. The height 64 may be greater than or equal to 3000 angstroms, in some embodiments may be from about 3000 angstroms to about 3 microns, and in some embodiments may be from about 3000 angstroms to about 7000 angstroms. The height 66 may also be greater than or equal to about 3000 angstroms, and may be from about 3000 angstroms to about 3 microns in some embodiments. If the height 64 is so large that the first storage node 42 becomes unstable, lattice structures may be provided to support the first storage node. Also, if the height 66 becomes so large that a single lattice structure is not sufficient to stabilize the second storage node 50, additional lattice structures may be provided to add additional stability to the second storage node.

Figure 2:
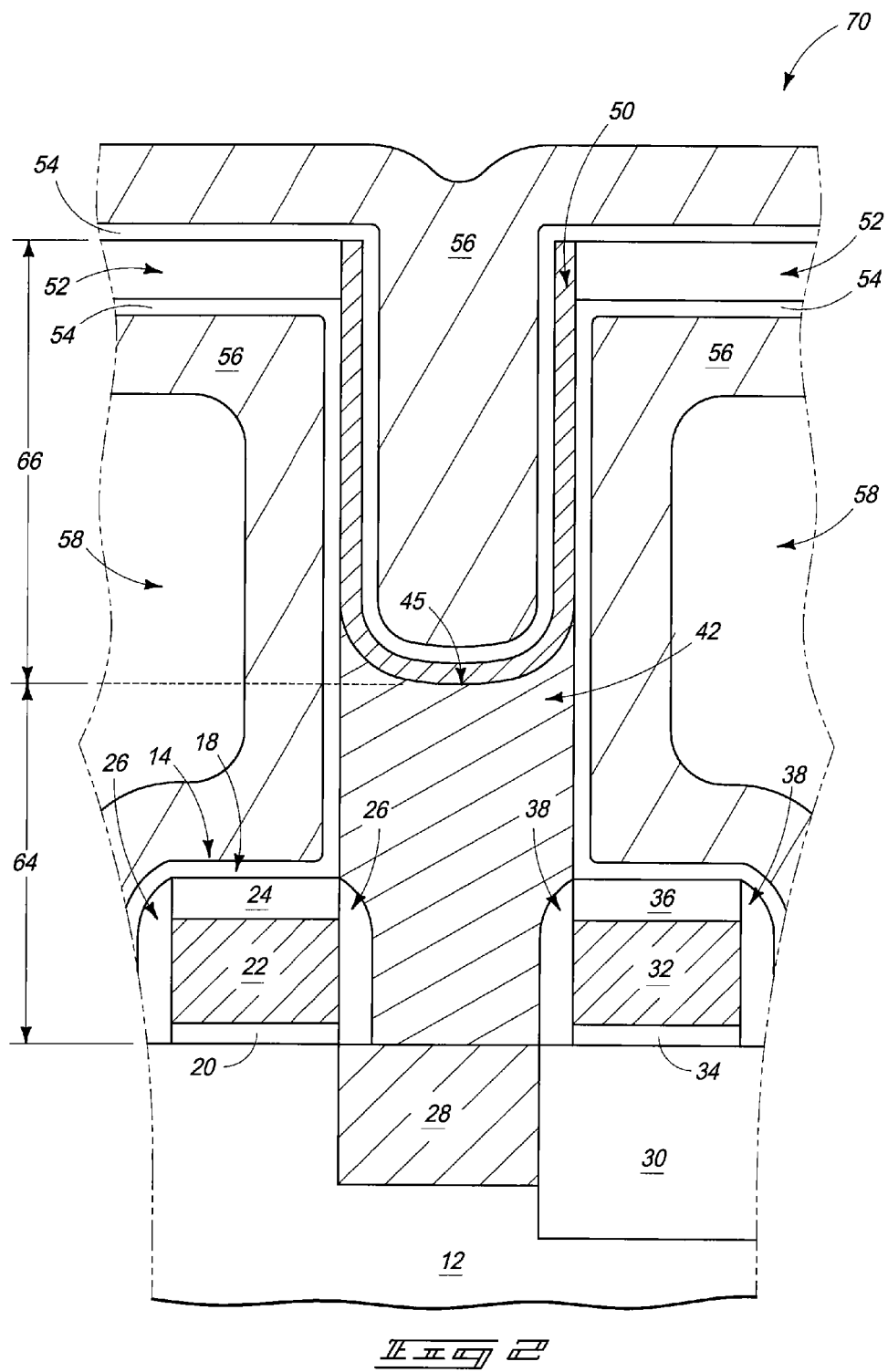
FIG. 2 is a diagrammatic, cross-sectional view of another embodiment of a DRAM unit cell.

Referring to FIG. 2, a portion of a semiconductor construction 70 is illustrated. The construction 70 shows another embodiment of a DRAM unit cell. Identical numbering is used to identify the components of the construction of FIG. 2 as was used above in describing FIG. 1. The construction of FIG. 2 differs from that of FIG. 1 in that the pedestal 40 (FIG. 1) has been omitted. Thus, the height of the capacitor 60 of FIG. 2 is determined solely by the heights 64 and 66 of the first and second storage nodes 42 and 50.

Figure 3:
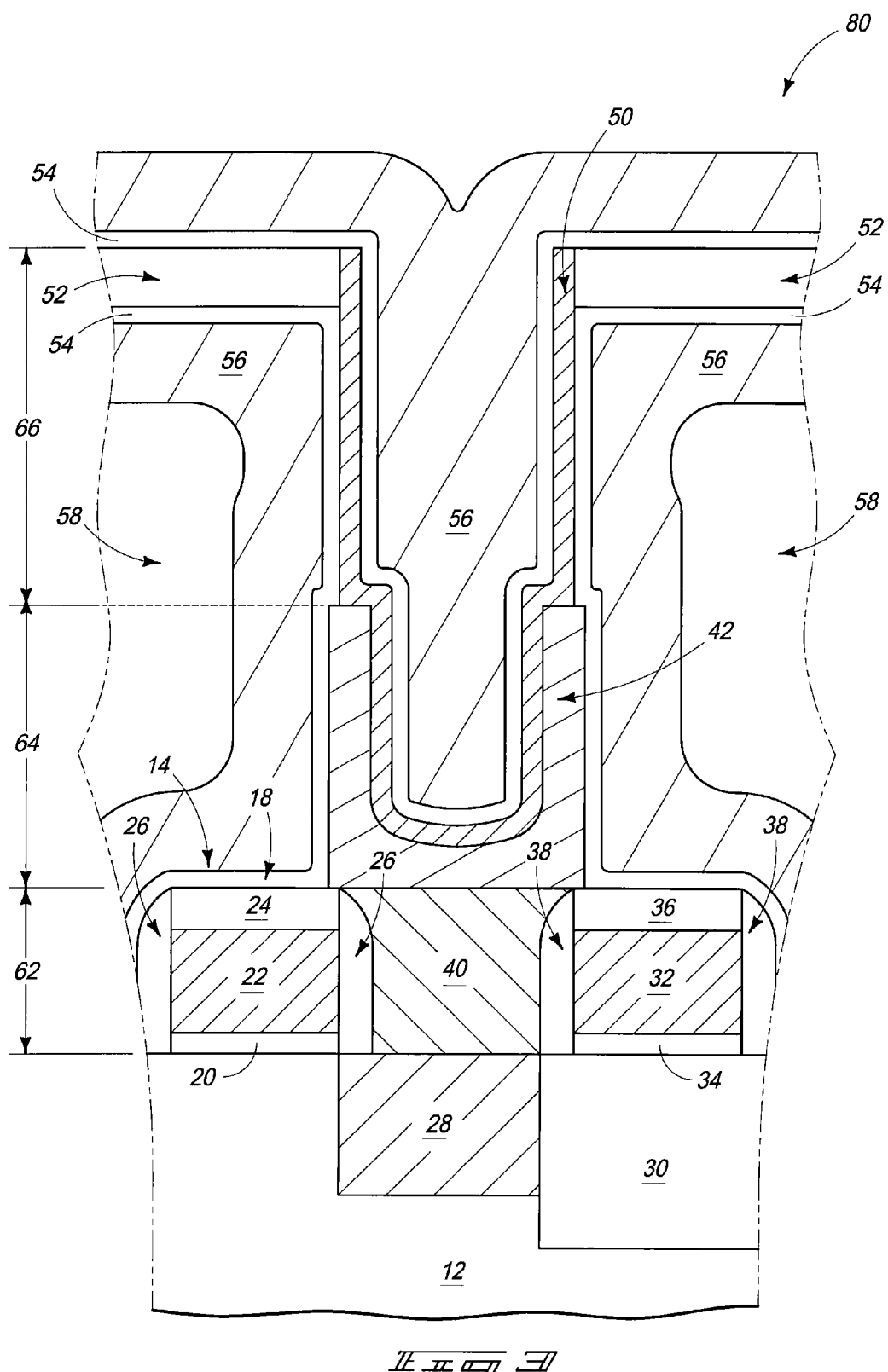
FIG. 3 is a diagrammatic, cross-sectional view of another embodiment of a DRAM unit cell.

Referring to FIG. 3, a portion of a semiconductor construction 80 is illustrated. The construction 80 shows another embodiment of a DRAM unit cell. Identical numbering is used to identify the components of the construction of FIG. 3 as was used above in describing FIG. 1. The construction of FIG. 3 differs from that of FIG. 1 in that the first storage node 42 is a container-type storage in the construction of FIG. 3.

Figure 4:
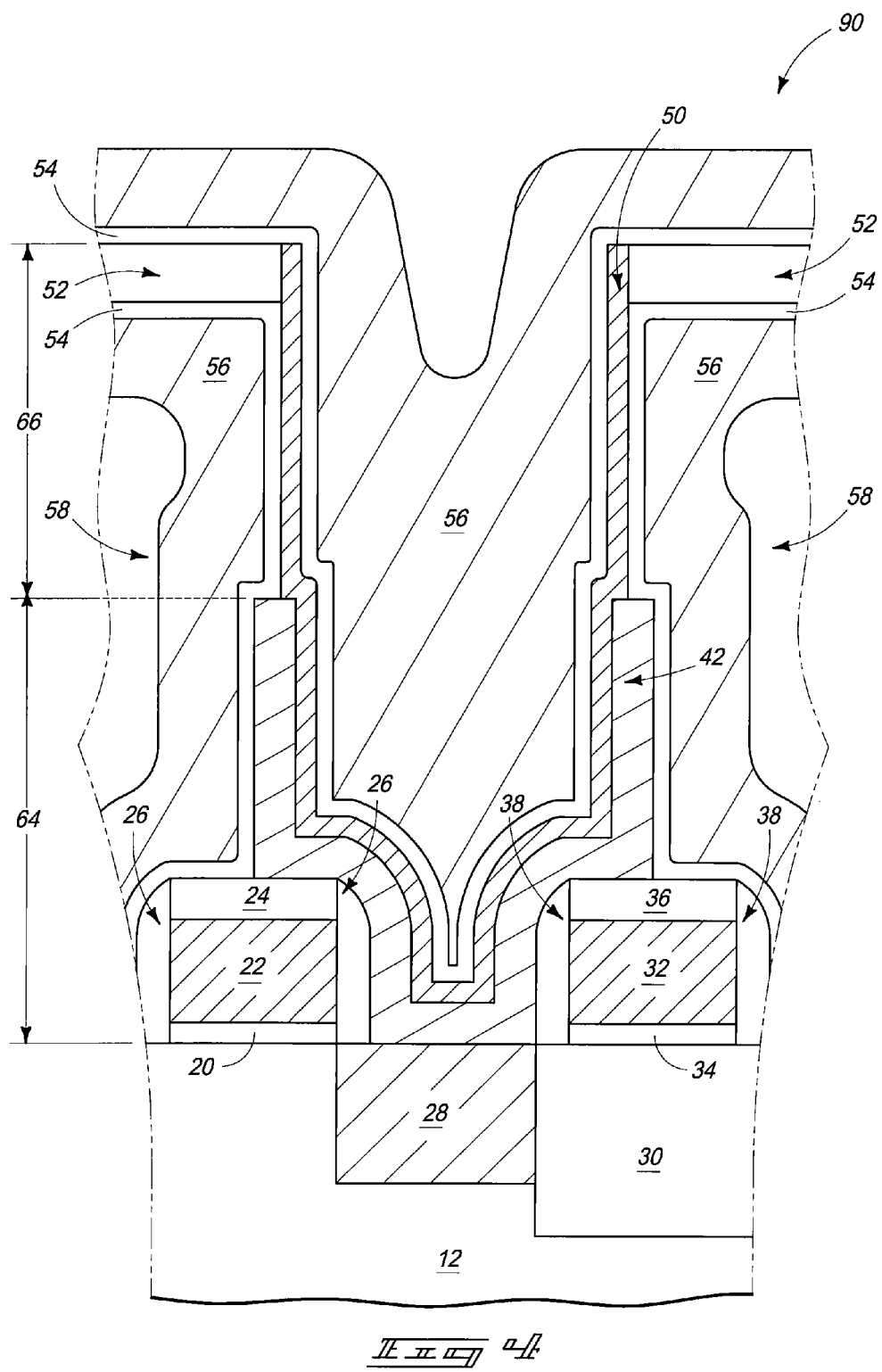
FIG. 4 is a diagrammatic, cross-sectional view of another embodiment of a DRAM unit cell.

Referring to FIG. 4, a portion of a semiconductor construction 90 is illustrated. The construction 90 shows another embodiment of a DRAM unit cell. Identical numbering is used to identify the components of the construction of FIG. 4 as was used above in describing FIG. 1. The construction of FIG. 4 differs from that of FIG. 1 in that the first storage node 42 is a container-type storage in the construction of FIG. 4, and the pedestal 40 (FIG. 1) has been omitted.

The constructions of FIGS. 1-4 are examples of constructions having capacitors with two or more storage nodes, and having dielectric material extending along outer lateral surfaces of the storage nodes. Such capacitors may be referred to as K-cells. The constructions of FIGS. 1-4 may be formed by any suitable methods. An example method for forming a construction analogous to that shown in FIG. 1 is described with reference to FIGS. 5-13.

Figure 5:
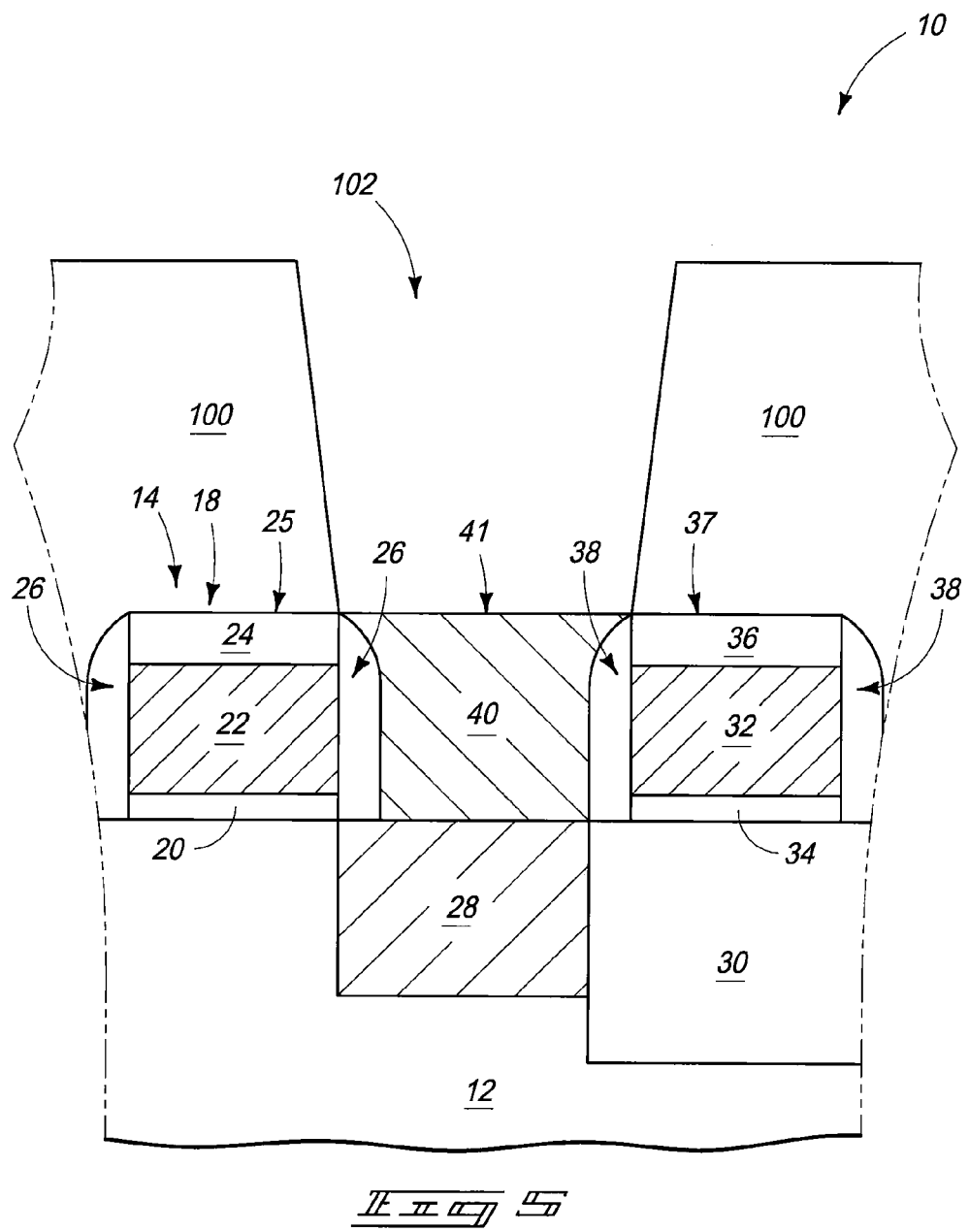
FIGS. 5-13 are diagrammatic, cross-sectional views of a portion of semiconductor construction shown at various process stages of an example embodiment method of forming a DRAM unit cell analogous to the type shown in FIG. 1.

Referring to FIG. 5, construction 10 is illustrated at an early processing stage. The construction includes the gate stack 18 and source/drain region 28 of transistor 14. The construction also includes the insulative region 30, the conductive line 32 extending over such insulative region, and the insulative cap 36 over the conductive line. The gate stack 18 includes the insulative cap 24. The insulative caps 24 and 36 are shown to have uppermost surfaces 25 and 37, respectively; with such uppermost surfaces both being at about the same elevational level over substrate 12. The construction 10 also comprises pedestal 40 over source/drain region 28. In the shown embodiment such pedestal has an uppermost surface 41 that is at a common elevational level with the uppermost surfaces 25 and 37 of the insulative caps 24 and 36, respectively.

A material 100 is formed over substrate 12, and over the insulative caps 24 and 36. Material 100 may comprise any suitable composition or combination of compositions, and in some embodiments may comprise, consist essentially of, or consist of one or more of undoped silicate glass (USG) and various doped silicate glasses (for instance, BPSG, PSG, FSG, etc.). Although material 100 is shown to be homogeneous, in some embodiments the material may comprise two or more different layers. For instance, an upper portion of material 100 may comprise a composition selectively etchable relative to a lower portion of material 100. In an example embodiment, an upper portion of material 100 may comprise a doped silicate glass, and a lower portion of material 100 may comprise USG. At least part of material 100 is sacrificial (for instance, a part consisting of doped silicate glass may be sacrificial). In some embodiments, material 100 may be referred to as a first sacrificial material to distinguish it from another sacrificial material formed at a later processing stage (for instance, the processing stage discussed below with reference to FIG. 7).

An opening 102 is patterned through material 100 to expose the upper surface 41 of pedestal 40. Such opening may be formed by any suitable method. In some embodiments, material 100 may be formed to initially extend across pedestal 40, a patterned masking layer (not shown) may be formed over material 100 to protect portions of material 100 while leaving a portion over pedestal 40 exposed to an etch, the etch may be conducted to remove the portion of material 100 from over pedestal 40, and then the masking layer can be removed to leave the construction shown in FIG. 5. The masking layer may comprise any suitable composition, and in some embodiments may comprise photolithographically-patterned photoresist.

The opening 102 is shown having sloped sidewalls, as commonly occurs during etching of deep openings (in other words, openings than or greater than or equal to one micron deep). In some embodiments, the opening 102 may be formed with straight sidewalls instead of the shown sloped sidewalls.

Figure 6:
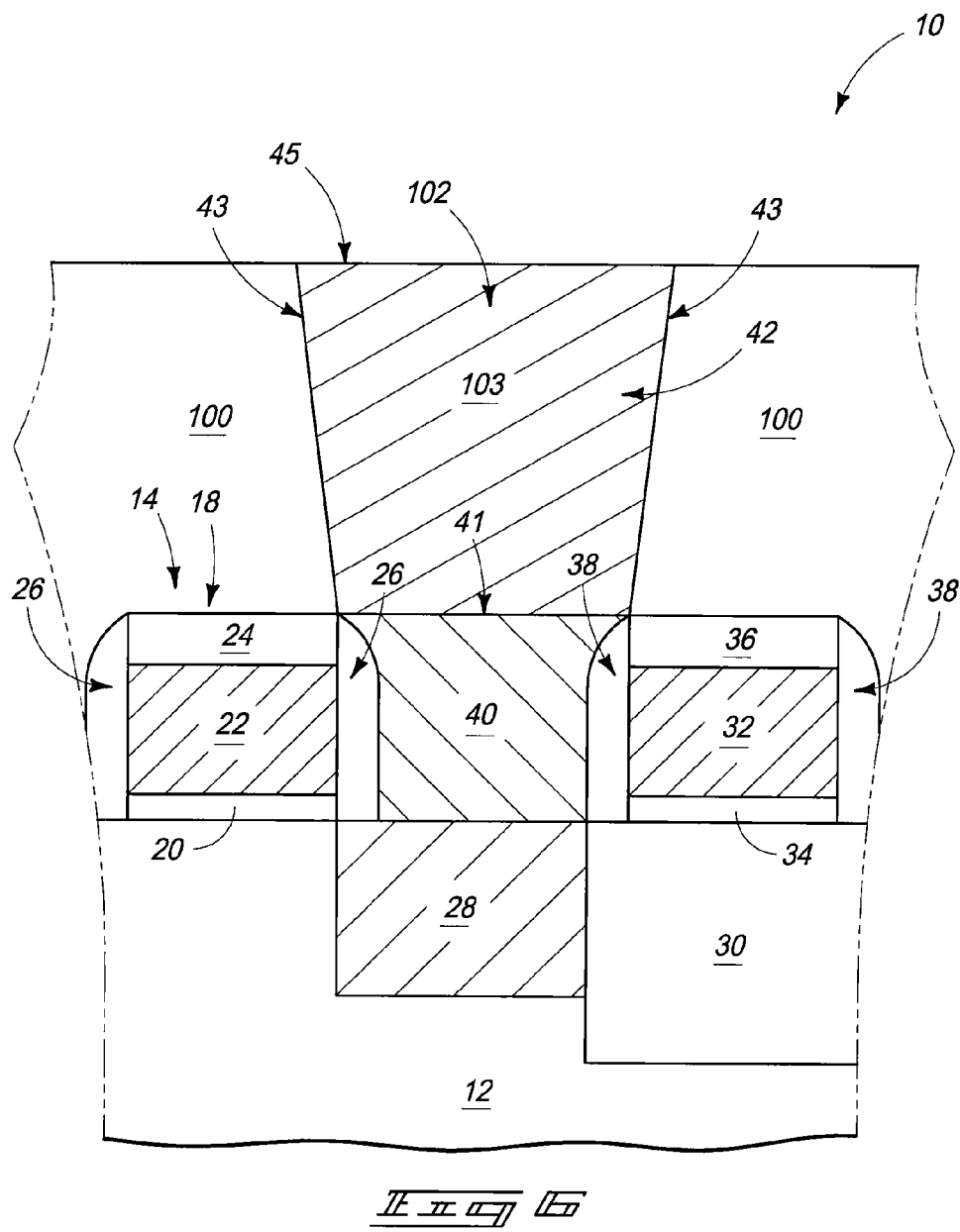

Referring to FIG. 6, electrically conductive storage node material 103 is formed within opening 102, and is patterned to form the first capacitor storage node 42. The formation of the first capacitor storage node may comprise depositing the electrically conductive storage node material 103 over sacrificial material 100 and within opening 102, and then planarizing the conductive material to leave the shown construction. Although the storage node material is shown to be homogeneous, in some embodiments the storage node material may comprise multiple layers. For instance, the storage node material may comprise a thin layer of titanium nitride formed along the sidewalls and bottom of opening 102, a layer of titanium formed along the layer of titanium nitride to create a titanium liner within opening 102, and a tungsten fill which fills the remaining portion of opening 102.

The storage node 42 has an upper surface 45, and in the shown embodiment such upper surface is coplanar with upper surfaces of material 100. In other embodiments, surface 45 may not be coplanar with upper surfaces of material 100.

The capacitor storage node 42 has outer lateral surfaces 43 that are along and directly against sacrificial material 100.

Figure 7:
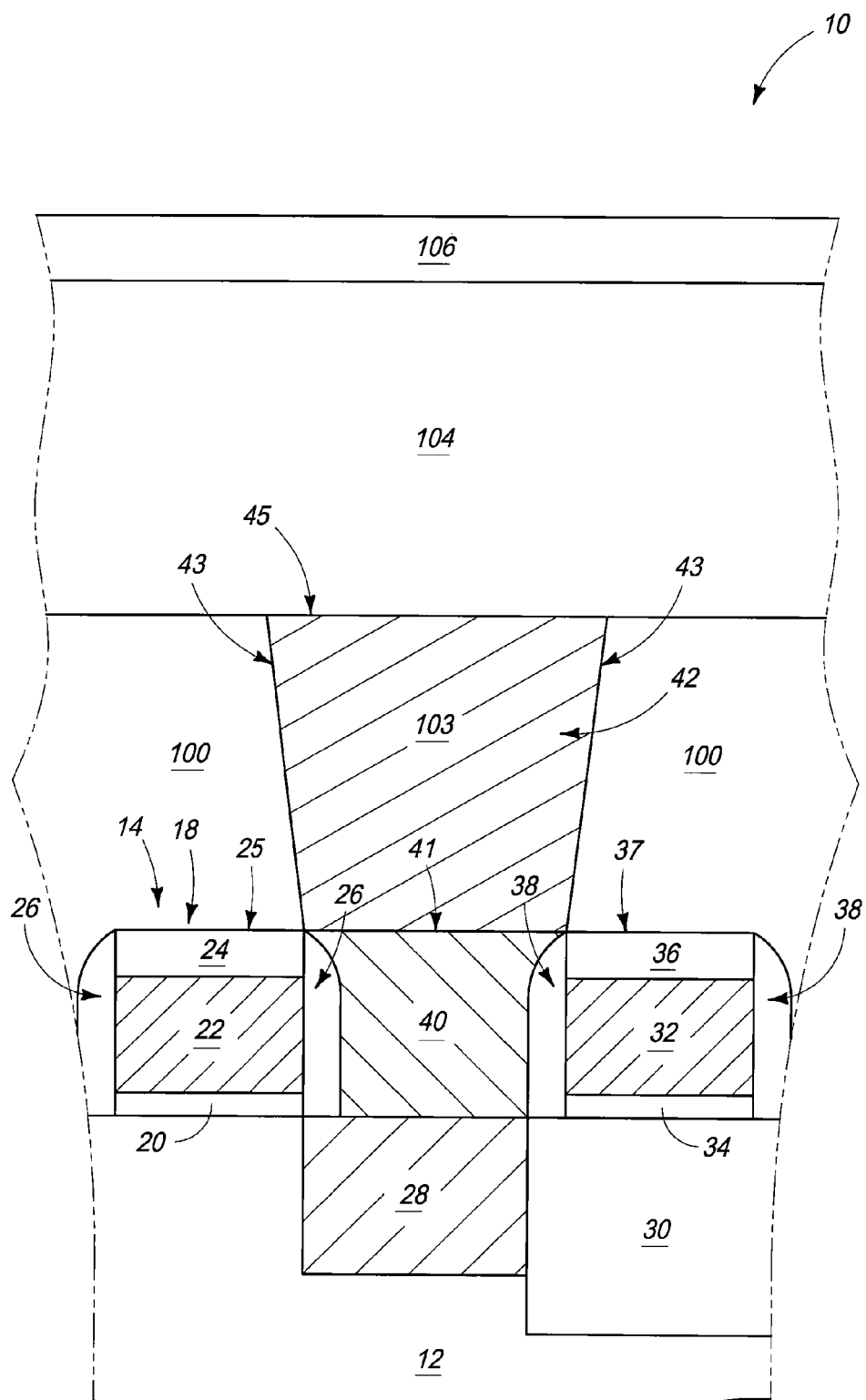

Referring to FIG. 7, a second sacrificial material 104 is formed over the first sacrificial material 100, and over the first storage node 42. The second sacrificial material may comprise the same composition as the first sacrificial material, or may comprise a different composition. In some embodiments, both the first and second sacrificial materials will comprise, consist essentially of, or consist of a doped silicate glass, such as, for example, BPSG.

A lattice material 106 is formed over the sacrificial material 104. The lattice material is ultimately to be patterned into the lattice structure 52 (FIG. 1), and accordingly can comprise any of the compositions discussed above with reference to such lattice structure.

Figure 8:
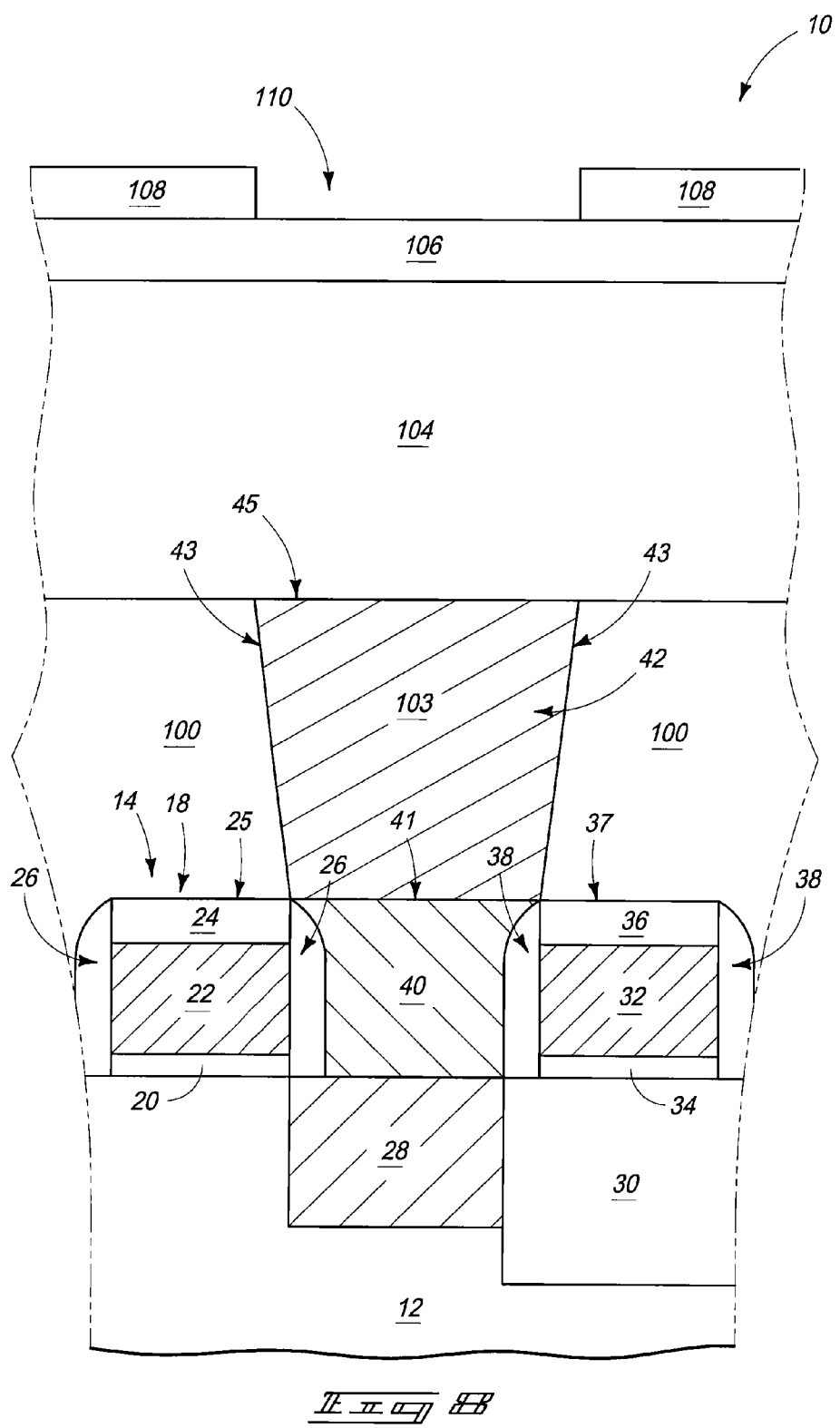

Referring to FIG. 8, a patterned masking material 108 is formed over lattice material 106. The patterned masking material may comprise, for example, photolithographically-patterned photoresist. The patterned masking material defines an opening 110 over the lattice material 106.

Figure 9:
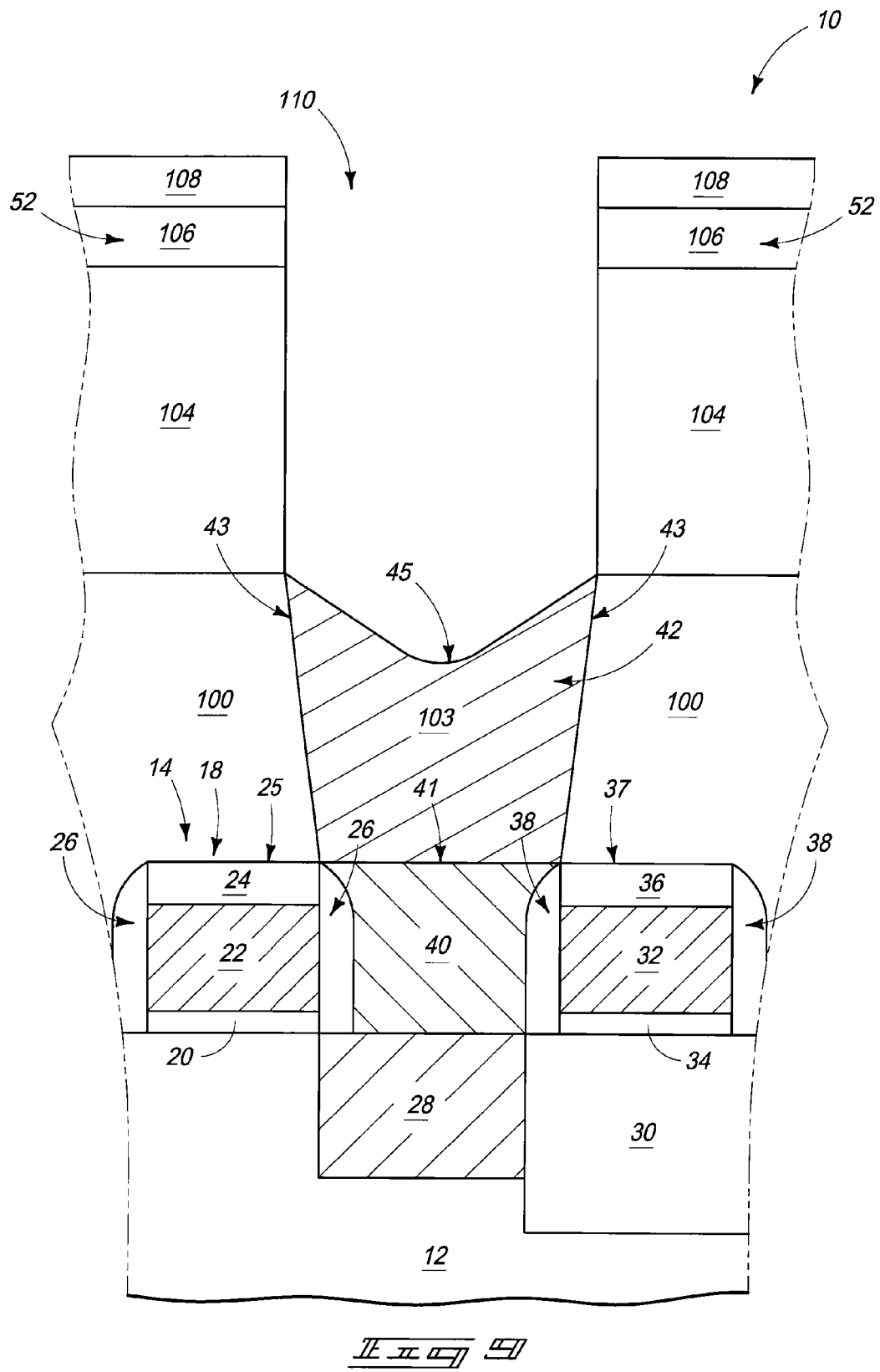

Referring to FIG. 9, opening 110 is extended through lattice material 106 and sacrificial material 104 with one or more suitable etches. In the shown embodiment, the etches have also recessed the upper surface 45 of capacitor storage node 42. Such may occur in embodiments in which storage node 42 comprises tungsten, and sacrificial material 104 comprises BPSG.

The formation of opening 110 patterns lattice material 106 into lattice structure 52.

Figure 10:
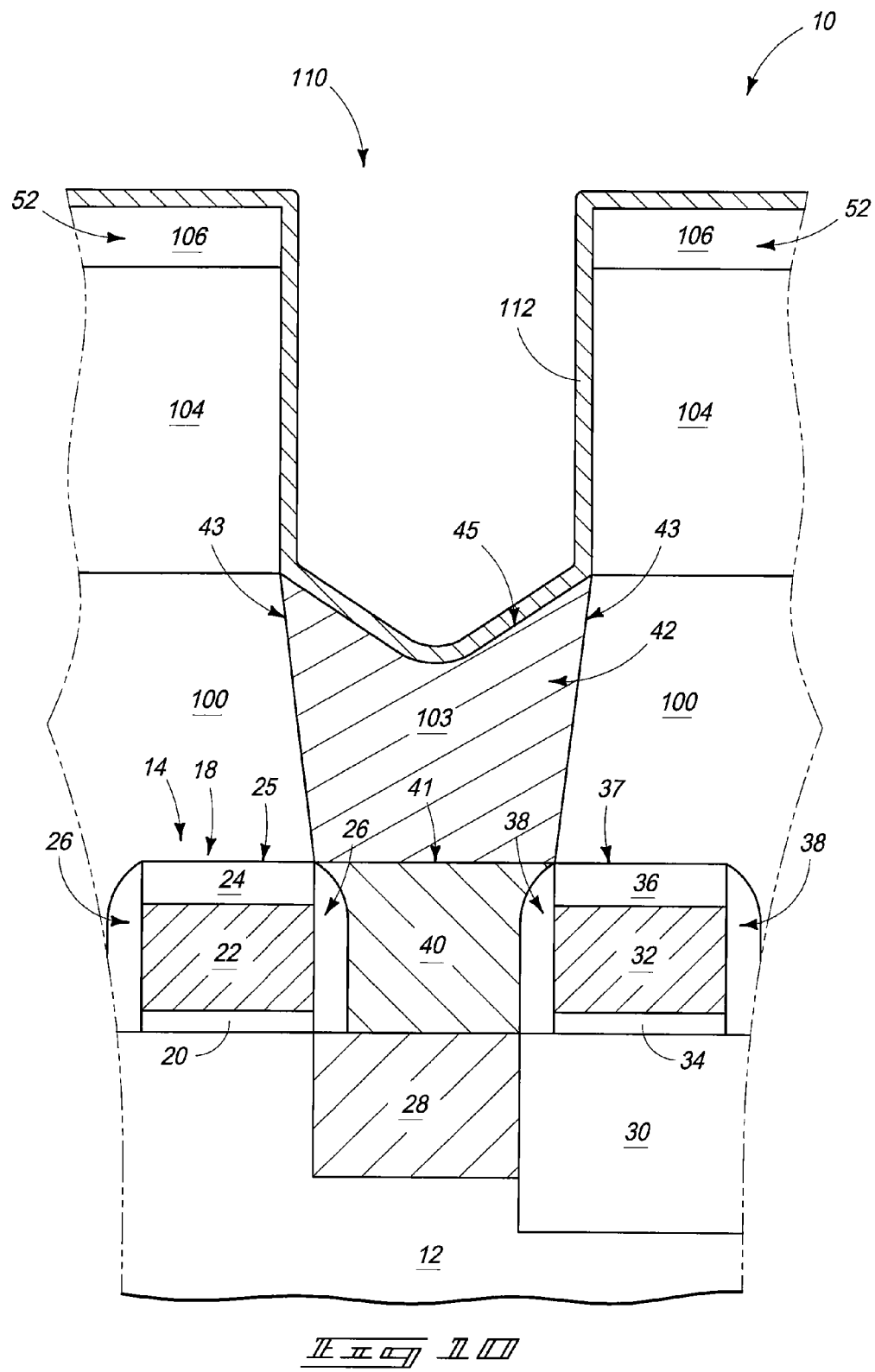

Referring to FIG. 10, masking material 108 (FIG. 9) is removed, and subsequently conductive material 112 is formed within opening 110 and over lattice material 106. The conductive material 112 lines opening 110, and is ultimately patterned into the second capacitor storage node 50 (FIG. 1). The material 112 may thus comprise any of the compositions discussed above with reference to the second capacitor storage node, and may be formed by any suitable method (including, for example, chemical vapor deposition, chemical vapor deposition, atomic layer deposition, etc.).

Figure 11:
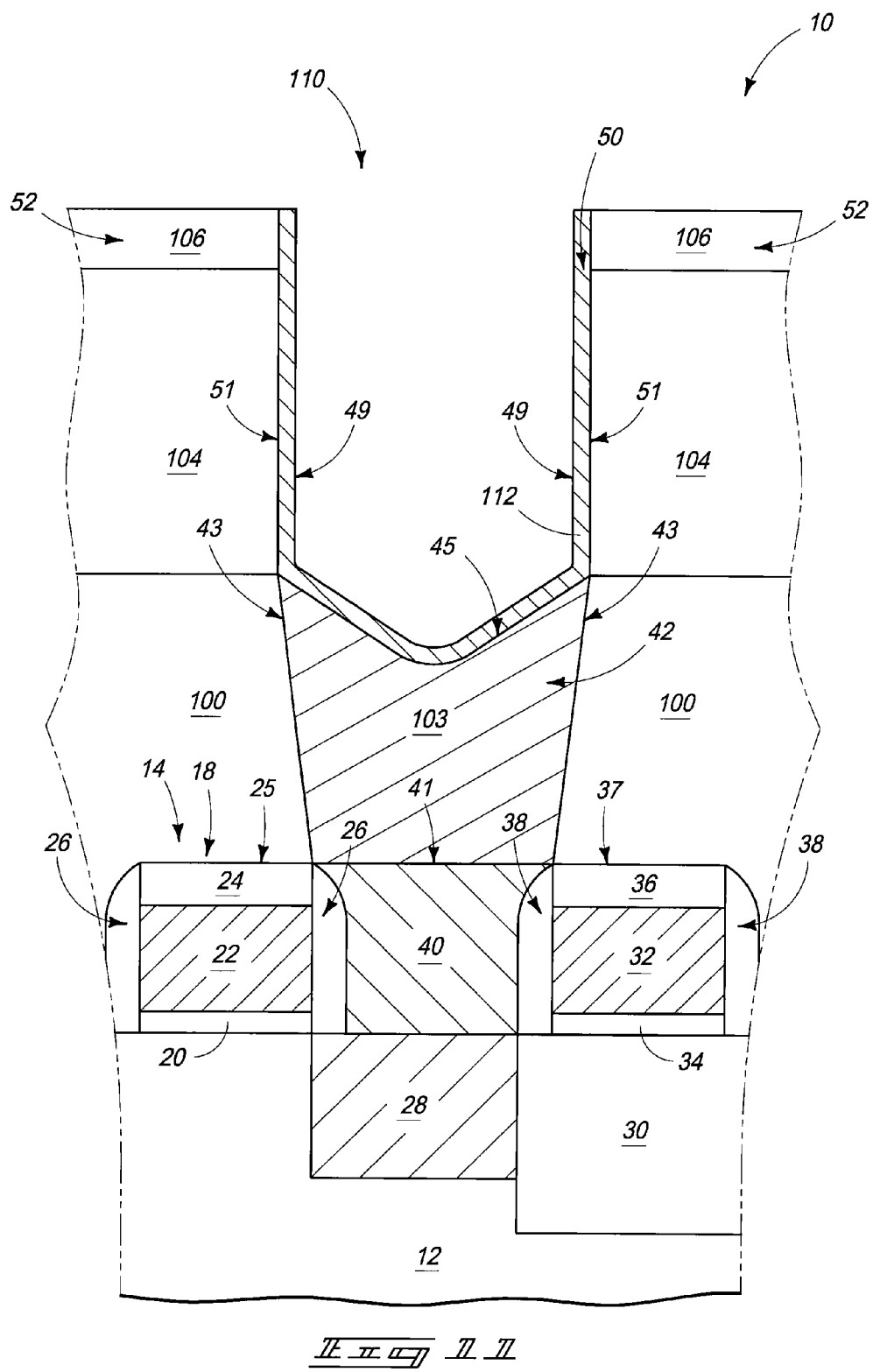

Referring to FIG. 11, conductive material 112 is removed from over lattice structure 52, while leaving the conductive material within opening 110. Such patterns conductive material 112 into the second capacitor storage node 50. The removal of conductive material 112 from over lattice structure 52 may be accomplished utilizing any suitable processing, such as, for example, chemical-mechanical polishing (CMP).

The capacitor storage node 50 has inner lateral surfaces 49 and outer lateral surfaces 51. The outer lateral surfaces 51 are along and directly against the sacrificial material 104.

The recessing of upper surface 45 (discussed above with reference to FIG. 9) may be beneficial in providing a cupped region to assist in retaining and supporting the second capacitor storage node 50.

Figure 12:
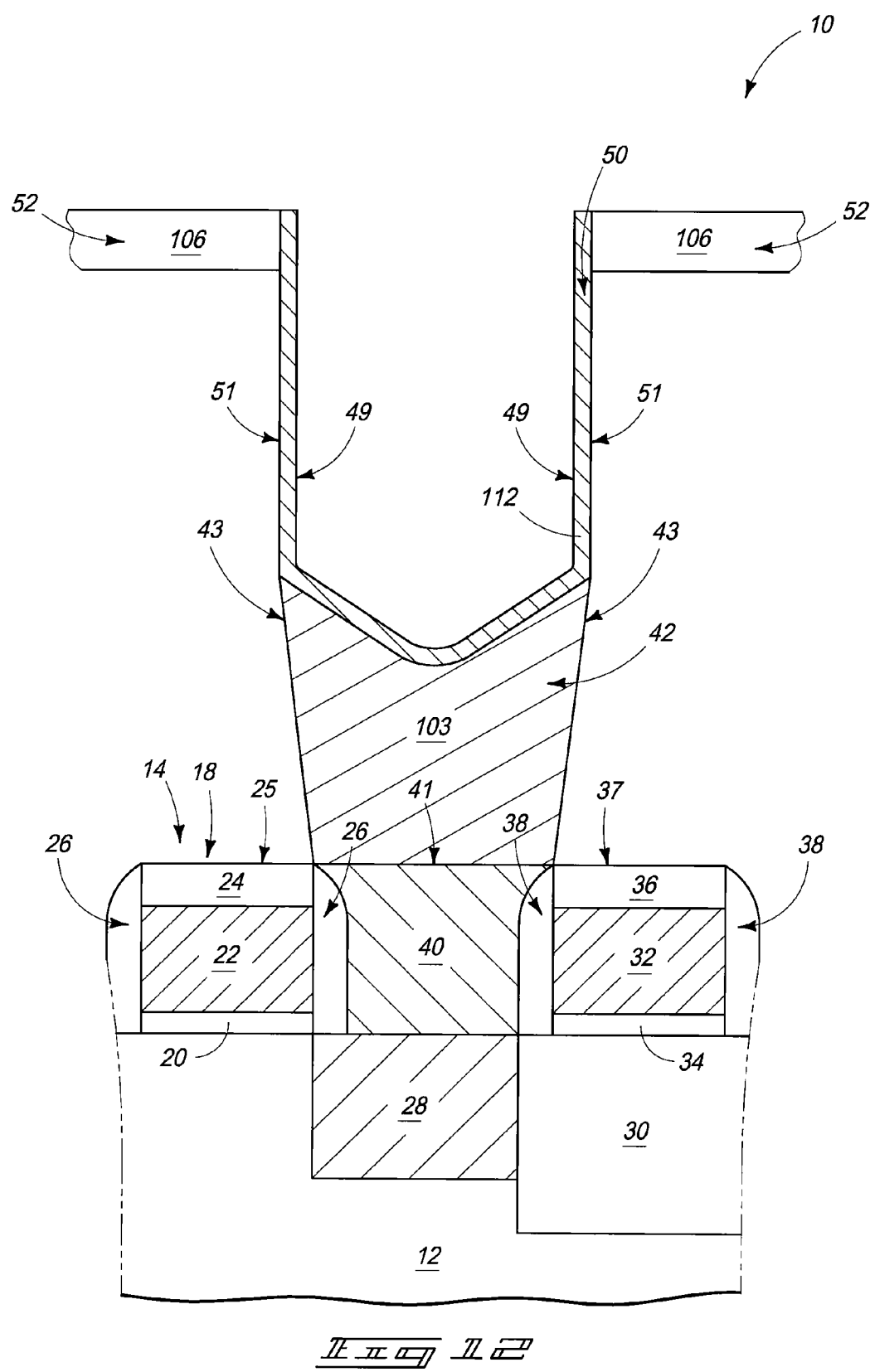

Referring to FIG. 12, sacrificial materials 100 and 104 (FIG. 11) are removed. Such removal may comprise forming openings (not shown) through lattice material 106 to expose the sacrificial materials 100 and 104 to an isotropic etch. The removal of sacrificial materials 100 and 104 exposes the outer lateral surfaces 43 and 51 of the first and second capacitor storage nodes 42 and 50, respectively.

Figure 13:
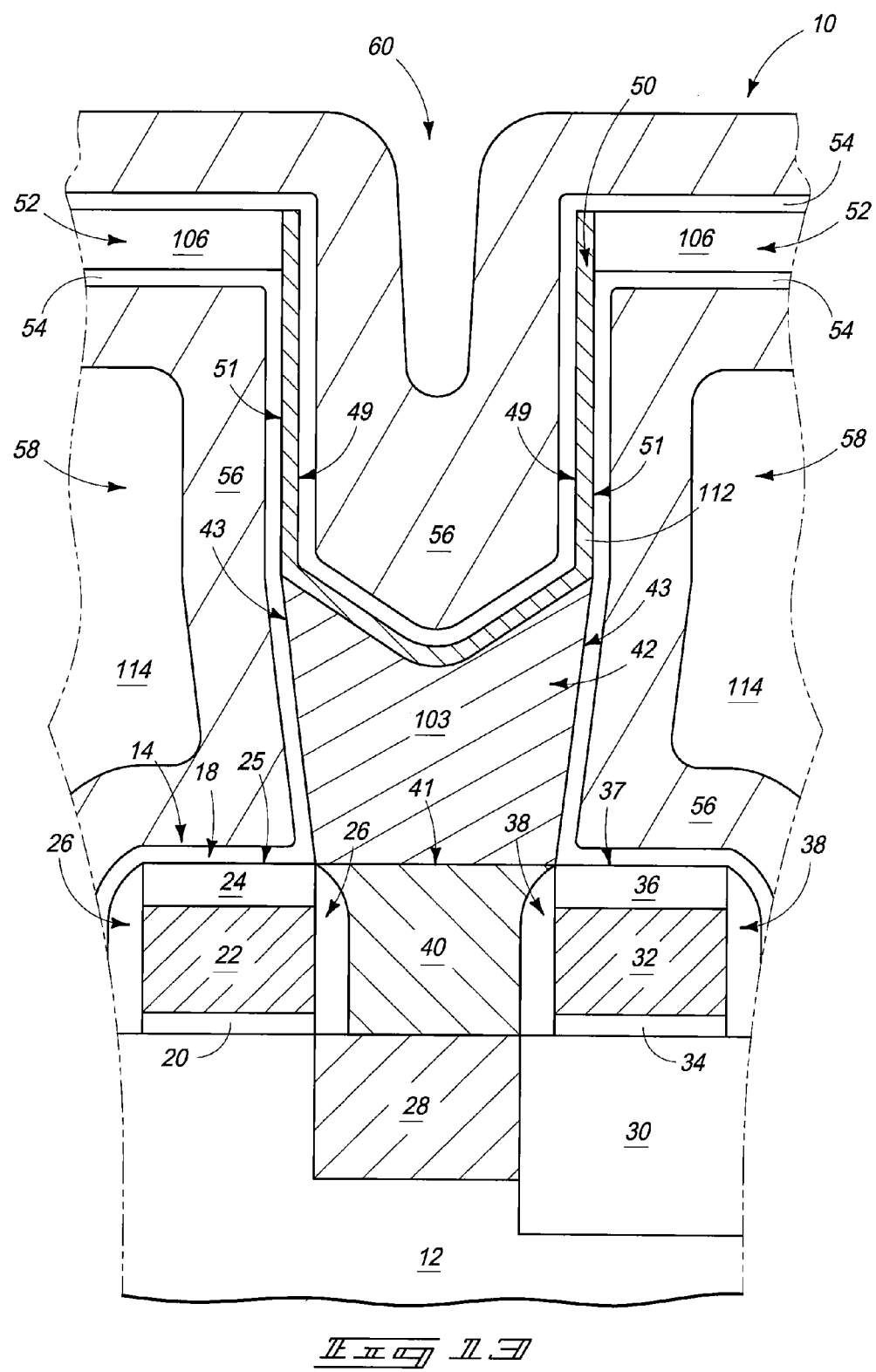

Referring to FIG. 13, capacitor dielectric material 54 is formed along the outer lateral surfaces 43 of the first capacitor storage node 42, and along the outer lateral surfaces 51 of the second capacitor storage node 50, as well as along the inner lateral surfaces 49 of the second capacitor storage node. Subsequently, capacitor electrode material 56 is formed along the capacitor dielectric material. The capacitor electrode material 56, capacitor dielectric material 54, first capacitor storage node 42 and second capacitor storage node 50 together define a capacitor 60. The materials 54 and 56 may be formed by any suitable methods (including, for example, chemical vapor deposition, chemical vapor deposition, atomic layer deposition, etc.).

In the shown embodiment, the capacitor electrode material 56 is conformal along dielectric material 54, and leaves gaps 58. Such gaps are filled with material 114 in the shown embodiment. Material 114 may be any suitable material, including, for example, conductively-doped polysilicon, etc.

An example method for forming a construction analogous to that shown in FIG. 2 is described with reference to FIGS. 14-20. Identical numbering will be used to describe FIGS. 14-20 as is used above in describing FIGS. 1, 2 and 5-13, where appropriate.

Figure 14:
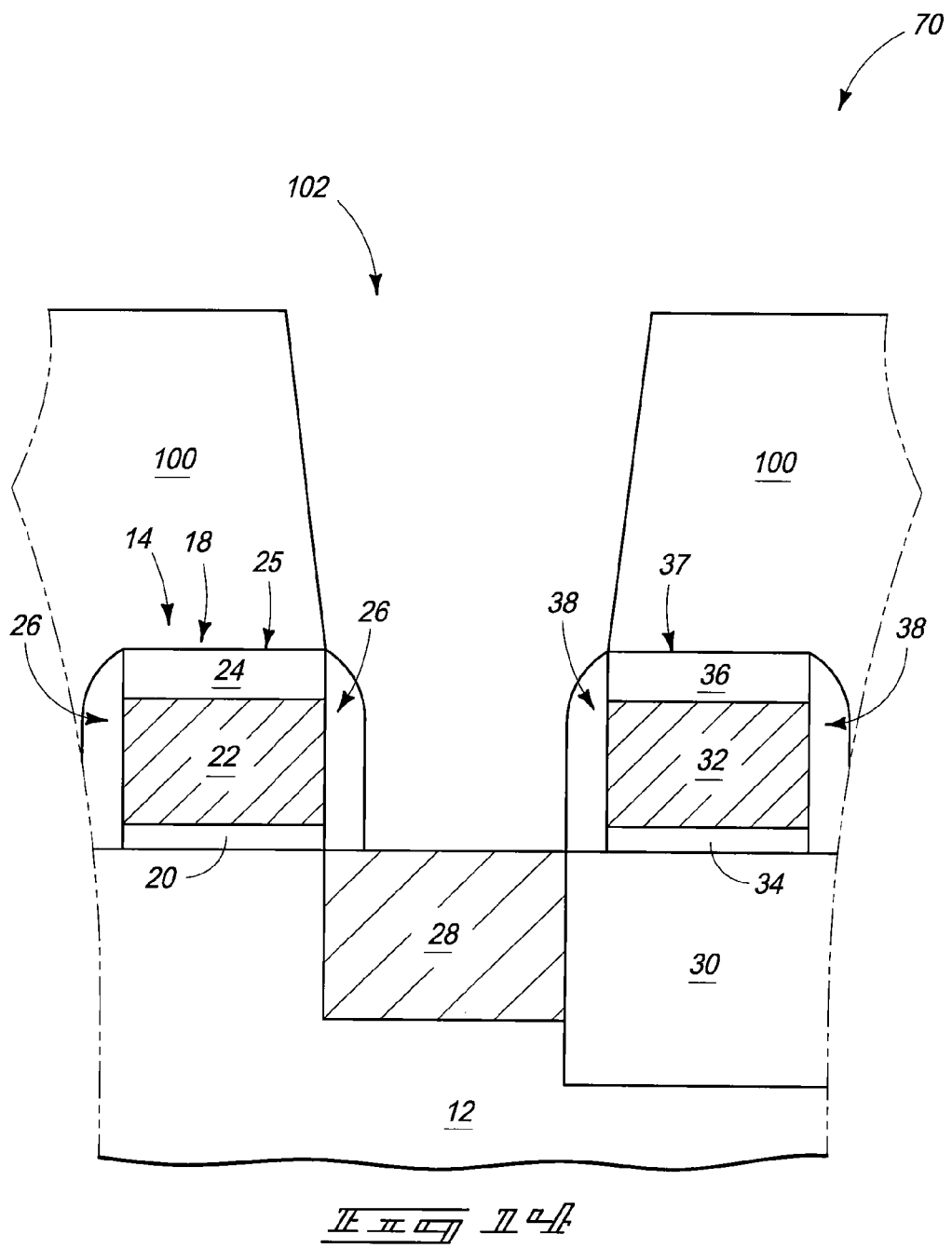

Referring to FIG. 14, construction 70 is illustrated at an early processing stage. The construction includes the gate stack 18 and source/drain region 28 of transistor 14. The construction also includes the insulative region 30, the conductive line 32 extending over such insulative region, and the insulative cap 36 over the conductive line. The gate stack 18 includes the insulative cap 24. The insulative caps 24 and 36 are shown to have uppermost surfaces 25 and 37, respectively; with such uppermost surfaces both being at about the same elevational level over substrate 12.

The first sacrificial material 100 is formed over substrate 12, and over the insulative caps 24 and 36; and the opening 102 is patterned through material 100. However, in contrast to the processing stage of FIG. 5, the opening 102 extends to the upper surface of the source/drain region 28.

Figure 15:
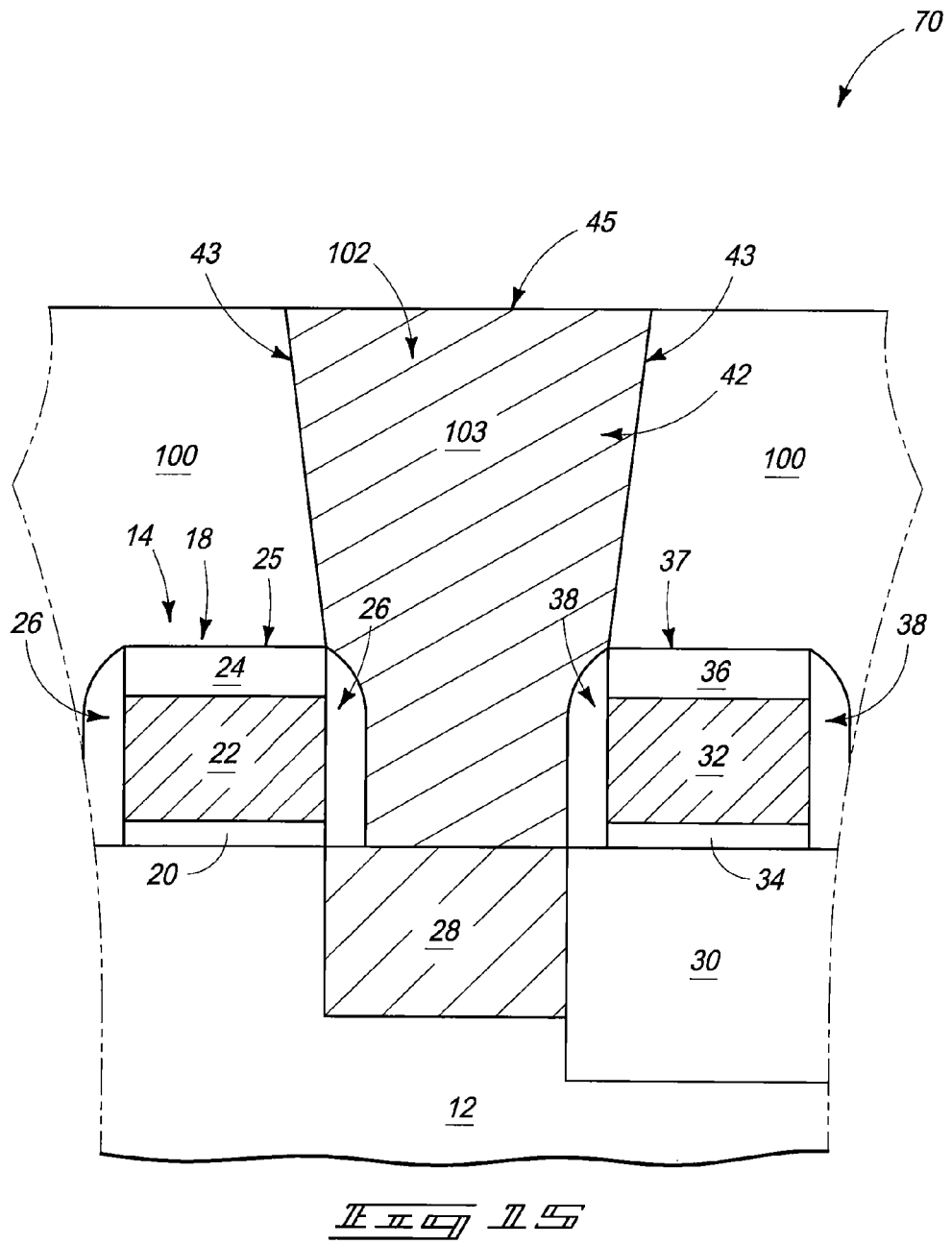

Referring to FIG. 15, the electrically conductive storage node material 103 is formed within opening 102, and is patterned to form the first capacitor storage node 42. The storage node 42 has the upper surface 45, and in the shown embodiment such upper surface is coplanar with upper surfaces of material 100. In other embodiments, the upper surface 45 may not be coplanar with upper surfaces of material 100.

The capacitor storage node 42 has outer lateral surfaces 43 that are along and directly against sacrificial material 100.

Figure 16:
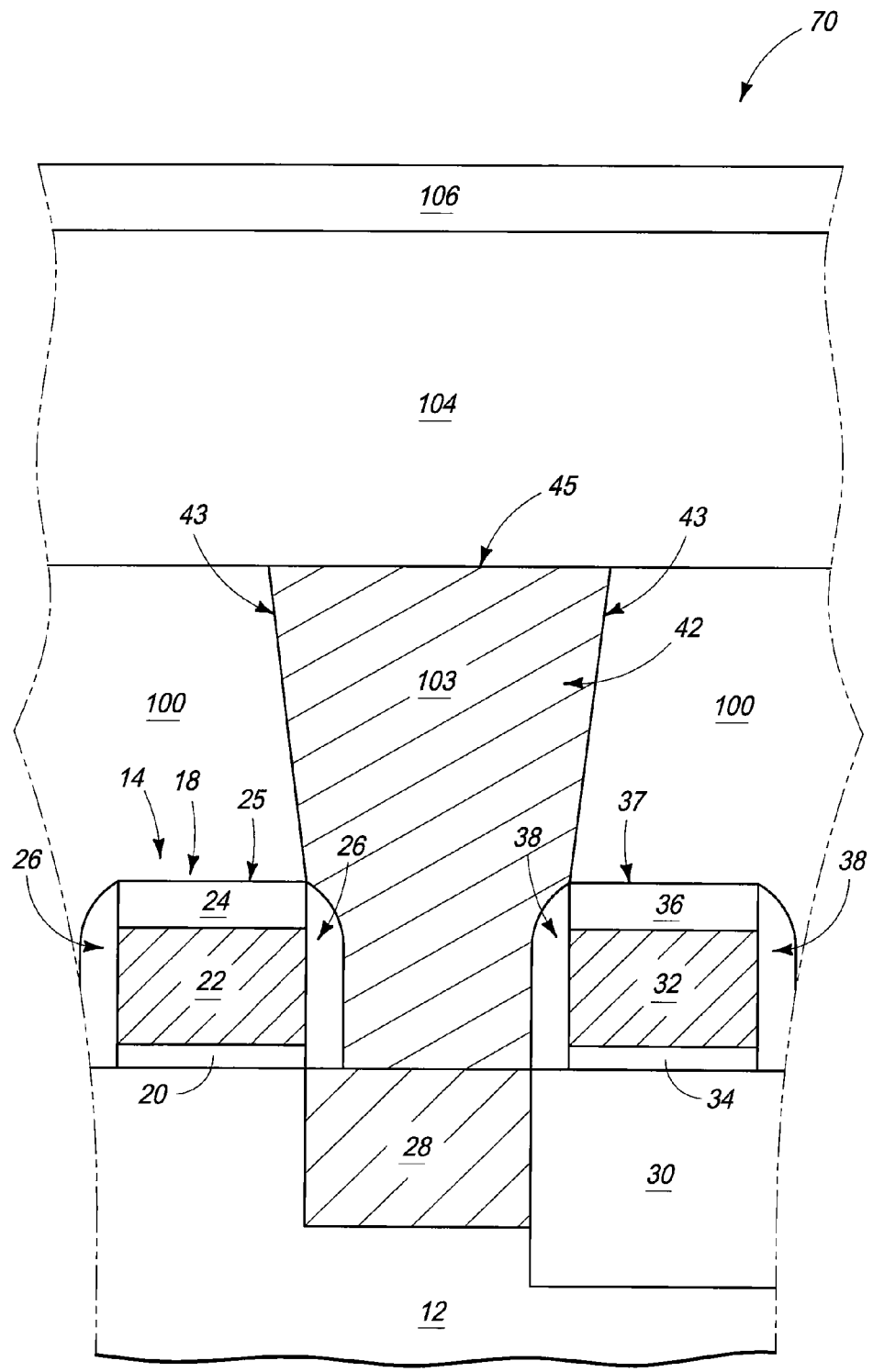

Referring to FIG. 16, the second sacrificial material 104 is formed over the first sacrificial material 100 and over the first storage node 42; and the lattice material 106 is formed over the second sacrificial material.

Referring to FIG. 17, an opening 110 is formed to extend through lattice material 106 and sacrificial material 104. The opening may be patterned and formed with the processing discussed above with reference to FIGS. 8 and 9.

The formation of the opening 110 patterns lattice material 106 into lattice structure 52.

Figure 18:
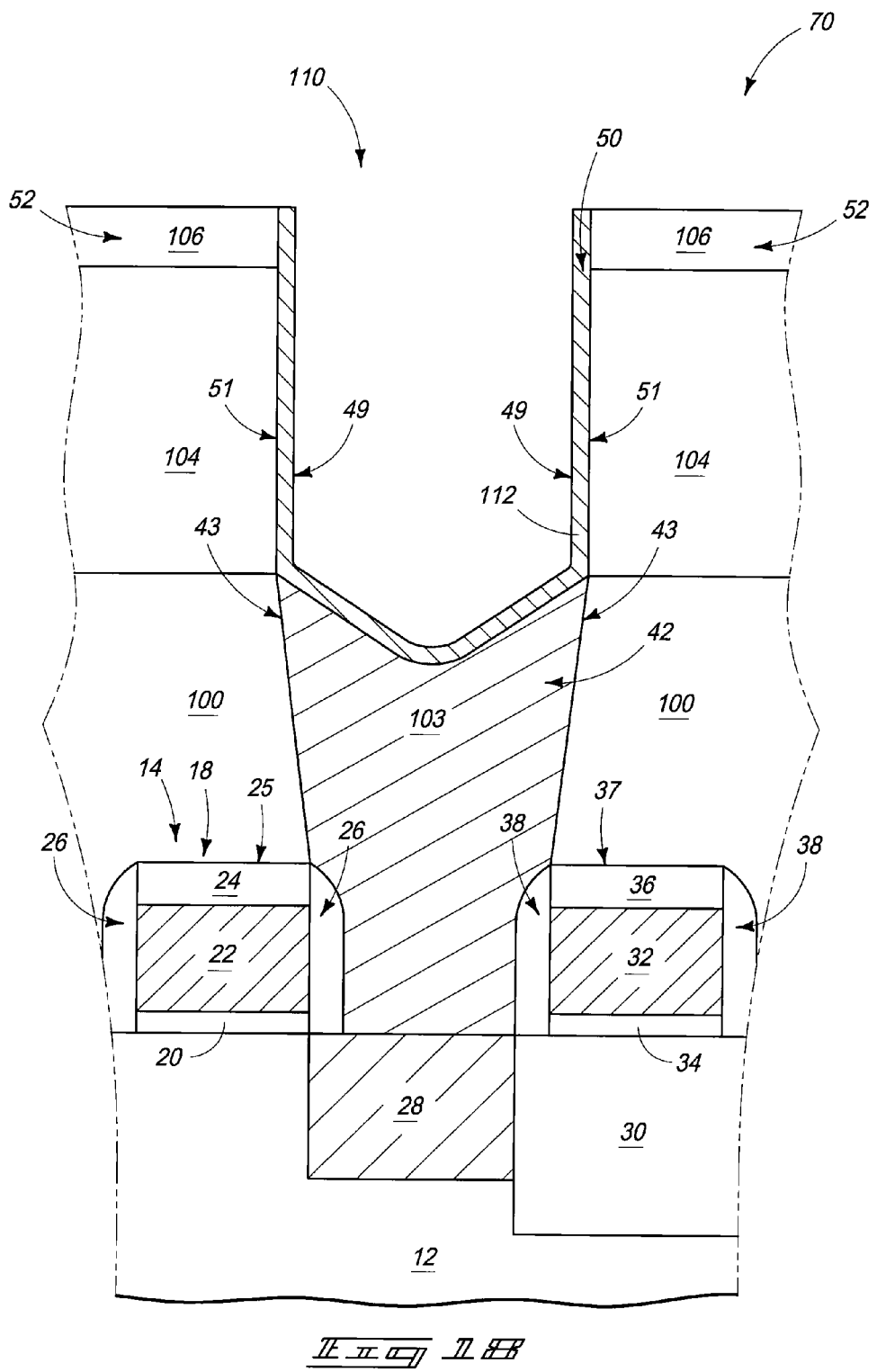

Referring to FIG. 18, the conductive material 112 is formed within opening 110 and over lattice material 106, and is patterned into the second capacitor storage node 50. The capacitor storage node 50 has inner lateral surfaces 49 and outer lateral surfaces 51. The outer lateral surfaces 51 are along and directly against the sacrificial material 104.

Figure 19:
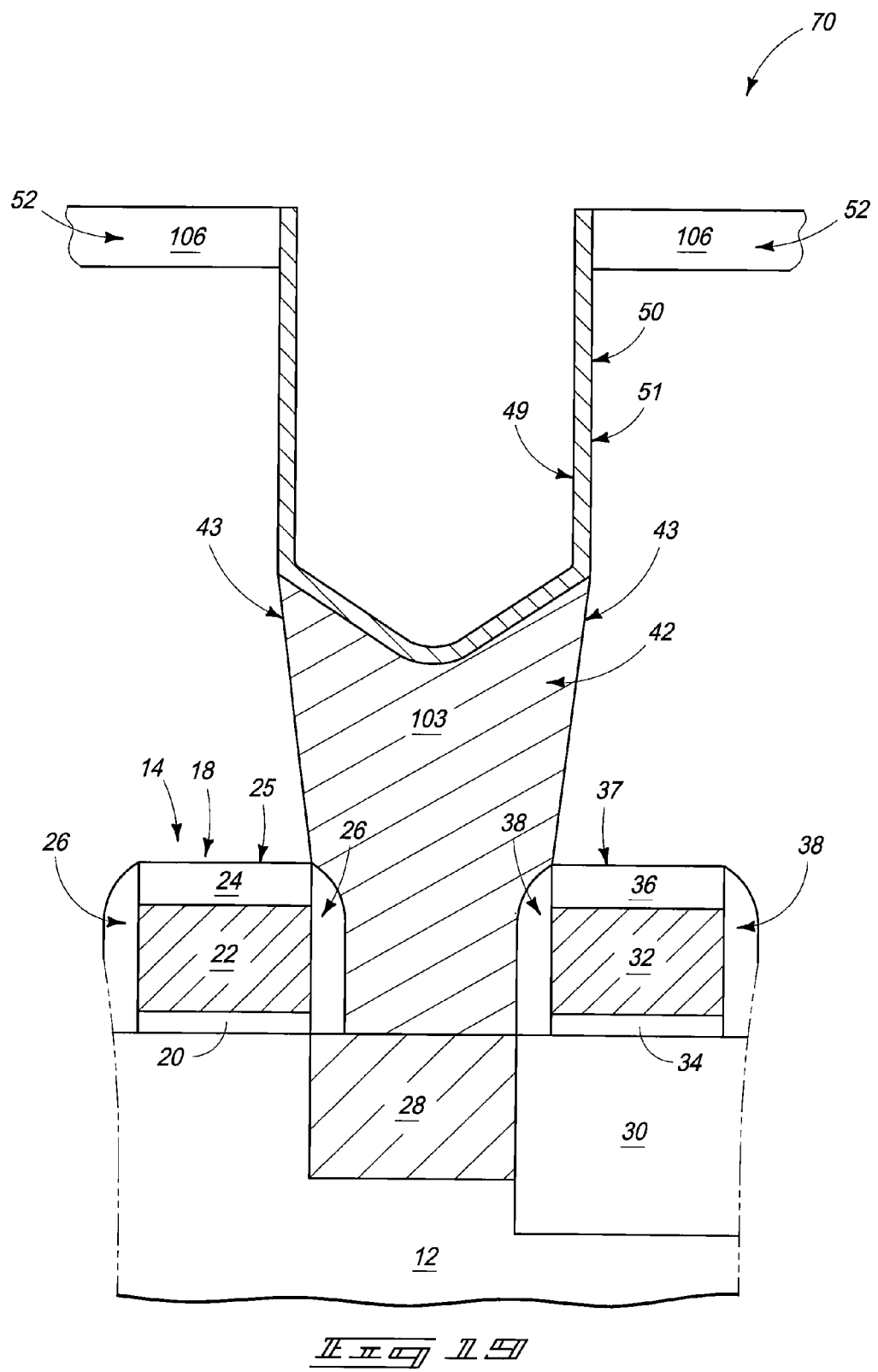

Referring to FIG. 19, sacrificial materials 100 and 104 (FIG. 18) are removed. Such removal exposes the outer lateral surfaces 43 of the first capacitor storage node 42, and also exposes the outer lateral surfaces 51 of the second capacitor storage node 50. Materials 100 and 104 may be removed with processing analogous to that discussed above with reference to FIG. 12.

Figure 20:
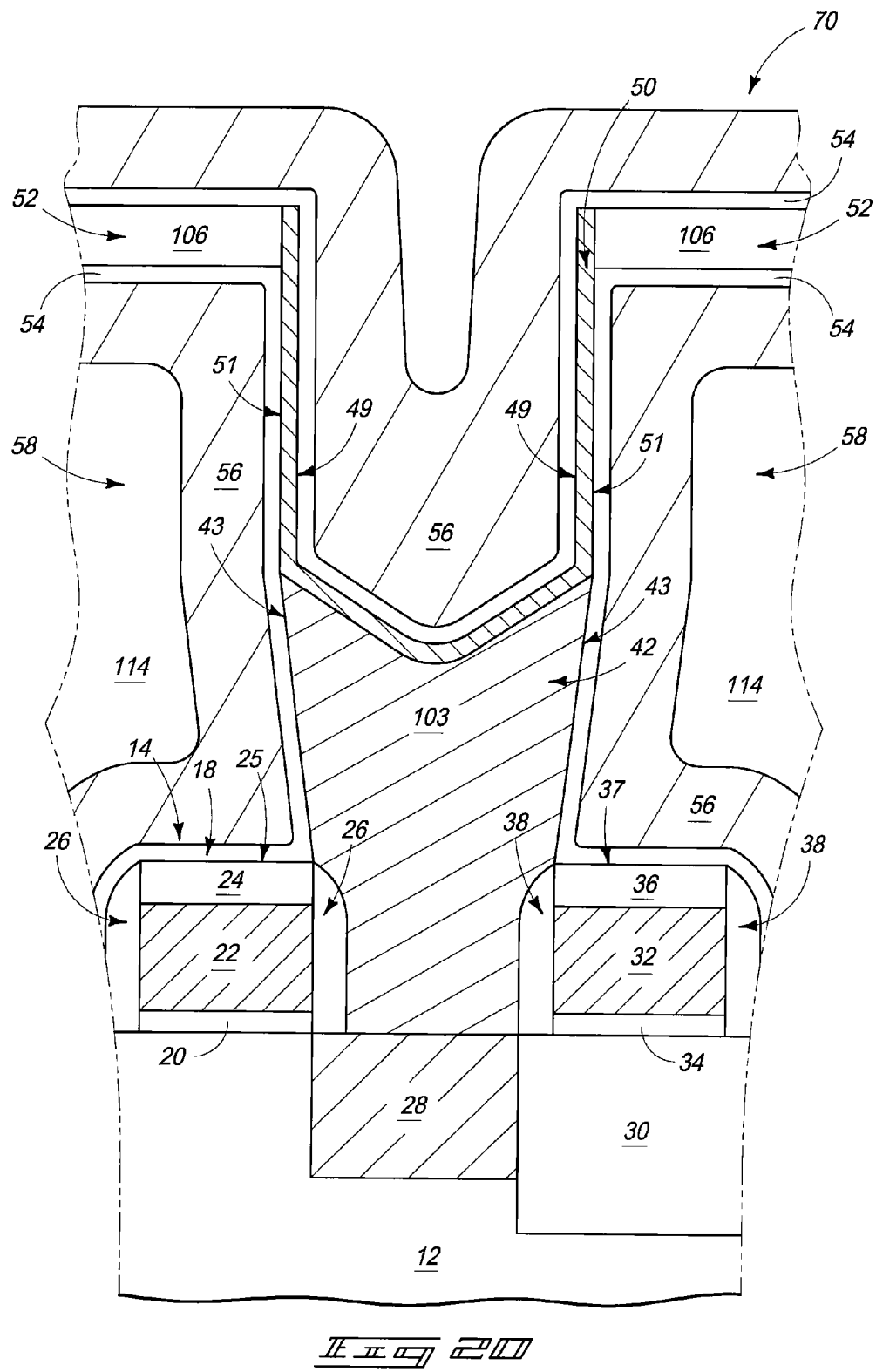

Referring to FIG. 20, capacitor dielectric material 54 is formed along the outer lateral surfaces 43 of the first capacitor storage node 42, and along the outer lateral surfaces 51 of the second capacitor storage node 50, as well as along the inner lateral surfaces 49 of the second capacitor storage node. Subsequently, capacitor electrode material 56 is formed along the capacitor dielectric material, and the material 114 is formed within the gaps 58 left by the capacitor electrode material.

The capacitor electrode material 56, capacitor dielectric material 54, first capacitor storage node 42 and second capacitor storage node 50 together define a capacitor.

An example method for forming a construction analogous to that shown in FIG. 3 is described with reference to FIGS. 21-28. Identical numbering will be used to describe FIGS. 21-28 as is used above in describing FIGS. 1, 3 and 5-13, where appropriate.

Figure 21:
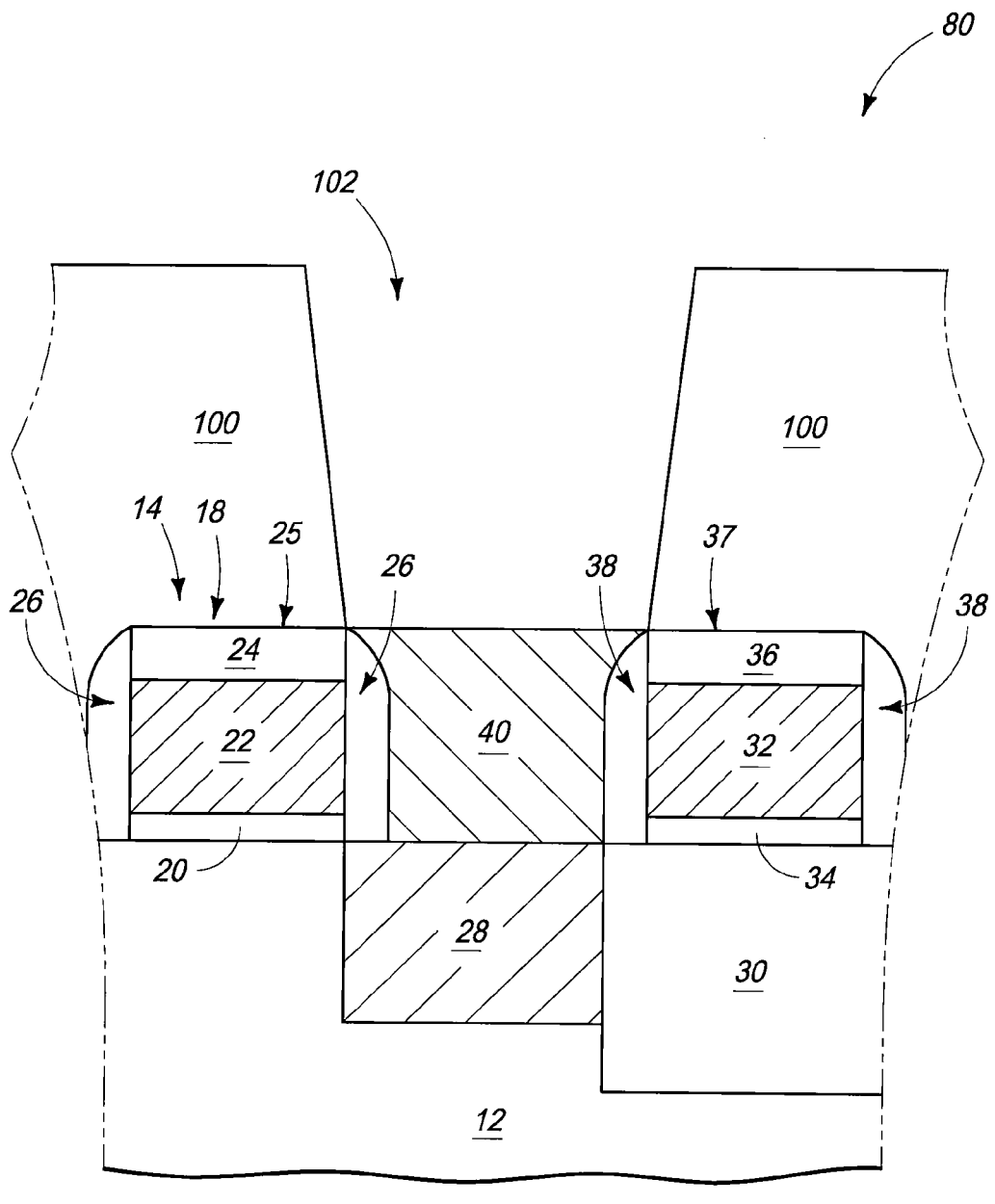

Referring to FIG. 21, construction 80 is illustrated at an early processing stage identical to that discussed above with reference to FIG. 5.

Figure 22:
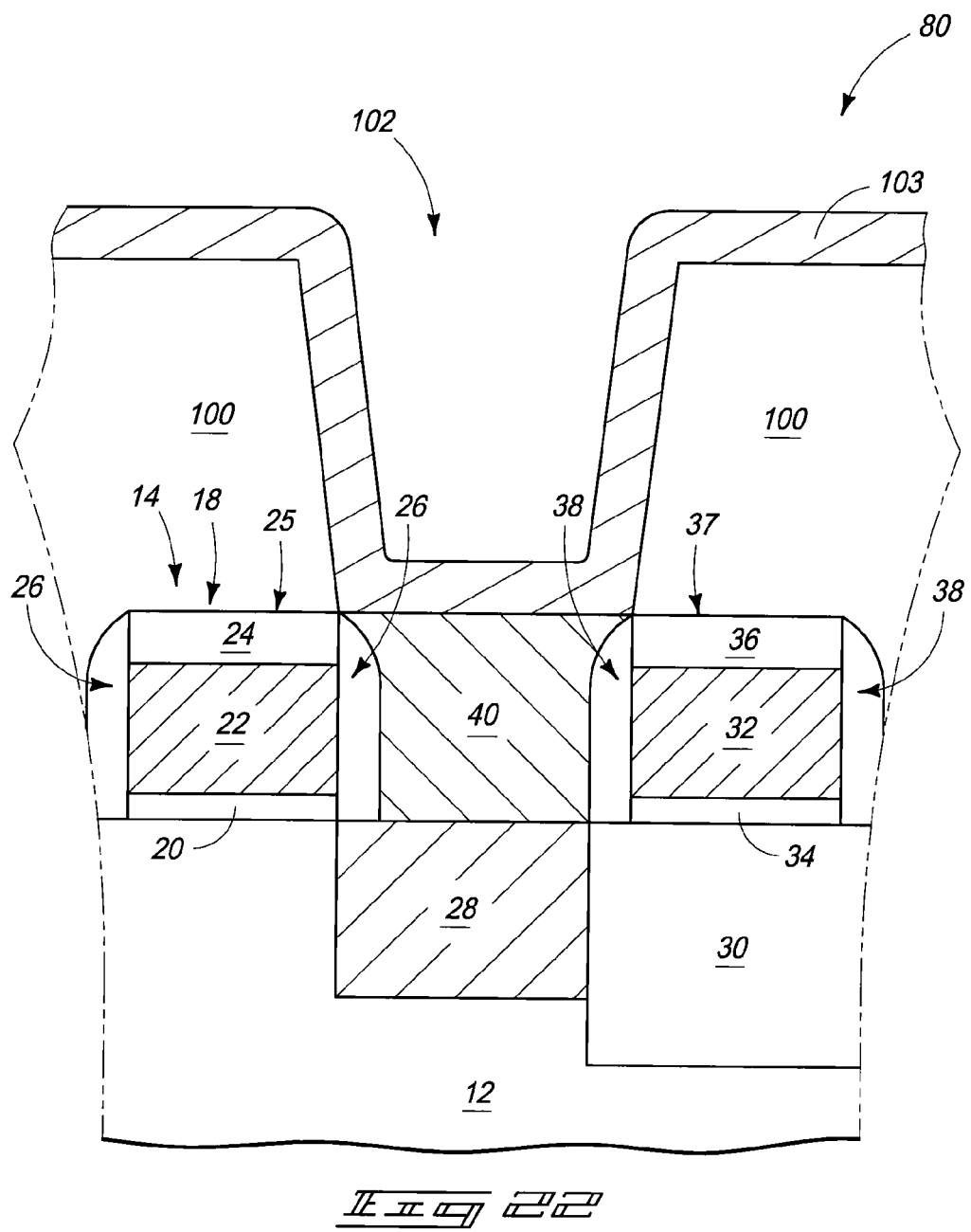

Referring to FIG. 22, the electrically conductive storage node material 103 is formed over material 100 and within opening 102. The storage node material 103 only partially fills the opening 102 to define a container structure.

Figure 23:
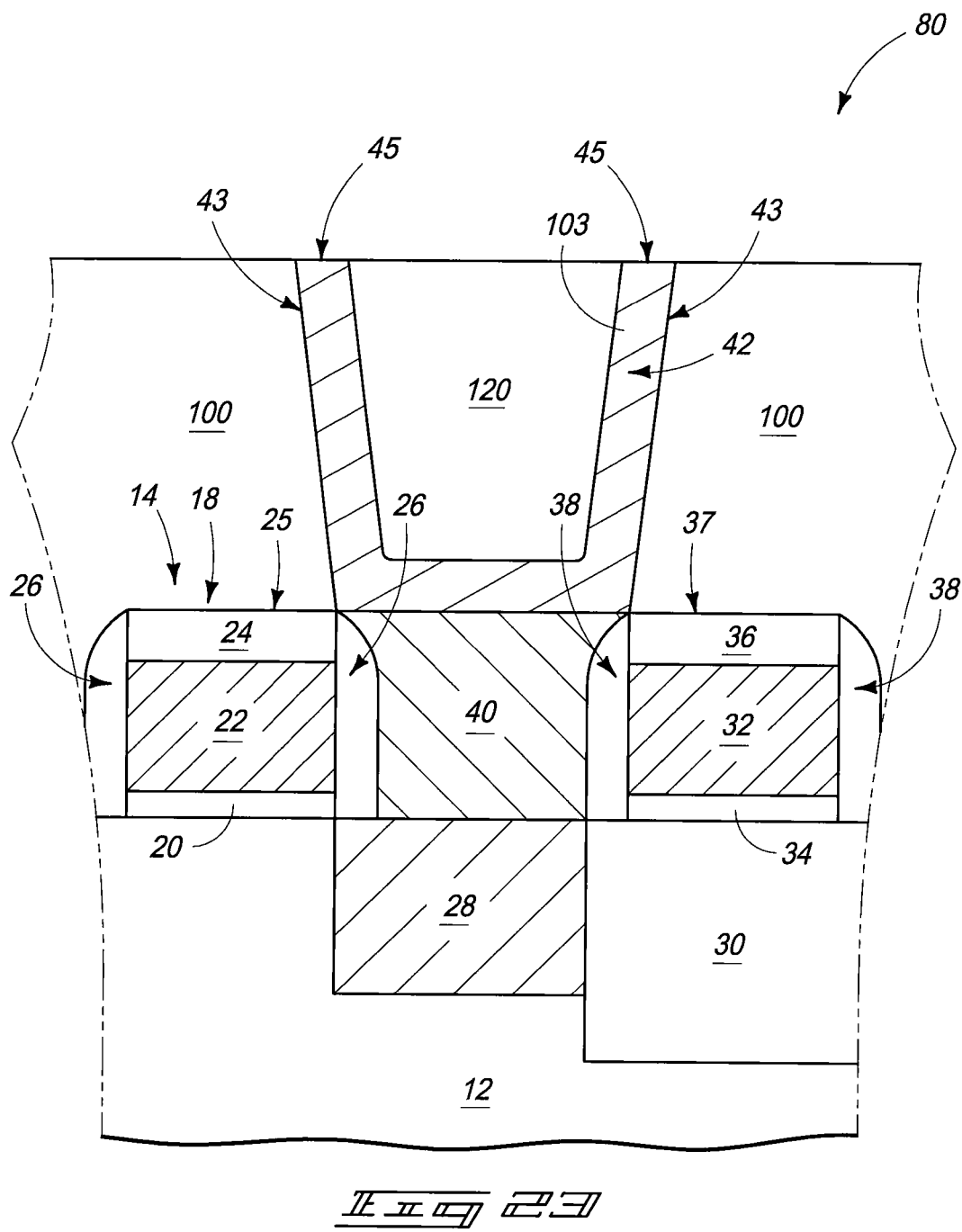

Referring to FIG. 23, a fill material 120 is provided within the container structure defined by the storage node material 103, and subsequently the material 103 is removed from over material 100 by CMP. The removal of storage node material 103 from over material 100 patterns the storage node material remaining within opening 102 into a container-type first capacitor storage node 42. The storage node 42 has an upper surface 45 that is coplanar with upper surfaces of material 100. The capacitor storage node 42 also has outer lateral surfaces 43 that are along and directly against sacrificial material 100.

The fill material 120 utilized during the CMP may be any suitable material. In some embodiments, the fill material may be a doped silicate glass.

Figure 24:
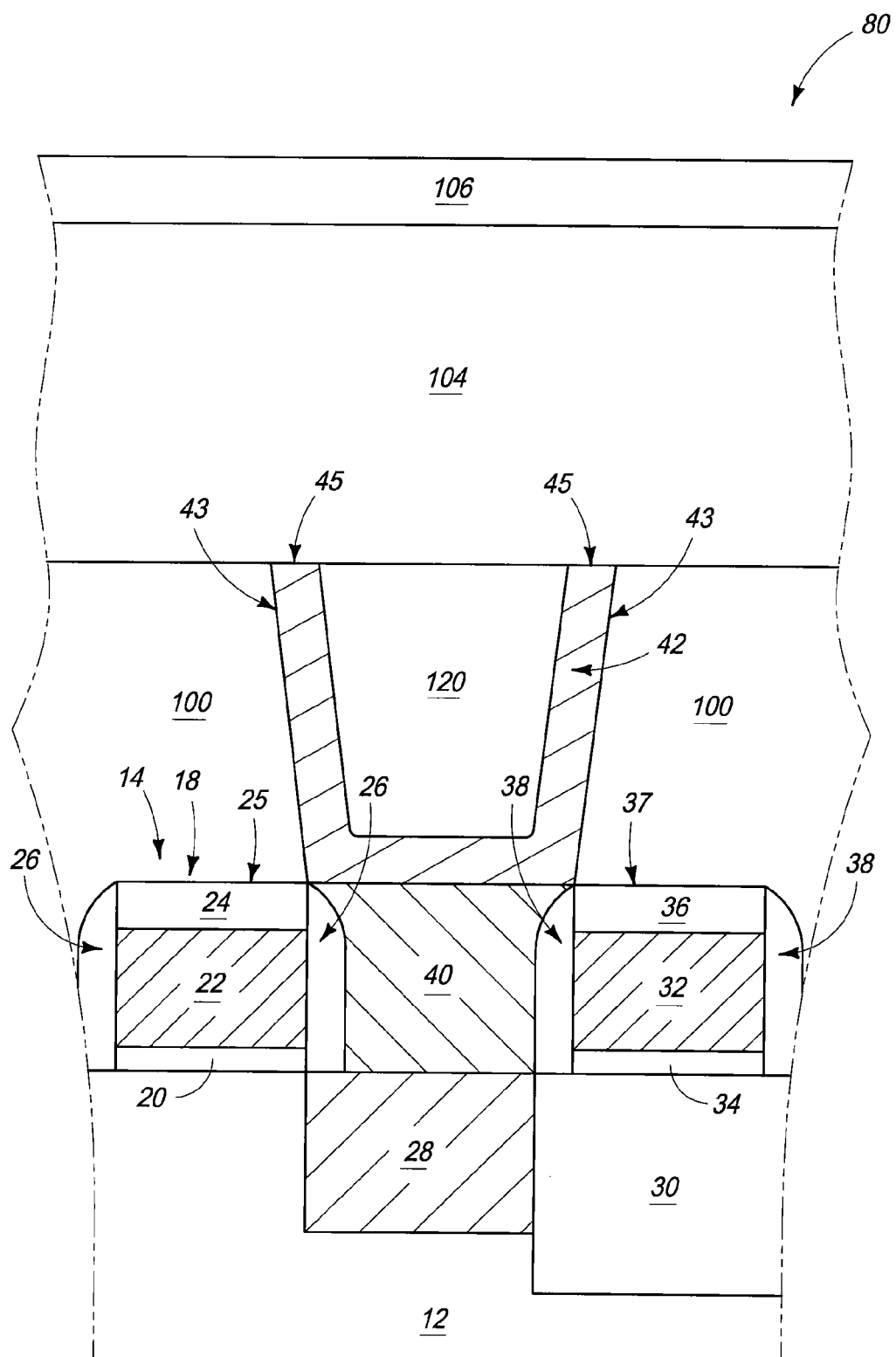

Referring to FIG. 24, the second sacrificial material 104 is formed over the first sacrificial material 100 and over the first storage node 42; and the lattice material 106 is formed over the second sacrificial material.

Referring to FIG. 25, an opening 110 is formed to extend through lattice material 106 and sacrificial material 104. The opening may be patterned and fowled with the processing discussed above with reference to FIGS. 8 and 9. In the shown embodiment, the opening 110 is extended into the container-type storage node 42 by removing the fill material 120 (FIG. 24) from within the container-type storage node. If the fill material 120 comprises the same composition as sacrificial material 104, the same etching chemistry utilized to extend opening 110 through material 104 can be utilized to remove the fill material from within container-type storage node 42.

The formation of the opening 110 patterns lattice material 106 into lattice structure 52.

Figure 26:
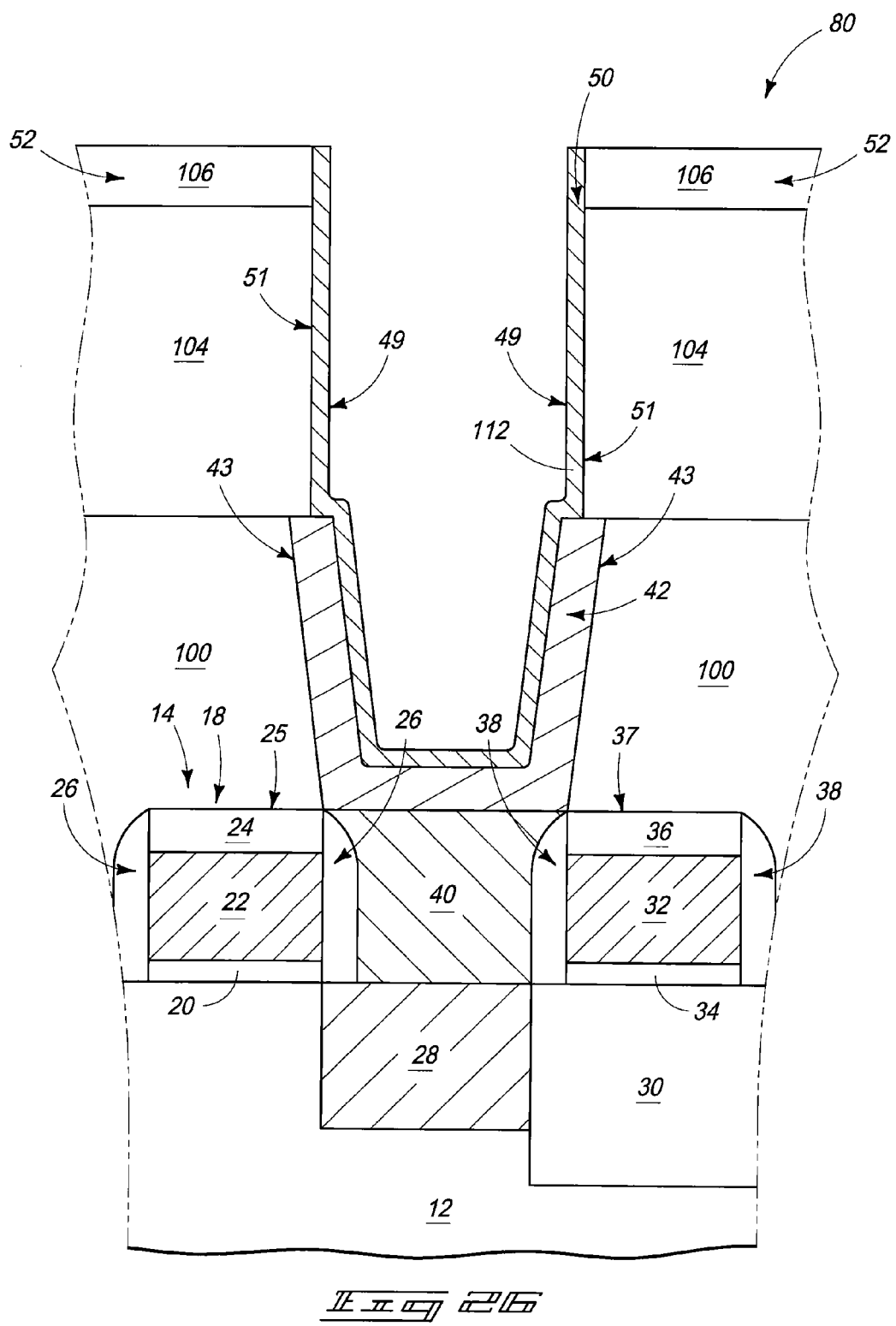

Referring to FIG. 26, the conductive material 112 is formed within opening 110, and is patterned into the second capacitor storage node 50. The capacitor storage node 50 has inner lateral surfaces 49 and outer lateral surfaces 51. The outer lateral surfaces 51 are along and directly against the sacrificial material 104.

Figure 27:
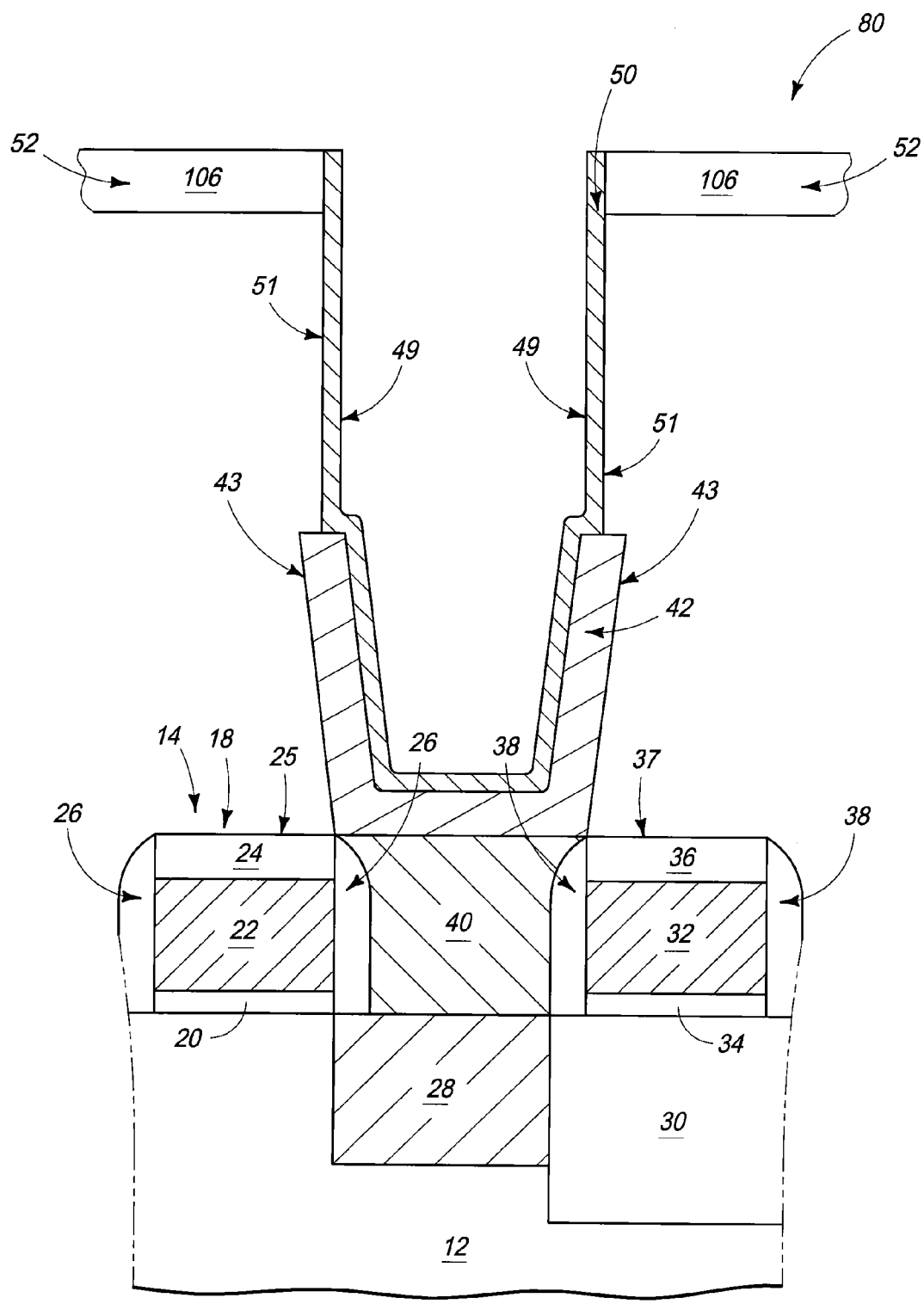

Referring to FIG. 27, sacrificial materials 100 and 104 (FIG. 26) are removed. Such removal exposes the outer lateral surfaces 43 of the first capacitor storage node 42, and also exposes the outer lateral surfaces 51 of the second capacitor storage node 50.

Figure 28:
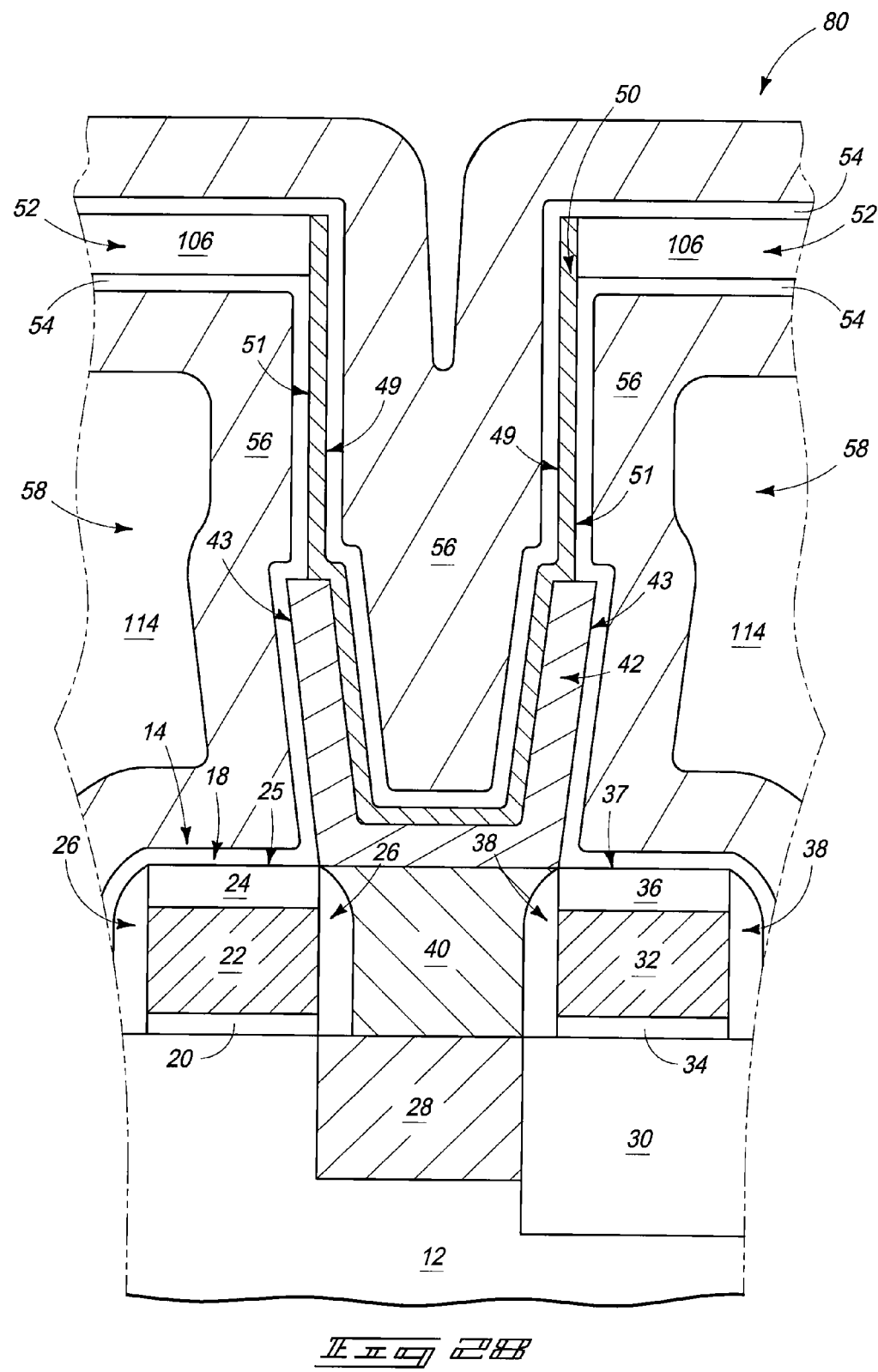

Referring to FIG. 28, capacitor dielectric material 54 is formed along the outer lateral surfaces 43 of the first capacitor storage node 42, and along the outer lateral surfaces 51 of the second capacitor storage node 50, as well as along the inner lateral surfaces 49 of the second capacitor storage node. Subsequently, capacitor electrode material 56 is formed along the capacitor dielectric material, and the material 114 is formed within the gaps 58 left by the capacitor electrode material.

The capacitor electrode material 56, capacitor dielectric material 54, first capacitor storage node 42 and second capacitor storage node 50 together define a capacitor.

An example method for forming a construction analogous to that shown in FIG. 4 is described with reference to FIGS. 29-36. Identical numbering will be used to describe FIGS. 29-36 as is used above in describing FIGS. 1, 4 and 5-13, where appropriate.

Figure 29:
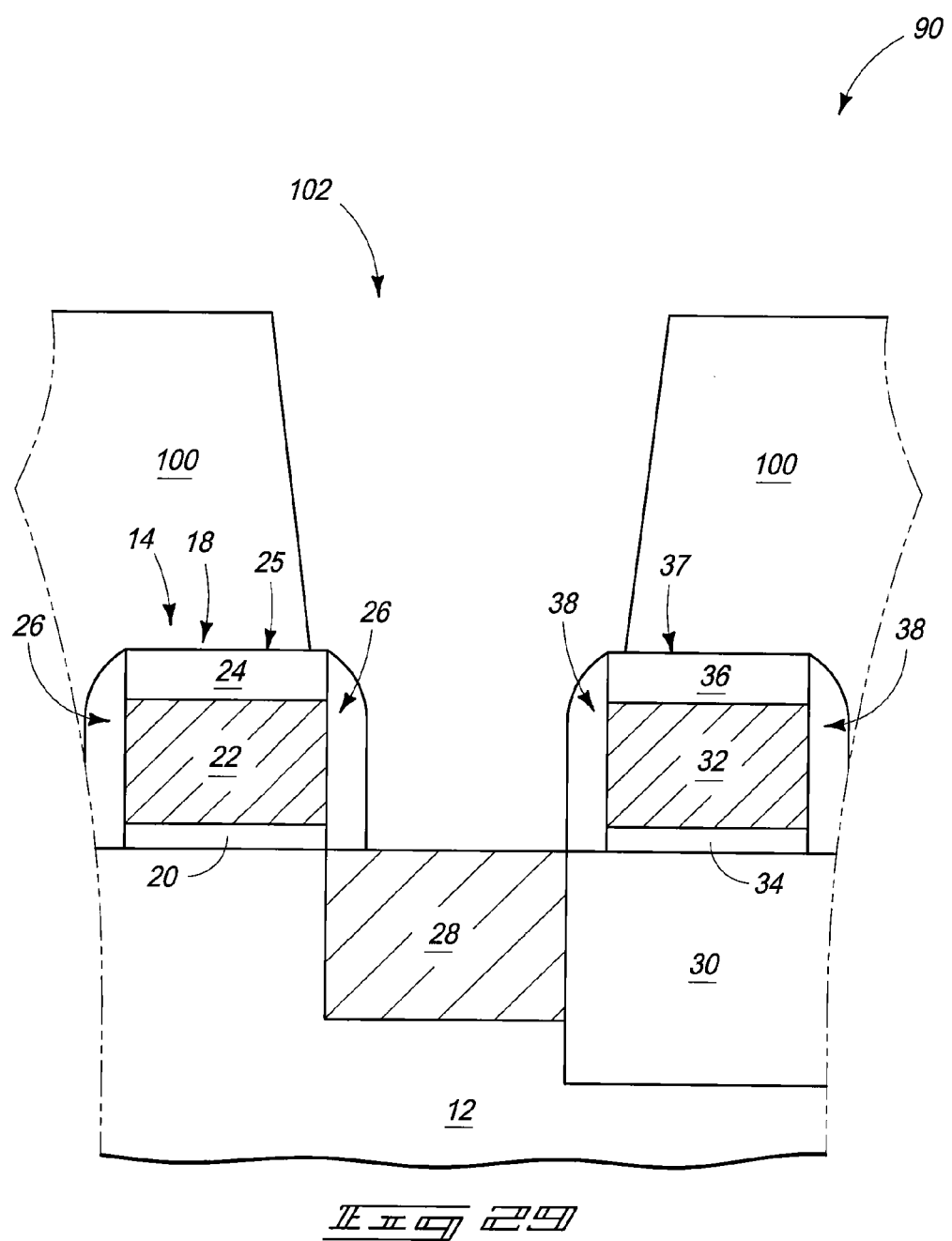

Referring to FIG. 29, construction 90 is illustrated at an early processing stage identical to that discussed above with reference to FIG. 14.

Figure 30:
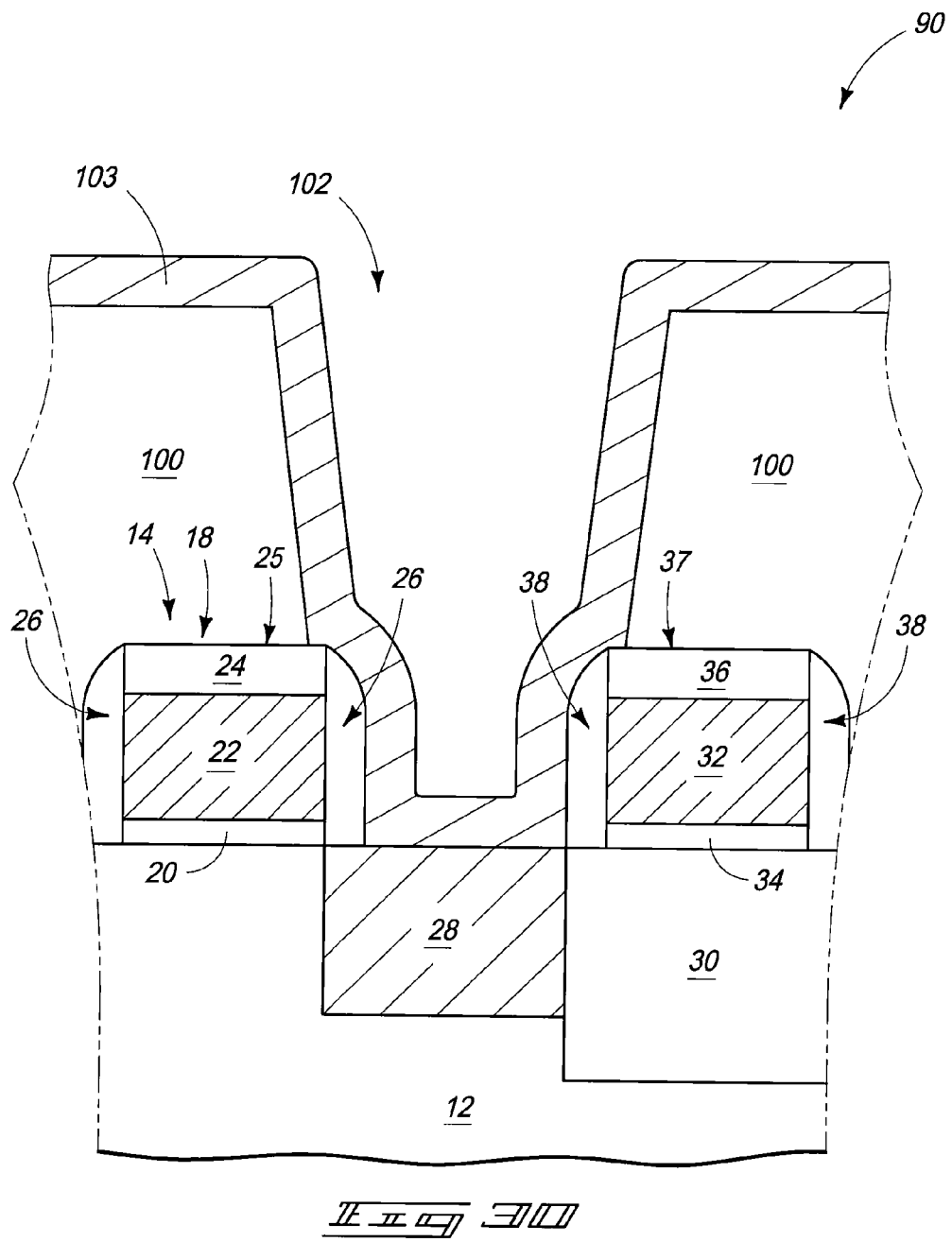

Referring to FIG. 30, the electrically conductive storage node material 103 is formed over material 100 and within opening 102. The storage node material 103 only partially fills the opening 102 to define a container structure.

Figure 31:
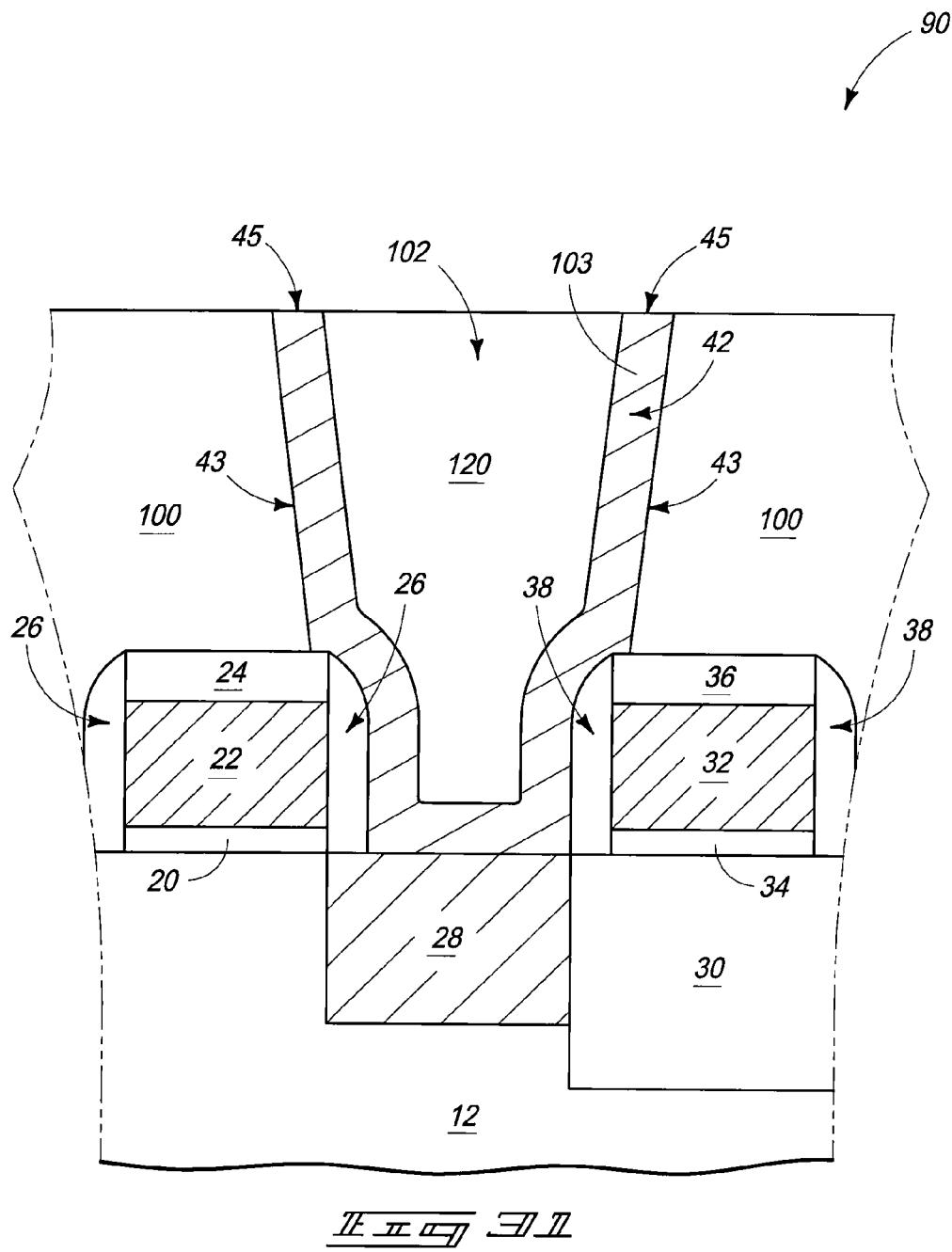

Referring to FIG. 31, fill material 120 is provided within the container structure defined by the storage node material 103, and subsequently the material 103 is removed from over material 100 by CMP. The removal of storage node material 103 from over material 100 patterns the storage node material remaining within opening 102 into a container-type first capacitor storage node 42. The storage node 42 has an upper surface 45 that is coplanar with upper surfaces of material 100. The capacitor storage node 42 also has outer lateral surfaces 43 that are along and directly against sacrificial material 100.

The fill material 120 utilized during the CMP may be any suitable material. In some embodiments, the fill material may be a doped silicate glass.

Figure 32:
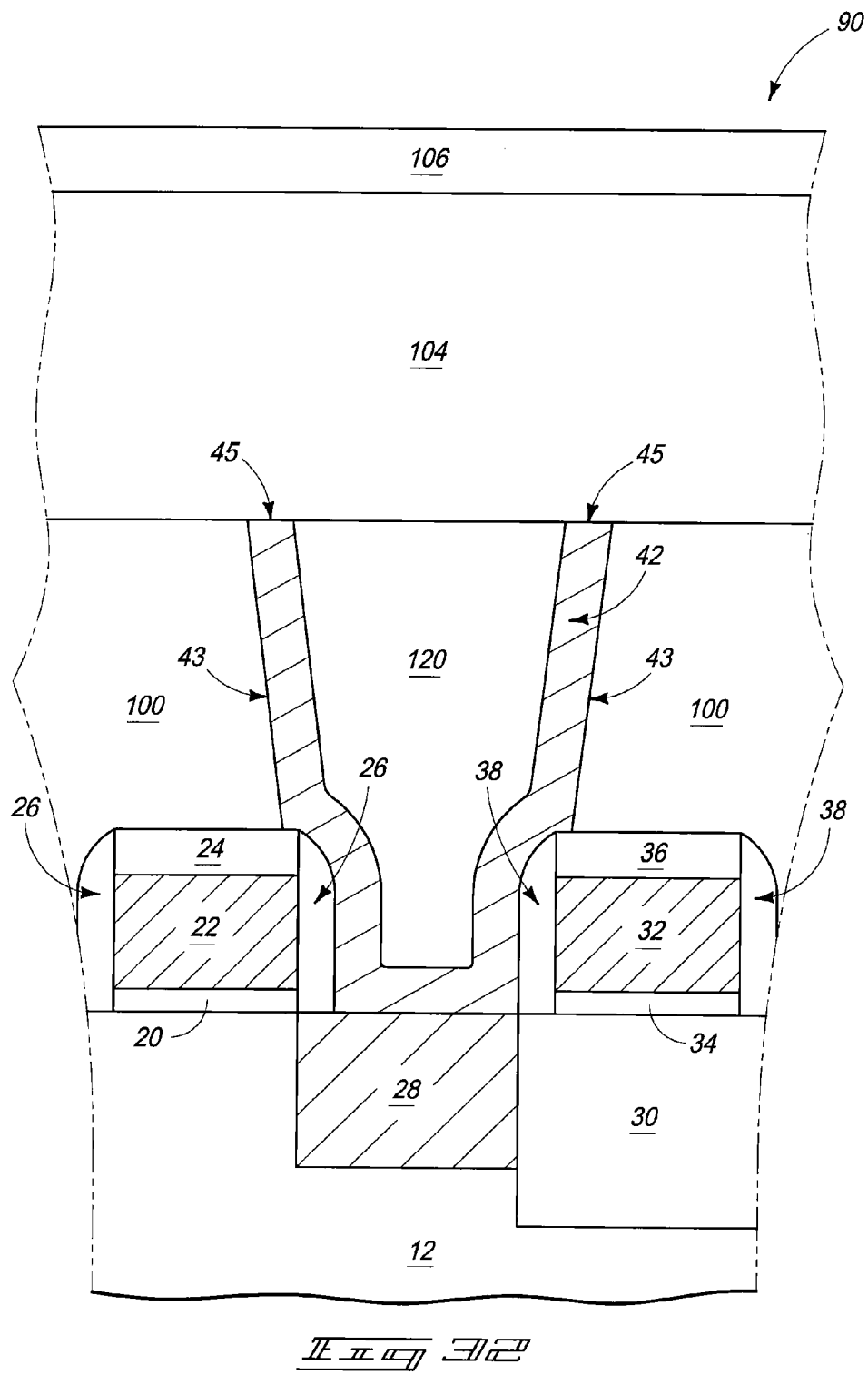

Referring to FIG. 32, the second sacrificial material 104 is formed over the first sacrificial material 100 and over the first storage node 42; and the lattice material 106 is formed over the second sacrificial material.

Figure 33:
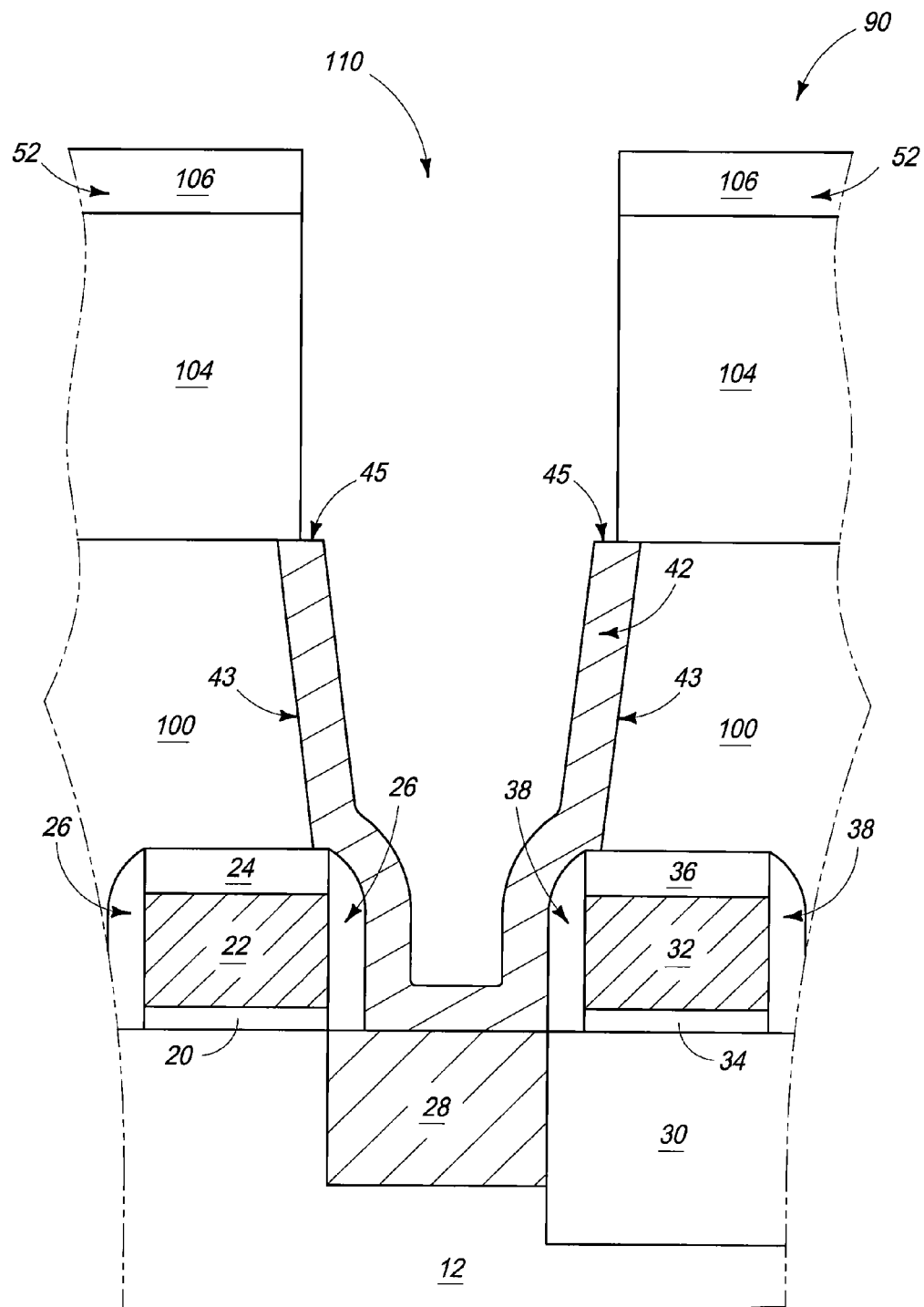

Referring to FIG. 33, the opening 110 is formed to extend through lattice material 106 and sacrificial material 104. The opening may be patterned and formed with the processing discussed above with reference to FIGS. 8 and 9. In the shown embodiment, the opening 110 is extended into the container-type storage node 42 by removing the fill material 120 (FIG. 24) from within the container-type storage node. If the fill material 120 comprises the same composition as sacrificial material 104, the same etching chemistry utilized to extend opening 110 through material 104 can be utilized to remove the fill material from within container-type storage node 42.

The formation of the opening 110 patterns lattice material 106 into lattice structure 52.

Figure 34:
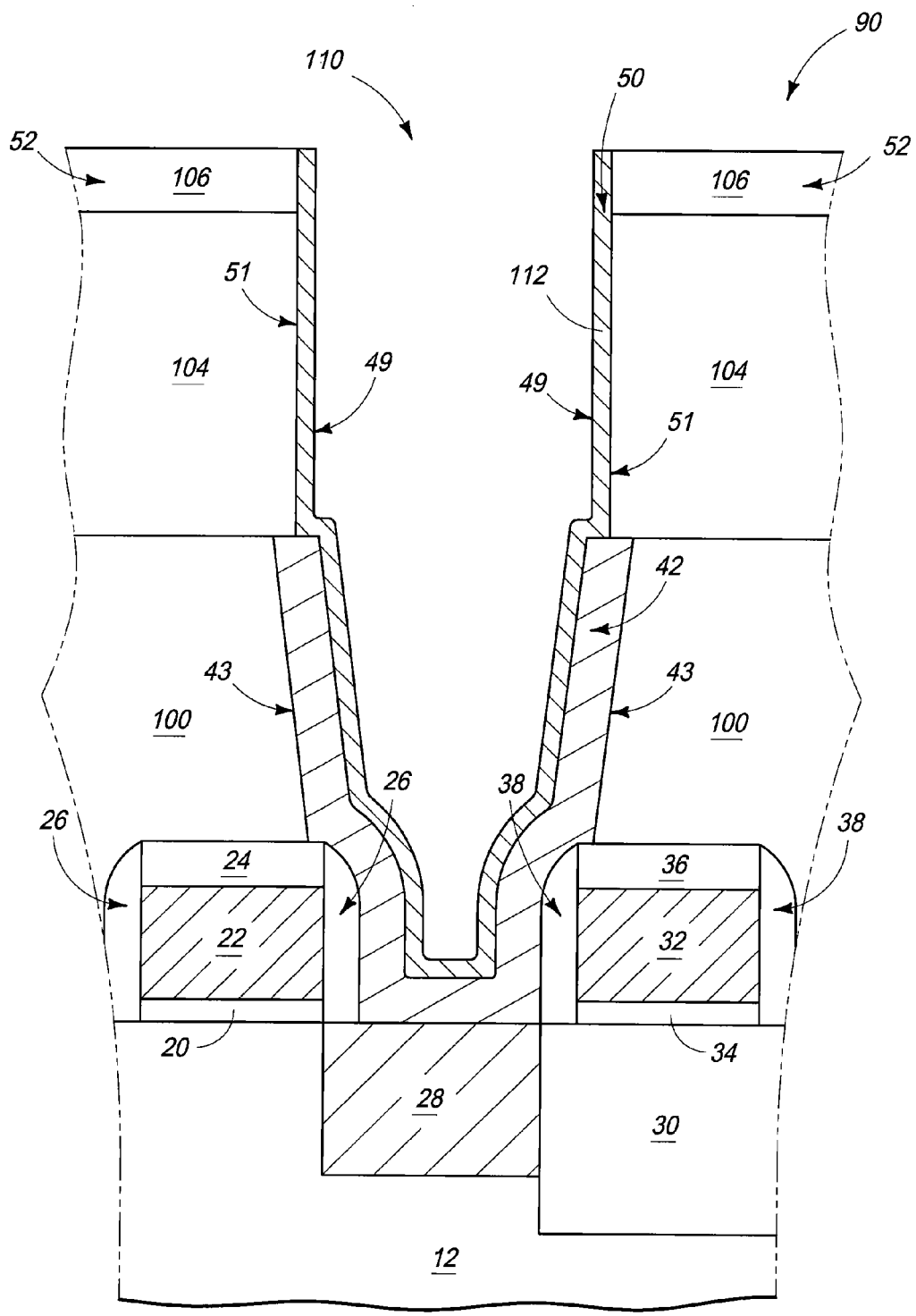

Referring to FIG. 34, the conductive material 112 is formed within opening 110, and is patterned into the second capacitor storage node 50. The capacitor storage node 50 has inner lateral surfaces 49 and outer lateral surfaces 51. The outer lateral surfaces 51 are along and directly against the sacrificial material 104.

Figure 35:
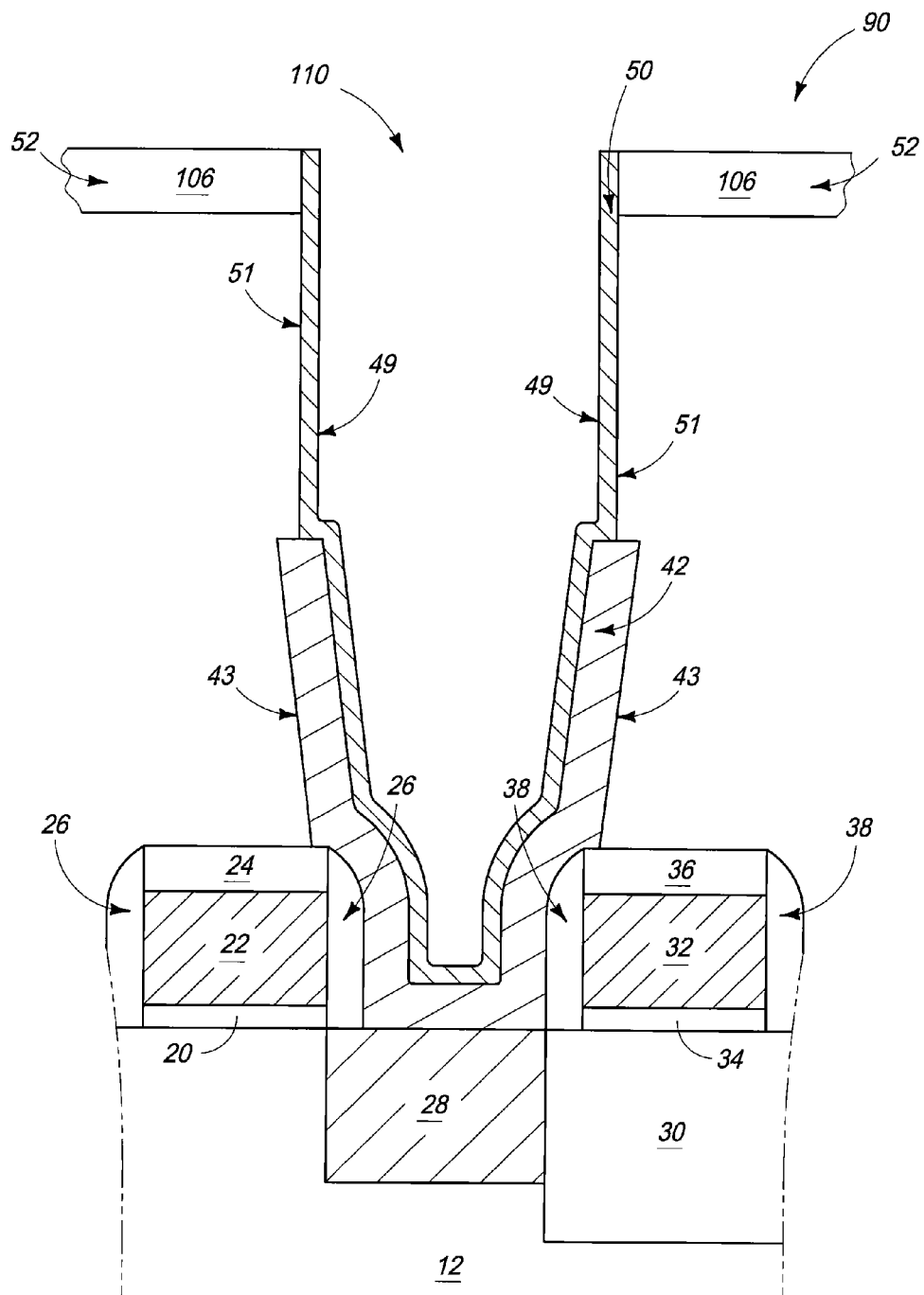
Figure 316:
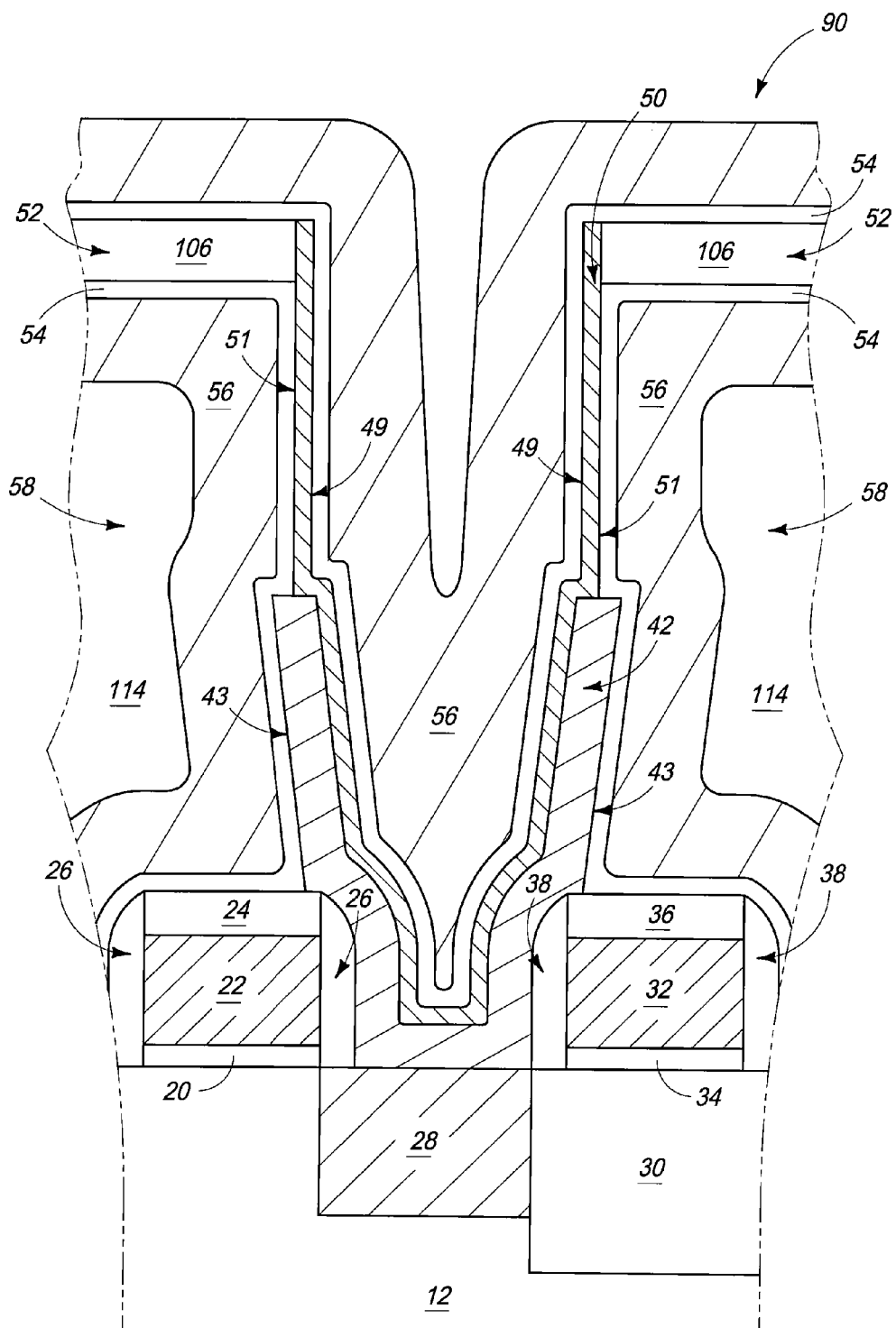

Referring to FIG. 35, sacrificial materials 100 and 104 (FIG. 26) are removed. Such removal exposes the outer lateral surfaces 43 of the first capacitor storage node 42, and also exposes the outer lateral surfaces 51 of the second capacitor storage node 50.

Referring to FIG. 36, capacitor dielectric material 54 is formed along the outer lateral surfaces 43 of the first capacitor storage node 42, and along the outer lateral surfaces 51 of the second capacitor storage node 50, as well as along the inner lateral surfaces 49 of the second capacitor storage node. Subsequently, capacitor electrode material 56 is formed along the capacitor dielectric material, and the material 114 is formed within the gaps 58 left by the capacitor electrode material.

The capacitor electrode material 56, capacitor dielectric material 54, first capacitor storage node 42 and second capacitor storage node 50 together define a capacitor.

The embodiments of FIGS. 5-36 show applications in which the second, or upper, capacitor storage node 50 is perfectly aligned with the first, or lower, capacitor storage node 42. However, an advantage of the processing described herein is that reasonable connection may be achieved between the upper capacitor storage node and the lower capacitor storage node even if there is some misalignment of the upper capacitor storage node to the lower capacitor storage node. FIGS. 37-44 illustrate example embodiments in which an upper capacitor storage node is misaligned relative to a lower capacitor storage node.

Figure 37:
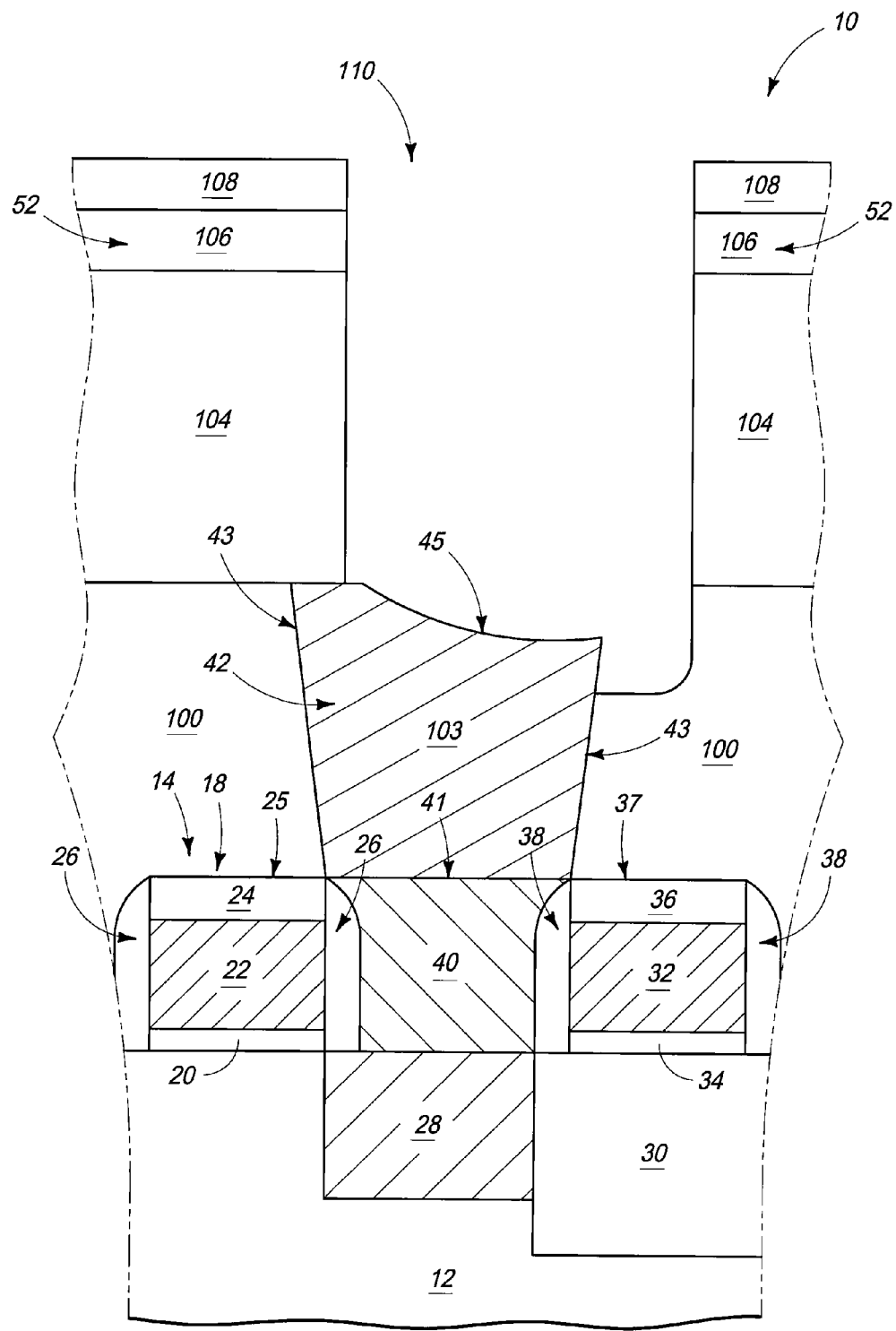
FIGS. 37-39 are diagrammatic, cross-sectional views of a portion of semiconductor construction shown at various process stages of another example embodiment method of forming a DRAM unit cell. The processing stage of FIG. 37 can follow that of FIG. 7.

Referring to FIG. 37, the construction 10 discussed above with reference to FIGS. 5-13 is shown at a processing stage subsequent to that of FIG. 7. The processing stage of FIG. 37 is analogous to that of FIG. 9, but differs from FIG. 9 in that the opening 110 is misaligned relative to an upper surface 45 of the first capacitor storage node 42. Thus, opening 110 is offset relative to the first capacitor storage node and extends along one of the outer lateral surfaces 43 of the first capacitor storage node. The opening may extend partially along the outer lateral surface 43 (as shown) or may extend entirely along the outer lateral surface 43 in other embodiments.

Figure 38:
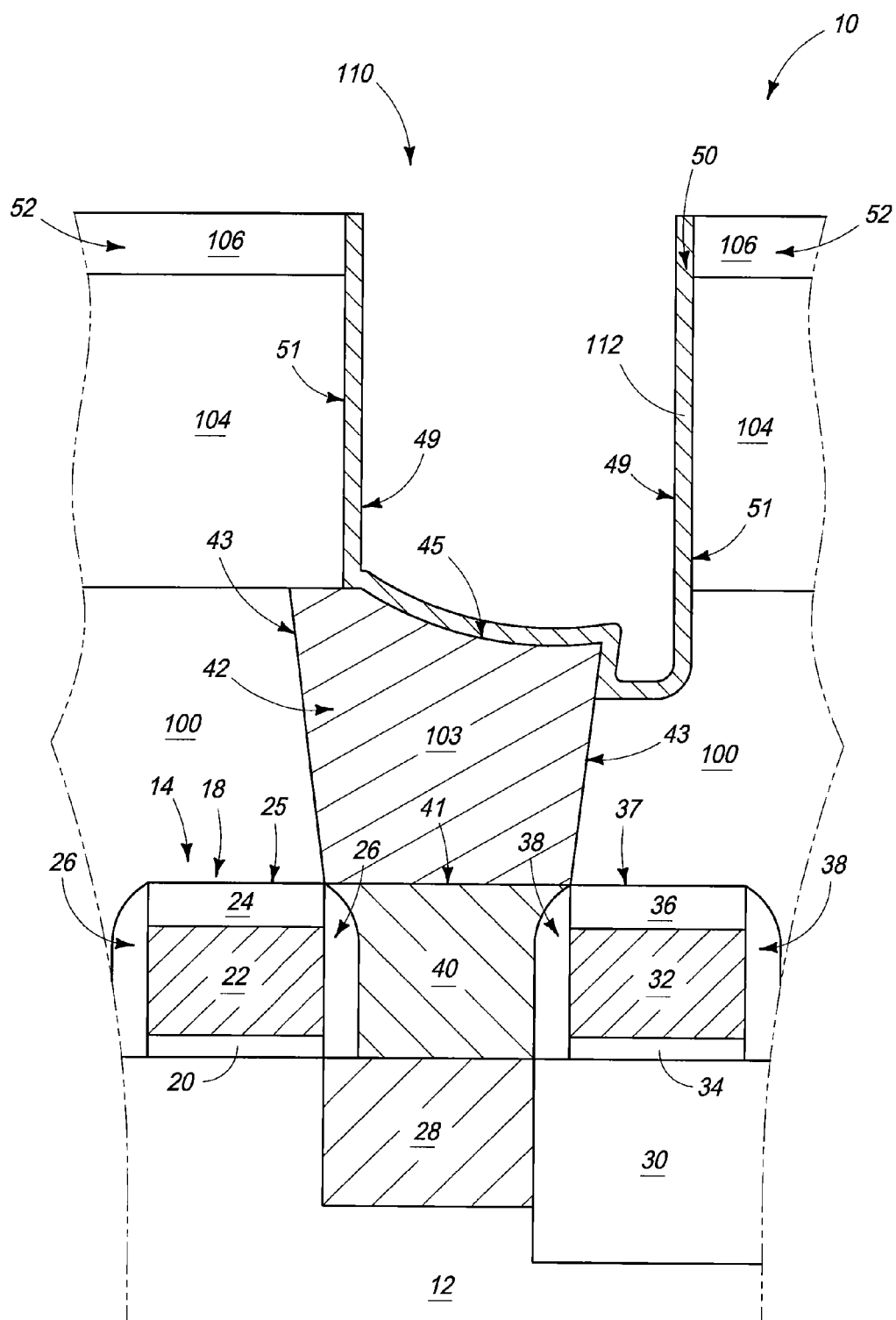

Referring to FIG. 38, masking material 108 (FIG. 37) is removed, and subsequently conductive material 112 is formed within opening 110. The conductive material 112 is patterned into the second capacitor storage node 50. The patterning of the conductive material 112 into the second capacitor storage node 50 may comprise the processing discussed above with reference to FIGS. 10 and 11.

The capacitor storage node 50 has inner lateral surfaces 49 and outer lateral surfaces 51. The outer lateral surfaces 51 are along and directly against the sacrificial material 104.

The processing stage of FIG. 38 is similar to that of FIG. 11, but differs from FIG. 11 in that the second capacitor storage node 50 extends at least partially along one of the outer lateral surfaces 43 of the first capacitor storage node 42. FIG. 38 illustrates that there is substantial physical contact between the first capacitor storage node 42 and the second capacitor storage node 50 regardless of the misalignment of the opening 110 relative to the first capacitor storage node that had occurred at the processing stage of FIG. 37. The physical contact between the first and second capacitor storage nodes translates into good of electrical connection between the first and second storage nodes (42 and 50). Accordingly, substantial electrical contact can be achieved between the first and second capacitor storage nodes (42 and 50) in spite of misalignment of the first capacitor storage node relative to the second capacitor storage node.

Figure 39:
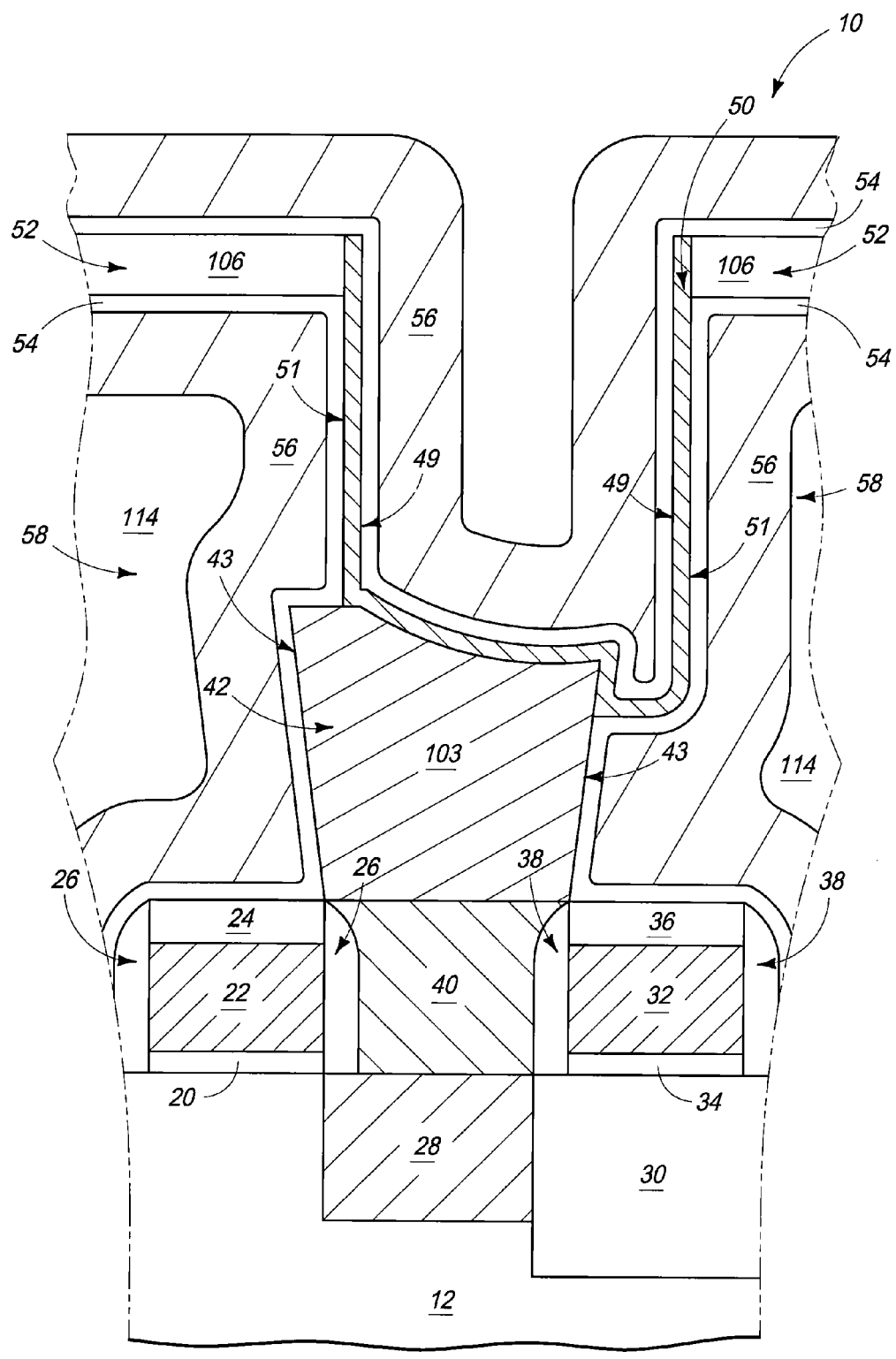

Referring to FIG. 39, sacrificial materials 100 and 104 (FIG. 38) are removed, and then the capacitor dielectric material 54 is formed. The capacitor dielectric material extends along the outer lateral surfaces 43 of the first capacitor storage node 42, and along the outer lateral surfaces 51 of the second capacitor storage node 50, as well as along the inner lateral surfaces 49 of the second capacitor storage node. After formation of the capacitor dielectric material, the capacitor electrode material 56 is formed along the capacitor dielectric material. Subsequently, the material 114 is formed within the gaps 58 left by the capacitor electrode material.

The capacitor electrode material 56, capacitor dielectric material 54, first capacitor storage node 42 and second capacitor storage node 50 together define a capacitor analogous to the capacitor 60 of FIG. 13.

FIG. 37 illustrated mask misalignment which exposed one of the outer lateral surfaces 43 of the first capacitor storage node 42 within the opening 110. FIG. 40 shows construction 10 at a processing stage and analogous to that of FIG. 37, but in which the opening 110 is wider than the first capacitor storage of 42 so that both of the shown outer lateral surfaces 43 of the capacitor storage node 42 are exposed within the opening. It is noted that FIG. 40 is a cross-sectional view of construction 10, and that even though there appear to be two opposing lateral surfaces 43 in such cross-sectional view, such lateral surfaces would be part of a continuous lateral surface extending around storage node 42 in three dimensions. For instance, storage node 42 may appear to be circular or elliptical when viewed from above. According, opening 110 may also be circular or elliptical when viewed from above, and may be wide enough to entirely surround the first capacitor storage node 42. The embodiment of FIG. 40 may result from mask misalignment, or may be purposeful in some applications.

In the shown embodiment of FIG. 40, opening 110 extends only partially along the outer lateral surfaces 43 of the first capacitor storage node 42. In other embodiments, the opening 110 may extend entirely along the outer lateral surfaces 43.

FIG. 40 shows construction 10 at a processing stage analogous to the processing stages of FIGS. 9 and 37, but differs from FIGS. 9 and 37 in that the etching to form opening 110 has not etched into storage node 42. Such difference is provided to show that there may be applications which storage node 42 is formed of a material which does not etch during the formation of opening 110.

Figure 41:
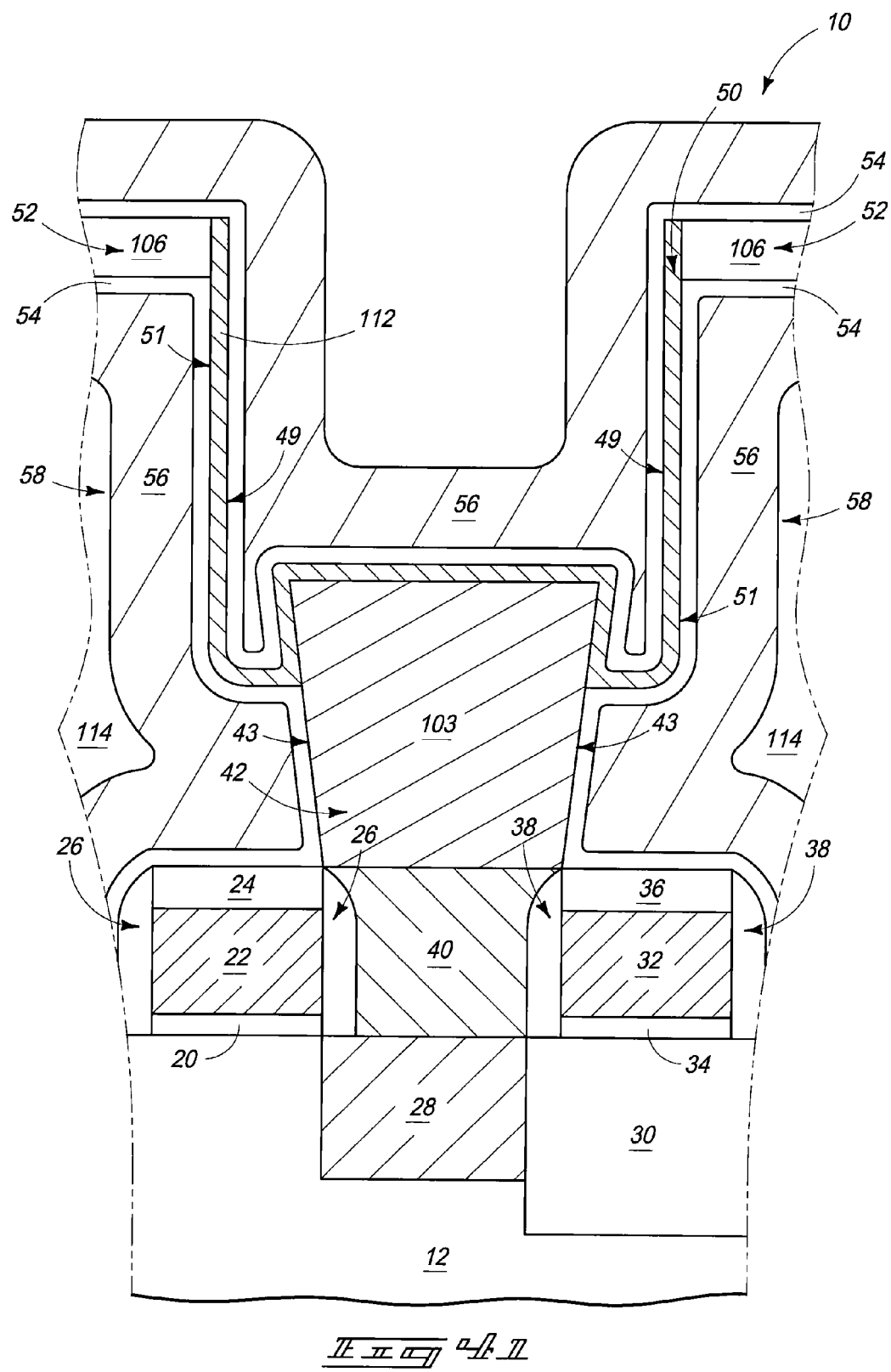

Referring to FIG. 41, masking material 108 (FIG. 40) is removed, and subsequently conductive material 112 is formed within opening 110, and is patterned into the second capacitor storage node 50. The patterning of conductive material 112 into the second capacitor storage node 50 may comprise the processing discussed above with reference to FIGS. 10 and 11. The capacitor storage node 50 has inner lateral surfaces 49 and outer lateral surfaces 51. The outer lateral surfaces 51 are along and directly against the sacrificial material 104.

After formation of the second capacitor storage node 50, sacrificial materials 100 and 104 (FIG. 40) are removed, and then the capacitor dielectric material 54 is formed. The capacitor dielectric material extends along the outer lateral surfaces 43 of the first capacitor storage node 42, and along the outer lateral surfaces 51 of the second capacitor storage node 50, as well as along the inner lateral surfaces 49 of the second capacitor storage node. After formation of the capacitor dielectric material, the capacitor electrode material 56 is formed along the capacitor dielectric material. Subsequently, the material 114 is formed within the gaps 58 left by the capacitor electrode material.

The capacitor electrode material 56, capacitor dielectric material 54, first capacitor storage node 42 and second capacitor storage node 50 together define a capacitor analogous to the capacitor 60 of FIG. 13.

FIGS. 37-41 illustrated embodiments in which mask misalignment occurred relative to a stud-type lower capacitor storage node during formation of the upper capacitor storage node; and showed that good electrical contact between the upper and lower capacitor storage nodes could be achieved regardless of the mask-misalignment. Mask misalignment may also occur relative to container-type lower capacitor storage nodes, and good electrical contact between the upper and lower capacitor storage nodes may still be achieved with the methodology described herein, as shown in FIGS. 42-44.

Figure 42:
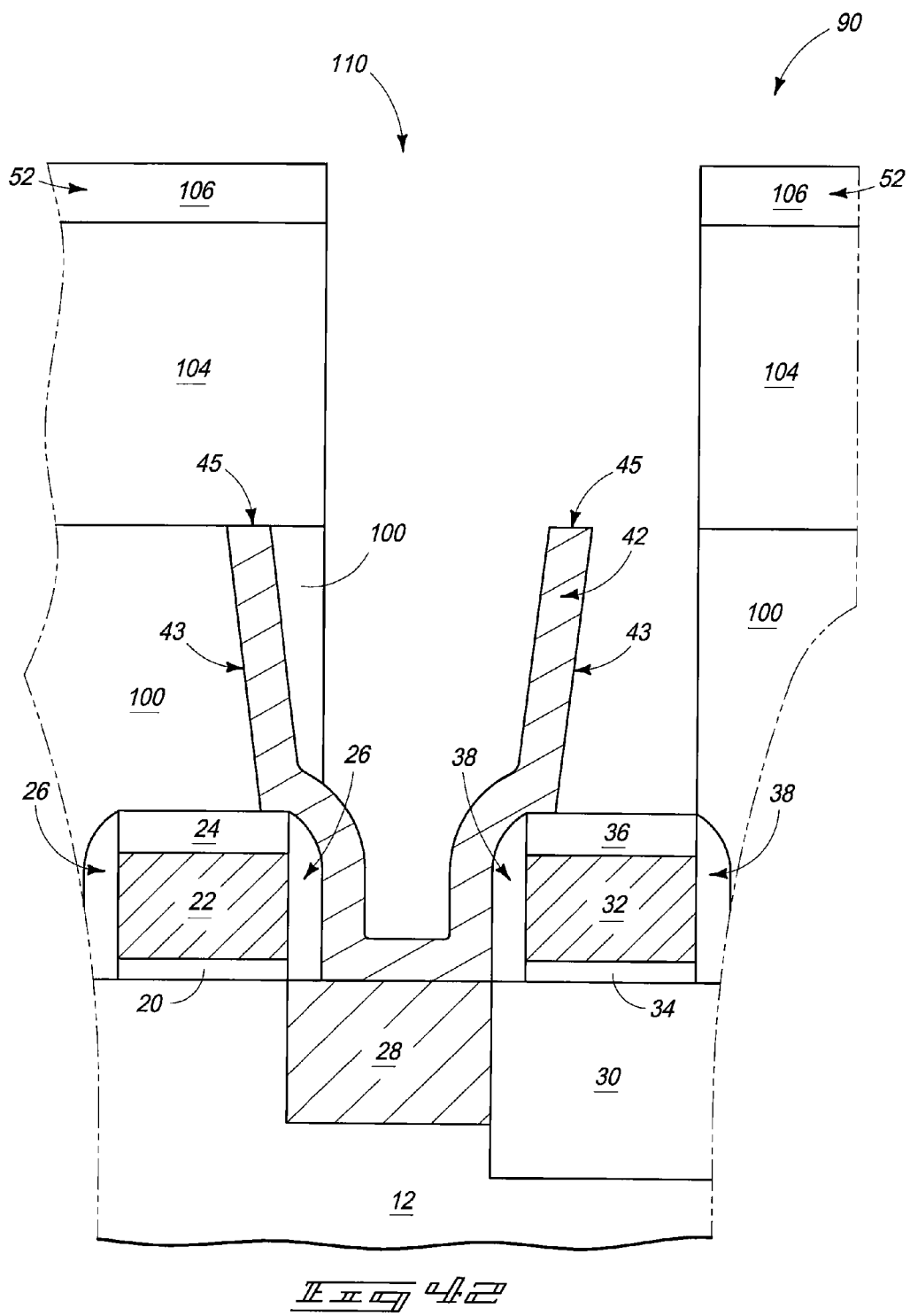
FIGS. 42-44 are diagrammatic, cross-sectional views of a portion of semiconductor construction shown at various process stages of another example embodiment method of forming a DRAM unit cell. The processing stage of FIG. 42 can follow that of FIG. 32.

Referring to FIG. 42, the construction 90 discussed above with reference to FIGS. 29-36 is shown at a processing stage subsequent to that of FIG. 32. The processing stage of FIG. 42 is analogous to that of FIG. 33, but differs from FIG. 33 in that the opening 110 is misaligned relative to the container-type first capacitor storage node 42. Thus, opening 110 is offset relative to the center of the container-type first capacitor storage node, and extends along one of the outer lateral surfaces 43 of the container-type first capacitor storage node. The opening may extend entirely along the outer lateral surface (as shown) or may extend only partially along the outer lateral surface in other embodiments.

Figure 43:
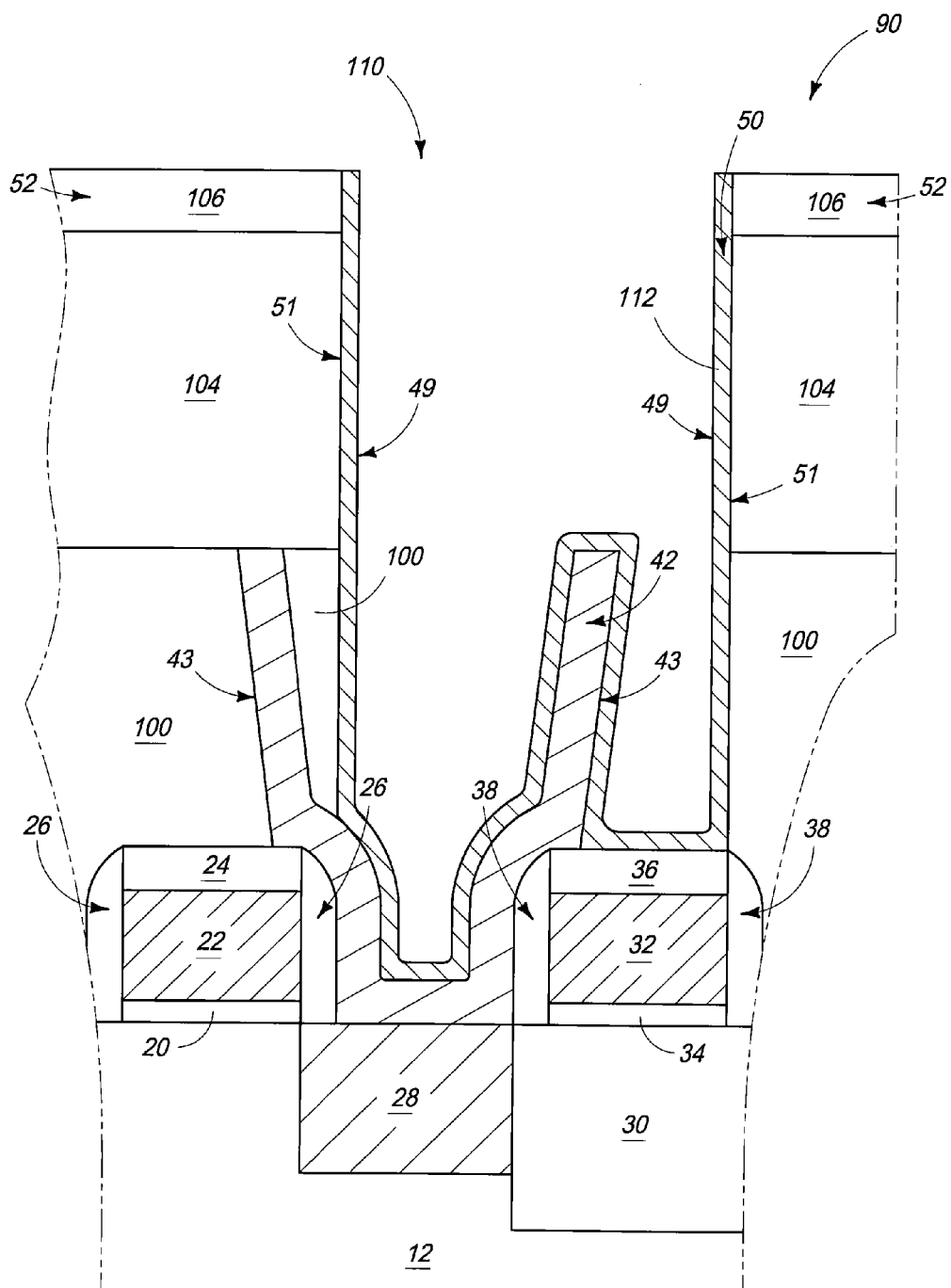
Figure 44:
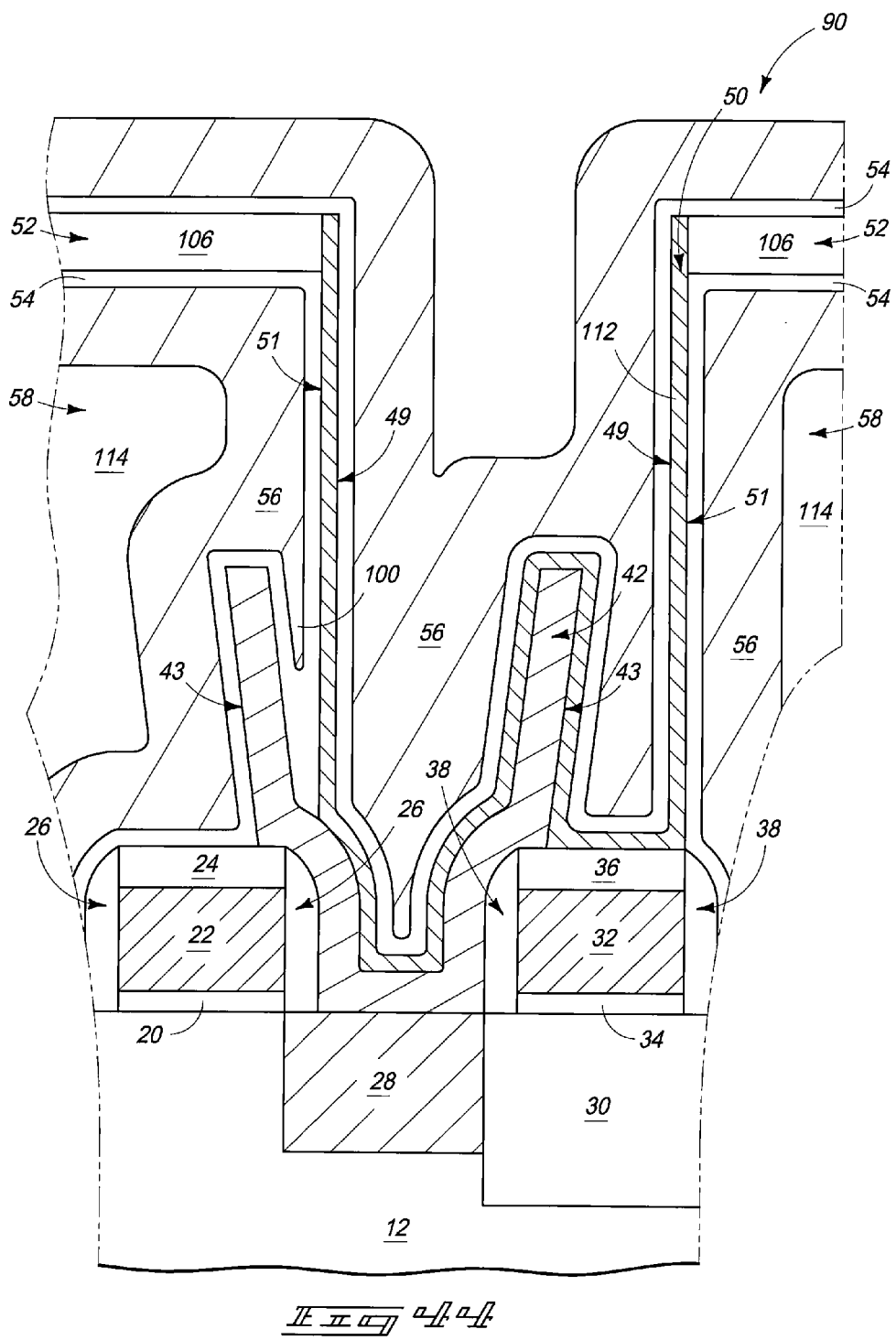

Referring to FIG. 43, conductive material 112 is formed within opening 110, and is patterned into the second capacitor storage node 50. The capacitor storage node 50 has inner lateral surfaces 49 and outer lateral surfaces 51. The outer lateral surfaces 51 are along and directly against the sacrificial materials 100 and 104.

The processing stage of FIG. 43 is similar to that of FIG. 34, but differs from FIG. 34 in that the second capacitor storage node 50 extends at least partially along one of the outer lateral surfaces 43 of the first capacitor storage node 42. FIG. 43 illustrates that there is substantial physical contact between the first capacitor storage node 42 and the second capacitor storage node 50 regardless of the misalignment of the opening 110 relative to the first capacitor storage node that had occurred at the processing stage of FIG. 42. The physical contact between the first and second capacitor storage nodes translates into good of electrical connection between the first and second storage nodes (42 and 50). Accordingly, substantial electrical contact can be achieved between the first and second capacitor storage nodes (42 and 50) in spite of misalignment of the first capacitor storage node relative to the second capacitor storage node.

Referring to FIG. 44, sacrificial materials 100 and 104 (FIG. 43) are removed, and then the capacitor dielectric material 54 is formed. The capacitor dielectric material extends along the outer lateral surfaces 43 of the first capacitor storage node 42, and along the outer lateral surfaces 51 of the second capacitor storage node 50, as well as along the inner lateral surfaces 49 of the second capacitor storage node. After formation of the capacitor dielectric material, the capacitor electrode material 56 is formed along the capacitor dielectric material. Subsequently, the material 114 is formed within the gaps 58 left by the capacitor electrode material.

The capacitor electrode material 56, capacitor dielectric material 54, first capacitor storage node 42 and second capacitor storage node 50 together define a capacitor analogous to the capacitor of FIG. 36. The capacitor of FIG. 44 may be considered to comprise a first container-shaped capacitor storage node 42. The first container-shaped capacitor storage node has a substantially "V" shape along the one cross-section of FIG. 44. The "V" shape has inner lateral surfaces and outer lateral surfaces. The capacitor of FIG. 44 also has a second container-shaped capacitor storage node 50 that is in direct physical contact with the first capacitor storage node. The second container-shaped capacitor storage node has inner lateral surfaces, and has outer lateral surfaces. The second capacitor storage node may comprise a composition different from a composition of the first capacitor storage node, so that the first and second capacitor storage nodes are of different materials relative to one another (as shown). The second container-shaped capacitor storage node is laterally offset relative to the first container-shaped capacitor storage node such that the second container-shaped capacitor storage node is directly against the outer lateral surface and inner lateral surface on one side of the "V" shape of the first container-shaped capacitor storage node, but is not directly against the outer lateral surface on an opposing side of the "V" shape of the first container-shaped capacitor storage node. The capacitor dielectric material 54 is along the inner and outer lateral surfaces of the second capacitor storage node, and is along an outer lateral surface of the first capacitor storage node. The capacitor electrode material 56 is along the capacitor dielectric material, and is isolated from the first and second capacitor storage nodes by the capacitor dielectric material.

Figure 46:
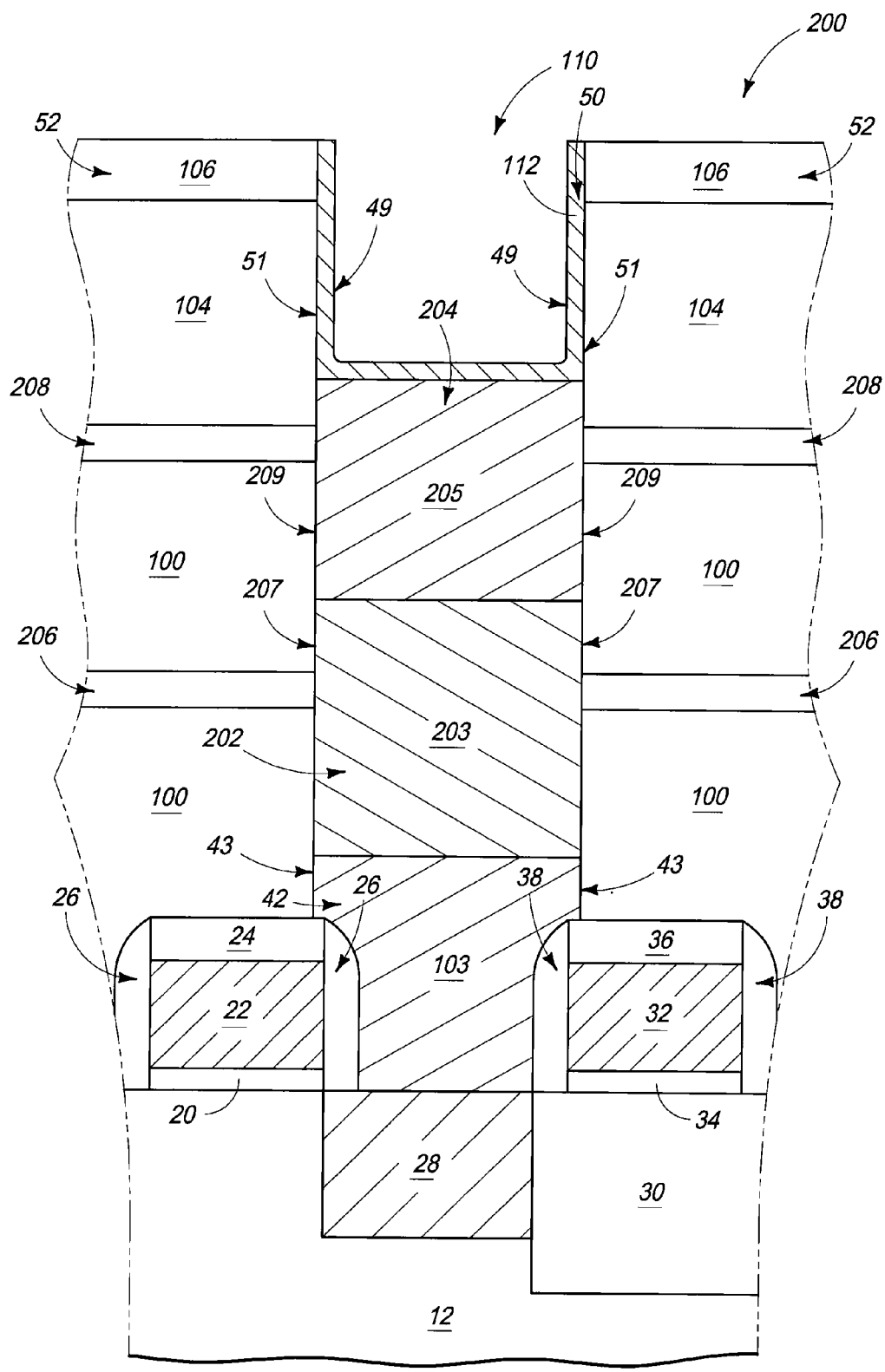
Figure 47:
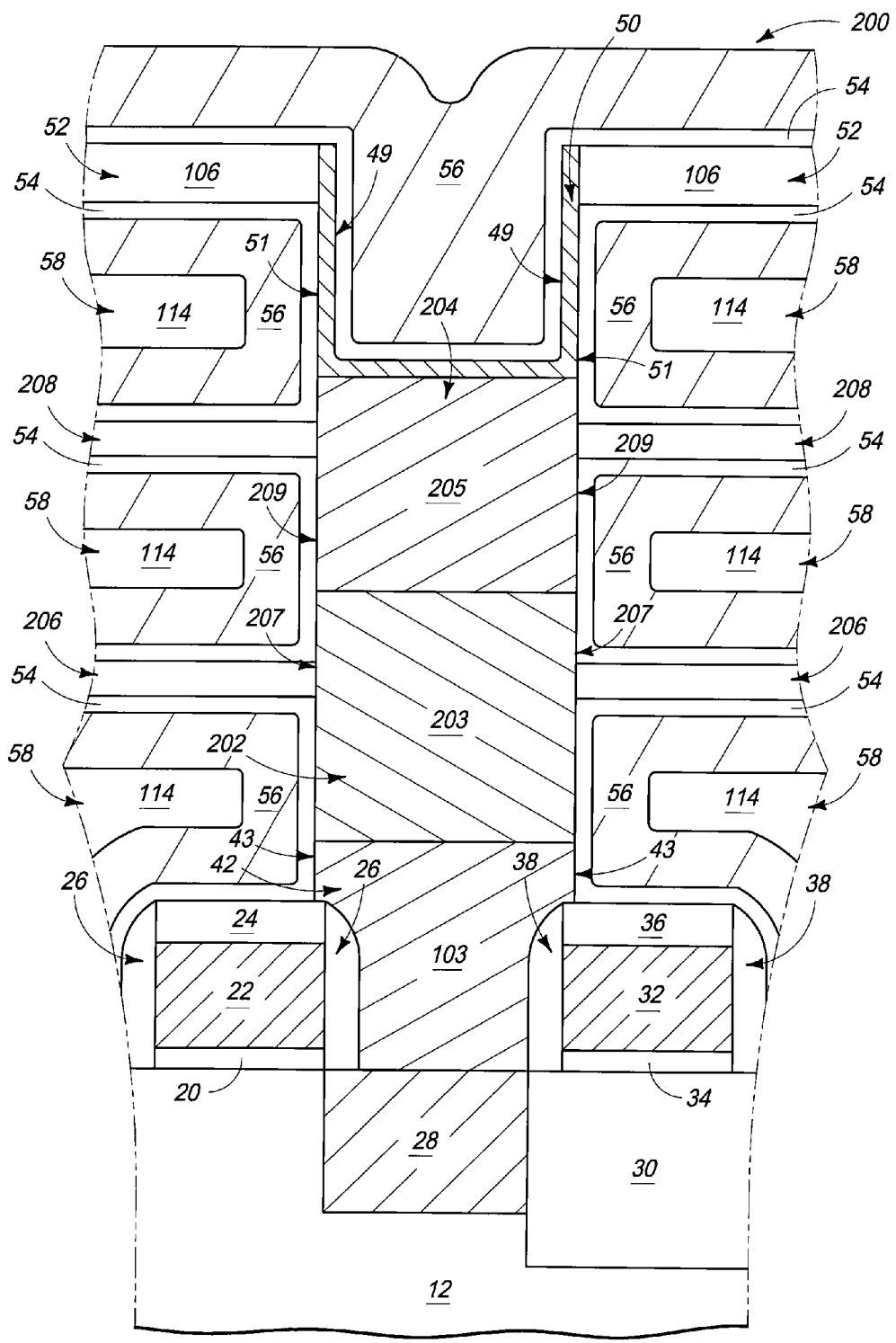

The embodiments of FIGS. 1-44 illustrate utilization of two capacitor storage nodes in capacitor constructions. In other embodiments, more than two capacitor storage nodes may be stacked in a single capacitor construction. FIGS. 45-47 illustrate an example embodiment in which four capacitor storage nodes are stacked to form a single capacitor construction. Similar numbering will be used to describe FIGS. 45-47 as was used above in describing FIGS. 1-44, where appropriate.

Referring to FIG. 45, a semiconductor construction 200 is illustrated at a processing stage analogous to the processing stage discussed above with reference to a construction 70 of FIG. 16. However, construction 200 differs from construction 70 in that two additional stud-type capacitor storage nodes 202 and 204 have been formed over the stud-type storage node 42. Storage nodes 202 and 204 comprise materials 203 and 205, respectively. Such materials may be any suitable electrically conductive materials, and may, for example, comprise one or more of various metals, metal-containing compounds, and conductively-doped semiconductor materials. Storage nodes 202 and 204 may comprise different materials relative to one another so that the stored nodes 202 and 204 are separate discrete structures as shown. Also, one or both of the storage nodes 202 and 204 may comprise separate materials relative to the storage node 42. In other embodiments, one or more of the storage node 42, 202 and 204 may comprise the same material.

A plurality of additional lattice structures 206 and 208 are provided to support the storage nodes 202 and 204. In other embodiments, such additional lattice structures may be omitted; and in yet other embodiments more than the shown number of additional lattice structures may be provided.

The same sacrificial material 100 is shown provided between lattice structures 206 and 208 as was initially provided for fabrication of the first capacitor storage node 42. In other embodiments, the sacrificial material provided between lattice structures 206 and 208 may be different from the sacrificial material utilized for fabrication of the first capacitor storage node.

Capacitor storage node 42 has outer lateral surfaces 43, as discussed above. Similarly, storage nodes 202 and 204 have outer lateral surfaces 207 and 209, respectively.

Although all of the capacitor storage nodes 42, 202 and 204 are illustrated as stud-type capacitor storage nodes, in other embodiments one or more of such capacitor storage nodes may be a container-type capacitor storage node.

Referring to FIG. 46, the opening 110 is formed to extend through lattice material 106 and sacrificial material 104; and the formation of opening 110 patterns lattice material 106 into lattice structure 52. The conductive material 112 is formed within opening 110, and is patterned into the upper capacitor storage node 50. The capacitor storage node 50 has inner lateral surfaces 49 and outer lateral surfaces 51.

Referring to FIG. 47, sacrificial materials 100 and 104 (FIG. 46) are removed. Such removal may comprise forming openings (not shown) through lattice materials 106, 206 and 208 to expose the sacrificial materials 100 and 104 to an isotropic etch. The removal of sacrificial materials 100 and 104 exposes the outer lateral surfaces 43 of the first capacitor storage node 42, exposes the outer lateral surfaces 207 and 209 of the storage nodes 202 and 204, and also exposes the outer lateral surfaces 51 of the upper capacitor storage node 50.

After removal of sacrificial materials 100 and 104, capacitor dielectric material 54 is formed along the outer lateral surfaces 43, 207 and 209 of the capacitor storage nodes 42, 202 and 204; and along the outer lateral surfaces 51 of the upper capacitor storage node 50. The dielectric material 54 is also formed along the inner lateral surfaces 49 of the upper capacitor storage node. Subsequently, capacitor electrode material 56 is formed along the capacitor dielectric material, and the material 114 is formed within the gaps 58 left by the capacitor electrode material.

The capacitor electrode material 56, capacitor dielectric material 54, capacitor storage node 42, capacitor storage node 202, capacitor storage node 204, and capacitor storage node 50 together define a capacitor.

The embodiments discussed above may be utilized in electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a capacitor, comprising:
   forming a first opening in a first sacrificial material;
   forming a first capacitor storage node within said first opening; the first capacitor storage node having outer lateral surfaces along the first sacrificial material;
   forming a second sacrificial material over the first capacitor storage node and over the first sacrificial material;
   forming a second opening through the second sacrificial material to expose a region of the first capacitor storage node;
   forming a second capacitor storage node within the second opening and directly against the first capacitor storage node; the second capacitor storage node having exposed inner lateral surfaces within the lined second opening, and having outer lateral surfaces along the second sacrificial material;
   removing the first and second sacrificial materials to expose the outer lateral surfaces of the first and second capacitor storage nodes;
   forming capacitor dielectric material along the exposed inner lateral surfaces of the second capacitor storage node, and along the exposed outer lateral surfaces of the first and second capacitor storage nodes; and
   forming capacitor electrode material along the capacitor dielectric material, and spaced from the first and second capacitor storage nodes by the capacitor dielectric material.

2. The method of claim 1 wherein the first and second capacitor storage nodes are compositionally the same as one another.

3. The method of claim 1 wherein the first and second capacitor storage nodes are compositionally different from one another.

4. The method of claim 1 wherein the first and second sacrificial materials are compositionally the same as one another.

5. A method of forming a capacitor, comprising:
   form a stud-type first capacitor storage node over a semiconductor substrate; the first capacitor storage node having outer lateral surfaces and comprising a first capacitor storage node material;
   forming a sacrificial material over the first capacitor storage node;
   forming an opening through the sacrificial material to expose a region of the first capacitor storage node;
   lining the opening with a second capacitor storage node material to form a second capacitor storage node that is in direct physical contact with the first capacitor storage node; the second capacitor storage node having exposed inner lateral surfaces within the lined opening, and having outer lateral surfaces along the sacrificial material;
   removing the sacrificial material and subsequently forming capacitor dielectric material along the inner lateral surfaces of the second capacitor storage node, and along the outer lateral surfaces of the first and second capacitor storage nodes; and
   forming capacitor electrode material along the capacitor dielectric material, and spaced from the first and second capacitor storage nodes by the capacitor dielectric material.

6. The method of claim 1 wherein the first and second capacitor storage nodes are a same composition as one another.

7. The method of claim 5 wherein the first and second capacitor storage nodes differ in composition relative to one another.

8. A method of forming a capacitor, comprising:
   form a container-type first capacitor storage node over a semiconductor substrate; the first capacitor storage node having outer lateral surfaces and comprising a first capacitor storage node material;
   forming a sacrificial material over the first capacitor storage node;
   forming an opening through the sacrificial material to expose a region of the first capacitor storage node;
   lining the opening with a second capacitor storage node material to form a second capacitor storage node that is directly against the first capacitor storage node;
   the second capacitor storage node having exposed inner lateral surfaces within the lined opening, and having outer lateral surfaces along the sacrificial material;
   removing the sacrificial material and subsequently forming capacitor dielectric material along the inner lateral surfaces of the second capacitor storage node, and along the outer lateral surfaces of the first and second capacitor storage nodes; and
   forming capacitor electrode material along the capacitor dielectric material, and spaced from the first and second capacitor storage nodes by the capacitor dielectric material.

9. The method of claim 8 wherein the first and second capacitor storage nodes are a same composition as one another.

10. The method of claim 8 wherein the first and second capacitor storage nodes differ in composition relative to one another.

11. A capacitor, comprising:
    a first container-shaped capacitor storage node; the first container-shaped capacitor storage node comprising a first composition; the first container-shaped capacitor storage node having inner lateral surfaces and outer lateral surfaces;

a second container-shaped capacitor storage node that is directly against the first container-shaped capacitor storage node; the second container-shaped capacitor storage node having inner lateral surfaces, and having outer lateral surfaces; the second container-shaped capacitor storage node comprising a second composition that is different from the first composition; the second container-shaped capacitor storage node being laterally offset relative to the first container-shaped capacitor storage node;

capacitor dielectric material along the inner and outer lateral surfaces of the second container-shaped capacitor storage node, and along an outer lateral surface of the first container-shaped capacitor storage node; and capacitor electrode material along the capacitor dielectric material, and spaced from the first and second capacitor storage nodes by the capacitor dielectric material.

12. A DRAM unit cell, comprising:

a transistor having a transistor gate and a source/drain region adjacent the transistor gate;

a first capacitor storage node that is adjacent the transistor gate, in electrical contact with the source/drain region, and has a segment extending above the transistor gate; the segment that extends above the transistor gate having an outer lateral surface; the first capacitor storage node comprising a first composition;

a second capacitor storage node that is in direct physical contact with the first capacitor storage node; the second capacitor storage node having inner lateral surfaces, and having outer lateral surfaces; the second capacitor storage node comprising a second composition that is different from the first composition;

capacitor dielectric material along the inner lateral surfaces of the second capacitor storage node, and along the outer lateral surfaces of the first and second capacitor storage nodes; and capacitor electrode material along the capacitor dielectric material, and spaced from the first and second capacitor storage nodes by the capacitor dielectric material.

13. The DRAM unit cell of claim 12 wherein the first capacitor storage node is a stud-type capacitor storage node.

14. The DRAM unit cell of claim 12 wherein the first capacitor storage node is a container-type capacitor storage node.

15. The DRAM unit cell of claim 12 wherein the second capacitor storage node is laterally offset relative to the first capacitor storage node.

* * * * *

UNITED STATES PATENT AND TRADEMARK OFFICE
CERTIFICATE OF CORRECTION

| | | |
|---|---|---|
| PATENT NO. | : 8,217,439 B2 | Page 1 of 1 |
| APPLICATION NO. | : 13/080489 | |
| DATED | : July 10, 2012 | |
| INVENTOR(S) | : John Kennedy | |

It is certified that error appears in the above-identified patent and that said Letters Patent is hereby corrected as shown below:

In column 16, line 29, in Claim 6, delete "claim 1" and insert -- claim 5 --, therefor.

Signed and Sealed this
Eleventh Day of September, 2012

David J. Kappos
*Director of the United States Patent and Trademark Office*